US012713656B2

(12) United States Patent
Hwang et al.

(10) Patent No.: US 12,713,656 B2
(45) Date of Patent: Aug. 18, 2026

(54) SEMICONDUCTOR DEVICE INCLUDING A PLURALITY OF NANOSHEETS AND THROUGH VIA LOCATED INSIDE A GATE CUT

(71) Applicant: SAMSUNG ELECTRONICS CO., LTD., Suwon-si (KR)

(72) Inventors: Dong Hoon Hwang, Suwon-si (KR); In Chan Hwang, Suwon-si (KR); Hyo Jin Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 362 days.

(21) Appl. No.: 18/376,549

(22) Filed: Oct. 4, 2023

(65) Prior Publication Data

US 2024/0120400 A1 Apr. 11, 2024

(30) Foreign Application Priority Data

Oct. 11, 2022 (KR) ........................ 10-2022-0129829
Feb. 17, 2023 (KR) ........................ 10-2023-0021500

(51) Int. Cl.

*H10D 30/67* (2025.01)
*H10D 30/01* (2025.01)
*H10D 30/43* (2025.01)
*H10D 64/23* (2025.01)

(52) U.S. Cl.

CPC ....... *H10D 30/6735* (2025.01); *H10D 30/014* (2025.01); *H10D 30/43* (2025.01); *H10D 30/6757* (2025.01); *H10D 64/258* (2025.01)

(58) Field of Classification Search

CPC ........... H10D 30/6735; H10D 30/6757; H10D 30/43; H10D 30/014; H10D 64/258; H10D 64/017; H10D 62/151

See application file for complete search history.

(56) References Cited

U.S. PATENT DOCUMENTS 10,388,519 B2 8/2019 Smith et al.
11,295,985 B2 4/2022 Zhang et al.
2022/0108981 A1 4/2022 Hwang et al.
2022/0109047 A1 4/2022 Jun et al.
2022/0157722 A1 5/2022 Bouche et al.
2022/0181258 A1 6/2022 Liebmann et al.
2022/0181318 A1 6/2022 Liebmann et al.
2023/0343821 A1* 10/2023 Xie ........................ H10D 30/62

* cited by examiner

*Primary Examiner* — Changhyun Yi
(74) *Attorney, Agent, or Firm* — Muir Patent Law, PLLC

(57) ABSTRACT

A semiconductor device includes first lower nanosheets; an upper isolation layer on the first lower nanosheets; first upper nanosheets on the upper isolation layer; a first upper source/drain region on the first upper nanosheets; a second upper source/drain region on the first upper nanosheets; a first gate electrode surrounding the first lower nanosheets, the upper isolation layer, and the first upper nanosheets; a first gate cut on a side of the first gate electrode and extending from a lower surface of the first gate electrode to an upper surface of the first gate electrode; a first through via inside the first gate cut and insulated from the first gate electrode; a first upper source/drain contact on and electrically connected to the first upper source/drain region; and a second upper source/drain contact on the first upper source/drain region and electrically connecting the second upper source/drain region with the first through via.

20 Claims, 61 Drawing Sheets

SEMICONDUCTOR DEVICE INCLUDING A PLURALITY OF NANOSHEETS AND THROUGH VIA LOCATED INSIDE A GATE CUT

CROSS-REFERENCE TO RELATED APPLICATIONS

This application claims priority from Korean Patent Application No. 10-2022-0129829 filed on Oct. 11, 2022, and Korean Patent Application No. 10-2023-0021500 filed on Feb. 17, 2023, in the Korean Intellectual Property Office and all the benefits accruing therefrom under 35 U.S.C. § 119, the contents of which in their entirety are herein incorporated by reference.

BACKGROUND

1. Field

Embodiments relate to a semiconductor device.

2. Description of the Related Art

As one of the scaling techniques for increasing a density of an integrated circuit device, a multi-gate transistor for forming a silicon body having a fin or nano-wire shape on a substrate and forming a gate on a surface of the silicon body has been suggested.

SUMMARY

The embodiments may be realized by providing a semiconductor device including a first plurality of lower nanosheets stacked to be spaced apart from each other in a vertical direction; an upper isolation layer on the first plurality of lower nanosheets; a first plurality of upper nanosheets on the upper isolation layer, the first plurality of upper nanosheets being stacked to be spaced apart from each other in the vertical direction; a first upper source/drain region on a first side of the first plurality of upper nanosheets in a first horizontal direction; a second upper source/drain region on a second side of the first plurality of upper nanosheets opposite to the first side of the first plurality of upper nanosheets in the first horizontal direction; a first gate electrode extending in a second horizontal direction different from the first horizontal direction, the first gate electrode surrounding each of the first plurality of lower nanosheets, the upper isolation layer, and the first plurality of upper nanosheets; a first gate cut extending in the first horizontal direction on a first side of the first gate electrode in the second horizontal direction, the first gate cut extending from a lower surface of the first gate electrode to an upper surface of the first gate electrode in the vertical direction; a first through via extending in the first horizontal direction inside the first gate cut, the first through via being insulated from the first gate electrode; a first upper source/drain contact extending in the second horizontal direction on the first upper source/drain region, the first upper source/drain contact being electrically connected to the first upper source/drain region; and a second upper source/drain contact extending in the second horizontal direction on the first upper source/drain region, the second upper source/drain contact electrically connecting the second upper source/drain region with the first through via.

The embodiments may be realized by providing a semiconductor device including a plurality of lower nanosheets stacked to be spaced apart from each other in a vertical direction; an upper isolation layer on the plurality of lower nanosheets; a plurality of upper nanosheets on the upper isolation layer, the plurality of upper nanosheets being stacked to be spaced apart from each other in the vertical direction; a first gate cut extending in a first horizontal direction; a second gate cut extending in the first horizontal direction, the second gate cut being spaced apart from the first gate cut in a second horizontal direction different from the first horizontal direction; a first gate electrode extending in the second horizontal direction between the first gate cut and the second gate cut, the first gate electrode surrounding each of the plurality of lower nanosheets, the upper isolation layer, and the plurality of upper nanosheets; a second gate electrode extending in the second horizontal direction, the second gate electrode being separated from the first gate electrode by the first gate cut; a third gate electrode extending in the second horizontal direction, the third gate electrode being separated from the first gate electrode by the second gate cut; a first lower source/drain region on a first side of the plurality of lower nanosheets in the first horizontal direction; a first upper source/drain region on the first lower source/drain region on a first side of the plurality of upper nanosheets in the first horizontal direction; a first through via extending in the first horizontal direction inside the first gate cut, the first through via being insulated from each of the first and second gate electrodes; a second through via extending in the first horizontal direction inside the second gate cut, the second through via being insulated from each of the first and third gate electrodes; a first upper source/drain contact extending in the second horizontal direction on the first upper source/drain region, the first upper source/drain contact electrically connecting the first upper source/drain region with the second through via; and a first lower source/drain contact below the first lower source/drain region, the first lower source/drain contact being electrically connected with the first lower source/drain region.

The embodiments may be realized by providing a semiconductor device including a plurality of lower nanosheets stacked to be spaced apart from each other in a vertical direction; an upper isolation layer on the plurality of lower nanosheets; a plurality of upper nanosheets on the upper isolation layer, the plurality of upper nanosheets being stacked to be spaced apart from each other in the vertical direction; a first lower source/drain region on a first side of the plurality of lower nanosheets in a first horizontal direction; a second lower source/drain region on a second side of the plurality of lower nanosheets opposite to the first side of the plurality of lower nanosheets in the first horizontal direction; a first upper source/drain region on a first side of the plurality of upper nanosheets in the first horizontal direction; a second upper source/drain region on a second side of the plurality of upper nanosheets opposite to the first side of the plurality of upper nanosheets in the first horizontal direction; a gate electrode extending in a second horizontal direction different from the first horizontal direction, the gate electrode surrounding each of the plurality of lower nanosheets, the upper isolation layer, and the plurality of upper nanosheets; a first gate cut extending in the first horizontal direction from a first side of the gate electrode in the second horizontal direction, the first gate cut extending from a lower surface of the gate electrode to an upper surface of the gate electrode in the vertical direction; a second gate cut extending in the first horizontal direction from a second side of the gate electrode opposite to the first side of the gate electrode in the second horizontal direction, the second gate cut extending from the lower surface of the gate electrode to the upper surface of the gate electrode in the vertical direction; a first through via extending in the first horizontal direction inside the first gate cut, the first through via is insulated from the gate electrode; a second through via extending in the first horizontal direction inside the second gate cut, the second through via being insulated from the gate electrode; a first lower source/drain contact below the first lower source/drain region, the first lower source/drain contact being electrically connected to the first lower source/drain region; a second lower source/drain contact extending in the second horizontal direction below the second lower source/drain region, the second lower source/drain contact electrically connecting the second lower source/drain region with the first through via; a first upper source/drain contact extending in the second horizontal direction on the first upper source/drain region, the first upper source/drain contact electrically connecting the first upper source/drain region with the second through via; and a second upper source/drain contact extending in the second horizontal direction on the second upper source/drain region, the second upper source/drain contact electrically connecting the second upper source/drain region with the first through via.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
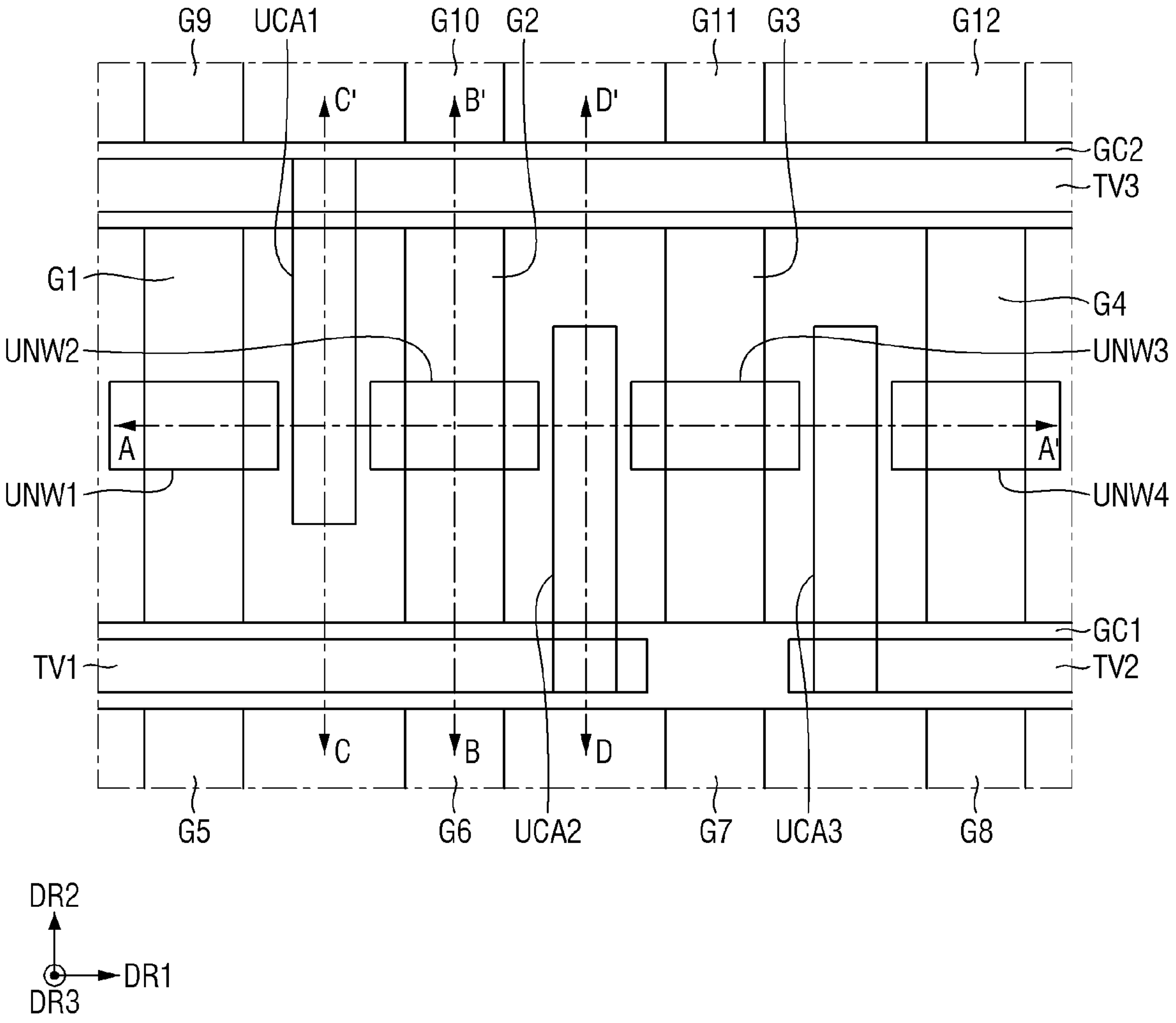
FIG. 1 is a layout view illustrating a semiconductor device according to some embodiments of the present disclosure.

In an implementation, as illustrated in the drawings, a semiconductor device according to some embodiments may include a multi-bridge channel field effect transistor (MBCFET™) that includes nanosheets. In an implementation, the semiconductor device may include a fin-type transistor (FinFET), which includes a channel region of a fin-pattern shape, a tunneling transistor (tunneling FET) or a three-dimensional (3D) transistor. In an implementation, the semiconductor device according to some other embodiments may include a bipolar junction transistor or a laterally diffused metal oxide semiconductor (LDMOS) transistor.

Hereinafter, the semiconductor device according to some embodiments of the present disclosure will be described with reference to FIGS. 1 to 5.

Figure 2:
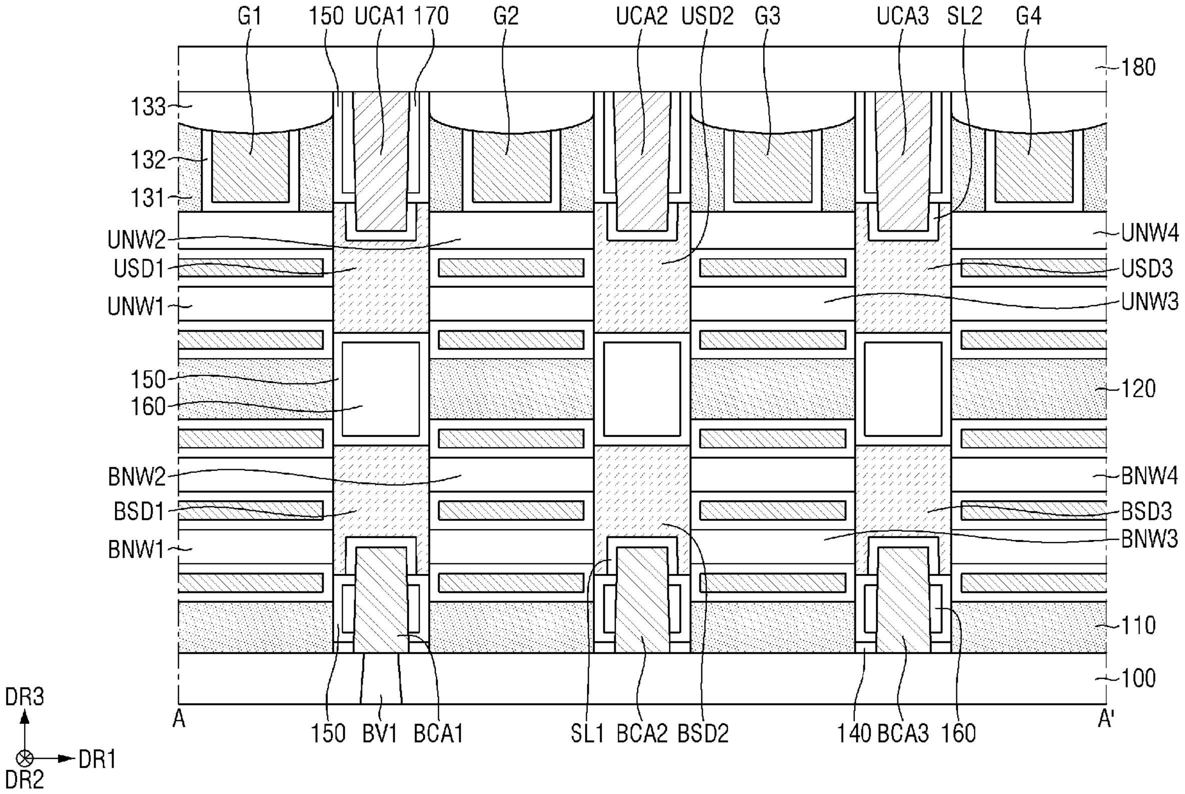
FIG. 2 is a cross-sectional view taken along line A-A' of FIG. 1.
Figure 3:
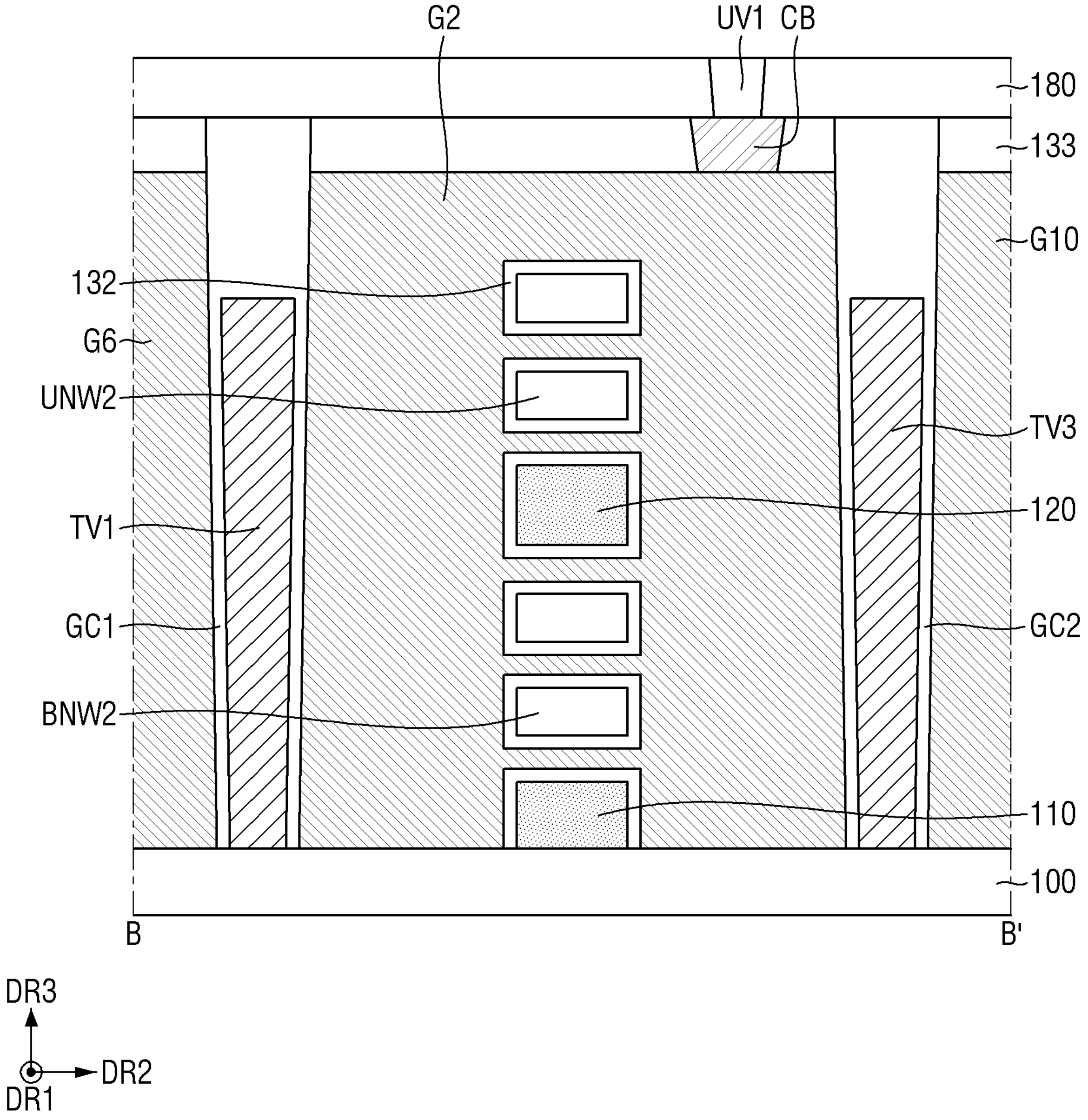
FIG. 3 is a cross-sectional view taken along line B-B' of FIG. 1.
Figure 4:
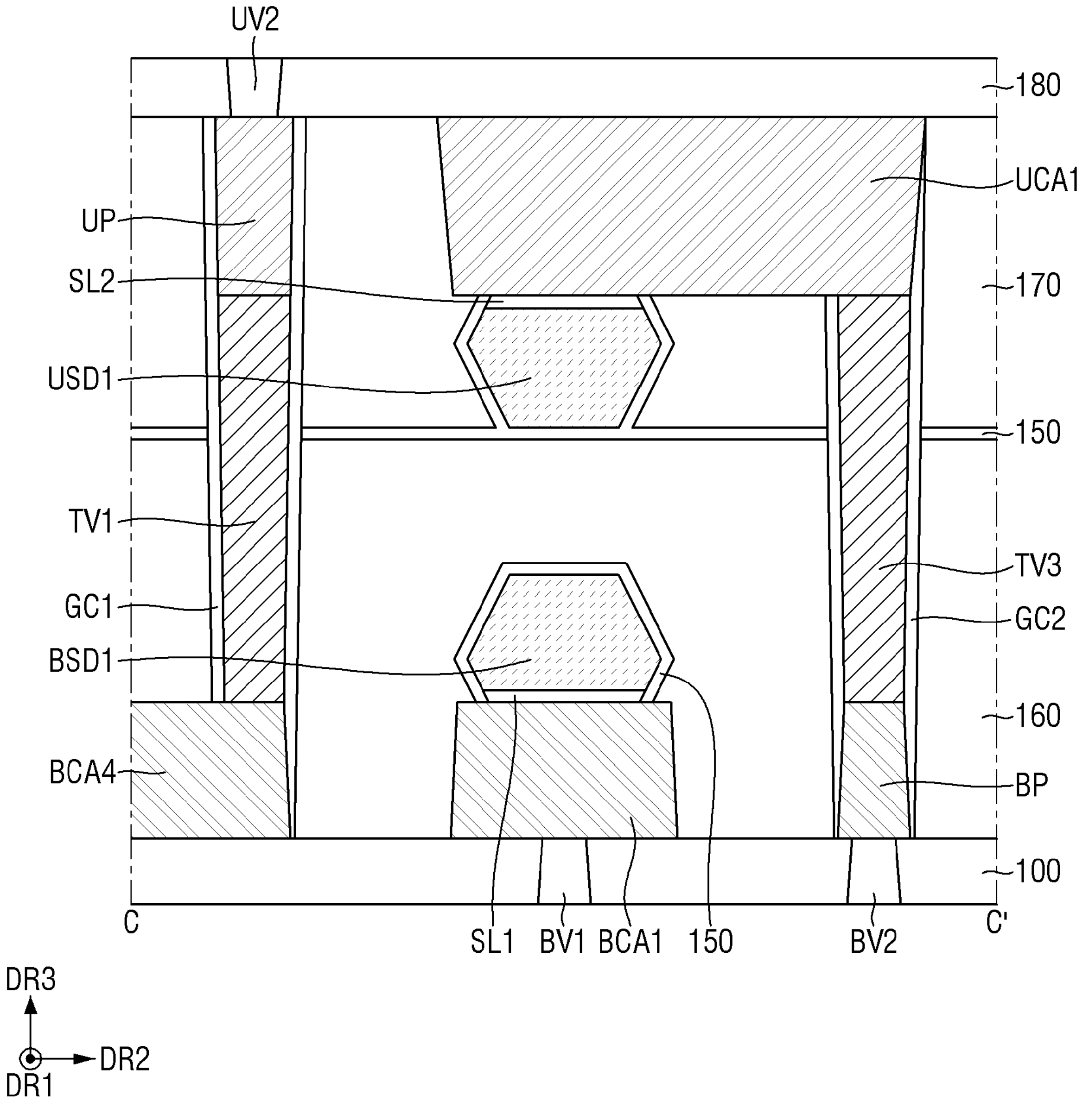
FIG. 4 is a cross-sectional view taken along line C-C' of FIG. 1.
Figure 5:
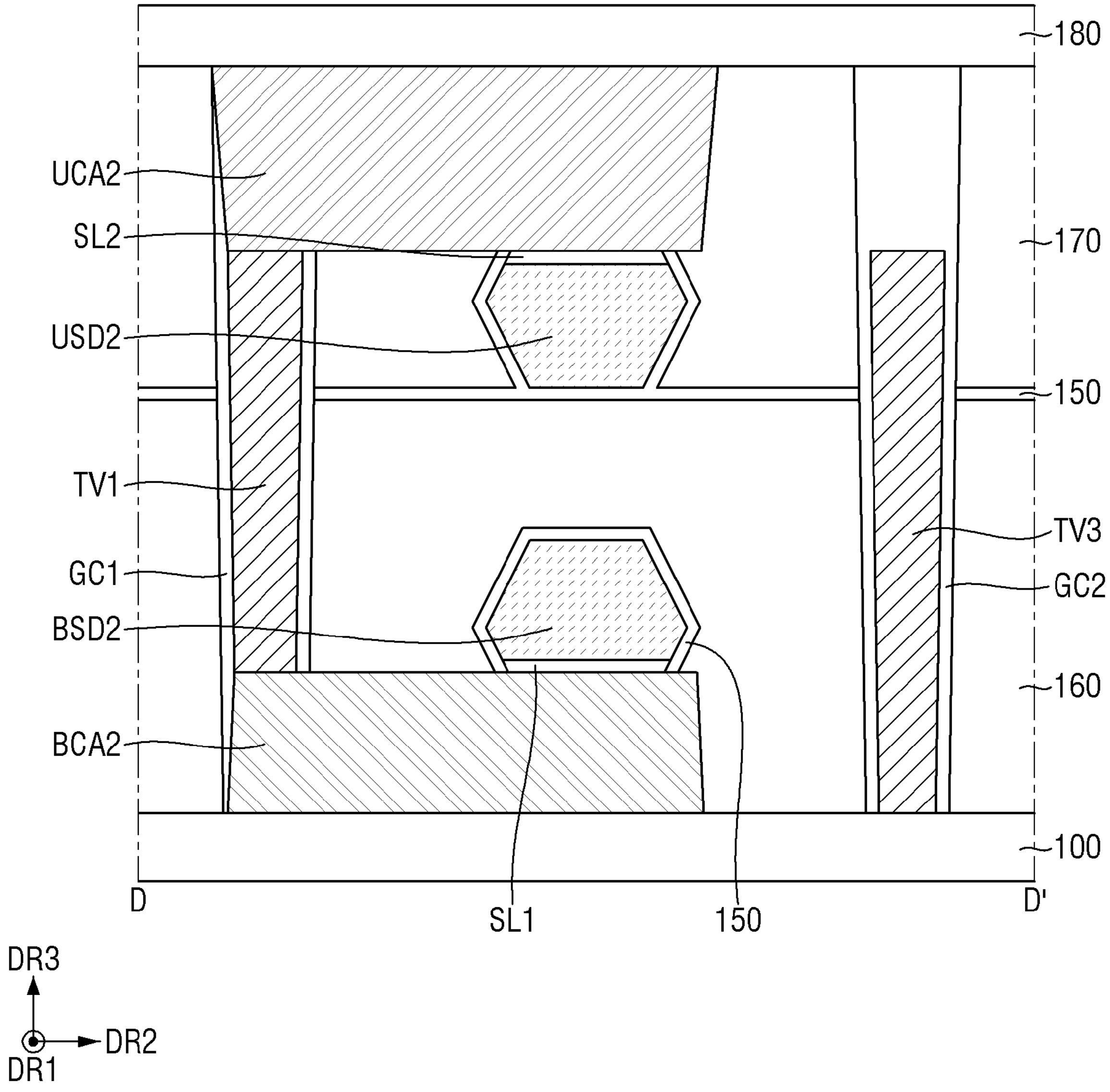
FIG. 5 is a cross-sectional view taken along line D-D' of FIG. 1.

FIG. 1 is a layout view illustrating a semiconductor device according to some embodiments of the present disclosure. FIG. 2 is a cross-sectional view taken along line A-A' of FIG. 1. FIG. 3 is a cross-sectional view taken along line B-B' of FIG. 1. FIG. 4 is a cross-sectional view taken along line C-C' of FIG. 1. FIG. 5 is a cross-sectional view taken along line D-D' of FIG. 1.

Referring to FIGS. 1 to 5, the semiconductor device according to some embodiments of the present disclosure may include a first lower interlayer insulating layer 100, a lower isolation layer 110, first to fourth pluralities of lower nanosheets BNW1, BNW2, BNW3 and BNW4, an upper isolation layer 120, first to fourth pluralities of upper nanosheets UNW1, UNW2, UNW3 and UNW4, first to twelfth gate electrodes G1 to G12, a gate spacer 131, a gate insulating layer 132, a capping pattern 133, first to third lower source/drain regions BSD1, BSD2 and BSD3, first to third upper source/drain regions USD1, USD2 and USD3, a second lower interlayer insulating layer 140, a liner layer 150, a third lower interlayer insulating layer 160, a first upper interlayer insulating layer 170, a second upper interlayer insulating layer 180, first to fourth lower source/drain contacts BCA1, BCA2, BCA3 and BCA4, first to third upper source/drain contacts UCA1, UCA2 and UCA3, a lower silicide layer SL1, an upper silicide layer SL2, a gate contact CB, first and second gate cuts GC1 and GC2, first to third through vias TV1, TV2 and TV3, a lower connection pad BP, an upper connection pad UP, first and second lower vias BV1 and BV2, and first and second upper vias UV1 and UV2. As used herein, the terms “first,” “second,” and the like are merely for identification and differentiation, and are not intended to imply or require sequential inclusion (e.g., a third element and a fourth element may be described without implying or requiring the presence of a first element or second element).

The first lower interlayer insulating layer 100 may include, e.g., silicon oxide, silicon nitride, silicon oxynitride, or a low dielectric constant material. In an implementation, the low dielectric constant material may include, e.g., Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoxySiloxane (DADBS), TriMethylSilil Phosphate (TMSP), PolyTetraFluoroEthylene (PTFE), Tonen SilaZen (TOSZ), Fluoride Silicate Glass (FSG), polyimide nanofoams such as polypropylene oxide, Carbon Doped silicon Oxide (CDO), Organo Silicate Glass (OSG), SiLK, Amorphous Fluorinated Carbon, silica aerogels, silica xerogels, mesoporous silica, or their combination. As used herein, the term “or” is not an exclusive term, e.g., “A or B” would include A, B, or A and B.

Hereinafter, each of a first horizontal direction DR1 and a second horizontal direction DR2 may be defined as a direction parallel with an upper surface of the first lower interlayer insulating layer 100. The second horizontal direction DR2 may be defined as a direction different from the first horizontal direction DR1. A vertical direction DR3 may be defined as a direction perpendicular to each of the first horizontal direction DR1 and the second horizontal direction DR2. In an implementation, the vertical direction DR3 may be defined as a direction perpendicular to the upper surface of the first lower interlayer insulating layer 100.

Each of the first to fourth plurality of lower nanosheets BNW1, BNW2, BNW3 and BNW4 may be on the first lower interlayer insulating layer 100. Each of the first to fourth plurality of lower nanosheets BNW1, BNW2, BNW3 and BNW4 may be spaced apart from the first lower interlayer insulating layer 100 in the vertical direction DR3. The second plurality of lower nanosheets BNW2 may be spaced apart from the first plurality of lower nanosheets BNW1 in the first horizontal direction DR1. The third plurality of lower nanosheets BNW3 may be spaced apart from the second plurality of lower nanosheets BNW2 in the first horizontal direction DR1. The fourth plurality of lower nanosheets BNW4 may be spaced apart from the third plurality of lower nanosheets BNW3 in the first horizontal direction DR1.

Each of the first to fourth plurality of lower nanosheets BNW1, BNW2, BNW3 and BNW4 may include a plurality of nanosheets that are stacked to be spaced apart from each other in the vertical direction DR3. In an implementation, as illustrated in FIG. 2 and FIG. 3, each of the first to fourth plurality of lower nanosheets BNW1, BNW2, BNW3 and BNW4 may include two nanosheets stacked in the vertical direction DR3. In an implementation, each of the first to fourth plurality of lower nanosheets BNW1, BNW2, BNW3 and BNW4 may include three or more nanosheets stacked in the vertical direction DR3. In an implementation, each of the first to fourth plurality of lower nanosheets BNW1, BNW2, BNW3 and BNW4 may include silicon (Si). In an implementation, each of the first to fourth lower plurality of nanosheets BNW1, BNW2, BNW3 and BNW4 may include silicon germanium (SiGe).

The lower isolation layer 110 may be between the first lower interlayer insulating layer 100 and each of the first to fourth plurality of lower nanosheets BNW1, BNW2, BNW3 and BNW4. A lower surface of the lower isolation layer 110 may be in contact (e.g., direct contact) with the first lower interlayer insulating layer 100. In an implementation, an upper surface of the lower isolation layer 110 may be spaced apart from each of the first to fourth plurality of lower nanosheets BNW1, BNW2, BNW3 and BNW4 in the vertical direction DR3. In an implementation, the lower isolation layer 110 may be only on lower portions of each of the first to fourth plurality of lower nanosheets BNW1, BNW2, BNW and BNW4. In an implementation, sidewalls of the lower isolation layer 110 may be aligned with those of each of the first to fourth plurality of lower nanosheets BNW1, BNW2, BNW3 and BNW4 in the vertical direction DR3.

The upper isolation layer 120 may be on each of the first to fourth plurality of lower nanosheets BNW1, BNW2, BNW3 and BNW4. In an implementation, the lower surface of the upper isolation layer 120 may be spaced apart from each of the first to fourth plurality of lower nanosheets BNW1, BNW2, BNW3 and BNW4 in the vertical direction DR3. In an implementation, the upper isolation layer 120 may be only on an upper portion of each of the first to fourth plurality of lower nanosheets BNW1, BNW2, BNW3 and BNW4. In an implementation, sidewalls of the upper isolation layer 120 may be aligned with those of each of the first to fourth plurality of lower nanosheets BNW1, BNW2, BNW3 and BNW4 in the vertical direction DR3.

Each of the lower isolation layer 110 and the upper isolation layer 120 may include an insulating material. In an implementation, each of the lower isolation layer 110 and the upper isolation layer 120 may include, e.g., silicon nitride (SiN), silicon oxycarbonitride (SiOCN), silicon boron carbonitride (SiBCN), silicon carbonitride (SiCN), silicon oxynitride (SiON) or their combination.

Each of the first to fourth plurality of upper nanosheets UNW1, UNW2, UNW3 and UNW4 may be on the upper isolation layer 120. Each of the first to fourth plurality of upper nanosheets UNW1, UNW2, UNW3 and UNW4 may be spaced apart from the upper isolation layer 120 in the vertical direction DR3. In an implementation, each of the first to fourth plurality of upper nanosheets UNW1, UNW2, UNW3 and UNW4 may overlap each of the first to fourth plurality of lower nanosheets BNW1, BNW2, BNW3 and BNW4 in the vertical direction DR3. The second plurality of upper nanosheets UNW2 may be spaced apart from the first upper nanosheets UNW1 in the first horizontal direction DR1. The third plurality of upper nanosheets UNW3 may be spaced apart from the second plurality of upper nanosheets UNW2 in the first horizontal direction DR1. The fourth plurality of upper nanosheets UNW4 may be spaced apart from the third plurality of upper nanosheets UNW3 in the first horizontal direction DR1.

In an implementation, sidewalls of each of the first to fourth plurality of upper nanosheets UNW1, UNW2, UNW3 and UNW4 may be aligned with those of each of the first to fourth plurality of lower nanosheets BNW1, BNW2, BNW3 and BNW4 in the vertical direction. In an implementation, a width of each of the first to fourth plurality of upper nanosheets UNW1, UNW2, UNW3 and UNW4 in the first horizontal direction DR1 may be different from that of each of the first to fourth plurality of lower nanosheets BNW1, BNW2, BNW3 and BNW4 in the first horizontal direction DR1.

Each of the first to fourth plurality of upper nanosheets UNW1, UNW2, UNW3 and UNW4 may include a plurality of nanosheets that are stacked to be spaced apart from each other in the vertical direction DR3. In an implementation, as illustrated in FIG. 2 and FIG. 3, each of the first to fourth plurality of upper nanosheets UNW1, UNW2, UNW3 and UNW4 may include two nanosheets stacked in the vertical direction DR3. In an implementation, each of the first to fourth plurality of upper nanosheets UNW1, UNW2, UNW3 and UNW4 may include three or more nanosheets stacked in the vertical direction DR3. In an implementation, each of the first to fourth plurality of upper nanosheets UNW1, UNW2, UNW3 and UNW4 may include silicon (Si). In some other embodiments, each of the first to fourth plurality of upper nanosheets UNW1, UNW2, UNW3 and UNW4 may include silicon germanium (SiGe).

Each of the first to twelfth gate electrodes G1 to G12 may extend (e.g., lengthwise) in the second horizontal direction DR2 on the first lower interlayer insulating layer 100. The fifth to eighth gate electrodes G5, G6, G7 and G8 may be sequentially spaced apart from one another in the first horizontal direction DR1. The first gate electrode G1 may be spaced apart from the fifth gate electrode G5 in the second horizontal direction DR2. The first gate electrode G1 may surround each of the lower isolation layer 110, the first plurality of lower nanosheets BNW1, the upper isolation layer 120, and the first plurality of upper nanosheets UNW1. The second gate electrode G2 may be spaced apart from the sixth gate electrode G6 in the second horizontal direction DR2. The second gate electrode G2 may be spaced apart from the first gate electrode G1 in the first horizontal direction DR1. The second gate electrode G2 may surround each of the lower isolation layer 110, the second plurality of lower nanosheets BNW2, the upper isolation layer 120, and the second plurality of upper nanosheets UNW2.

The third gate electrode G3 may be spaced apart from the seventh gate electrode G7 in the second horizontal direction DR2. The third gate electrode G3 may be spaced apart from the second gate electrode G2 in the first horizontal direction DR1. The third gate electrode G3 may surround each of the lower isolation layer 110, the third plurality of lower nanosheets BNW3, the upper isolation layer 120 and the third plurality of upper nanosheets UNW3. The fourth gate electrode G4 may be spaced apart from the eighth gate electrode G8 in the second horizontal direction DR2. The fourth gate electrode G4 may be spaced apart from the third gate electrode G3 in the first horizontal direction DR1. The fourth gate electrode G4 may surround each of the lower isolation layer 110, the fourth plurality of lower nanosheets BNW4, the upper isolation layer 120 and the fourth plurality of upper nanosheets UNW4.

The ninth gate electrode G9 may be spaced apart from the first gate electrode G1 in the second horizontal direction DR2. The tenth gate electrode G10 may be spaced apart from the second gate electrode G2 in the second horizontal direction DR2. The tenth gate electrode G10 may be spaced apart from the ninth gate electrode G9 in the first horizontal direction DR1. The eleventh gate electrode G11 may be spaced apart from the third gate electrode G3 in the second horizontal direction DR2. The eleventh gate electrode G11 may be spaced apart from the tenth gate electrode G10 in the first horizontal direction DR1. The twelfth gate electrode G12 may be spaced apart from the fourth gate electrode G4 in the second horizontal direction DR2. The twelfth gate electrode G12 may be spaced apart from the eleventh gate electrode G11 in the first horizontal direction DR1.

In an implementation, each of the first to twelfth gate electrodes G1 to G12 may be in contact with the first lower interlayer insulating layer 100. Each of the first to twelfth gate electrodes G1 to G12 may include, e.g., titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlCN), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or their combination.

The gate spacer 131 may extend in the second horizontal direction DR2 on the uppermost nanosheet of the first plurality of upper nanosheets UNW1 and the first lower interlayer insulating layer 100. In an implementation, the gate spacer 131 may extend in the second horizontal direction DR2 along both sidewalls of each of the first to twelfth gate electrodes G1 to G12. In an implementation, the gate spacer 131 may include, e.g., silicon nitride (SiN), silicon oxynitride (SiON), silicon carbonitride (SiCN), silicon oxycarbonitride (SiOCN), silicon boron nitride (SiBN), silicon oxyboron nitride (SiOBN), silicon oxycarbide (SiOC) or their combination.

The first lower source/drain region BSD1 may be on or at a first side of the first plurality of lower nanosheets BNW1, e.g., adjacent in the first horizontal direction DR1. In an implementation, the first lower source/drain region BSD1 may be between the first plurality of lower nanosheets BNW1 and the second plurality of lower nanosheets BNW2. The first lower source/drain region BSD1 may be in contact with each of the first and second plurality of lower nanosheets BNW1 and BNW2. In an implementation, a lower surface of the first lower source/drain region BSD1 may be between the upper surface of the lower isolation layer 110 and a lower surface of the lowermost nanosheet of the second plurality of lower nanosheets BNW2. In an implementation, an upper surface of the first lower source/drain region BSD1 may be between an upper surface of the uppermost nanosheet of the second plurality of lower nanosheets BNW2 and the lower surface of the upper isolation layer 120.

The second lower source/drain region BSD2 may be at a second side of the second plurality of lower nanosheets BNW2 opposite to a first side of the second plurality of lower nanosheets BNW2 in the first horizontal direction DR1. In an implementation, the second lower source/drain region BSD2 may be between the second plurality of lower nanosheets BNW2 and the third plurality of lower nanosheets BNW3. The second lower source/drain region BSD2 may be in contact with each of the second and third plurality of lower nanosheets BNW2 and BNW3. In an implementation, a lower surface of the second lower source/drain region BSD2 may be between the upper surface of the lower isolation layer 110 and the lower surface of the lowermost nanosheet of the second plurality of lower nanosheets BNW2. In an implementation, an upper surface of the second lower source/drain region BSD2 may be between the upper surface of the uppermost nanosheet of the second plurality of lower nanosheets BNW2 and the lower surface of the upper isolation layer 120.

The third lower source/drain region BSD3 may be between the third plurality of lower nanosheets BNW3 and the fourth plurality of lower nanosheets BNW4. The third lower source/drain region BSD3 may be in contact with each of the third and fourth plurality of lower nanosheets BNW3 and BNW4. In an implementation, a lower surface of the third lower source/drain region BSD3 may be between the upper surface of the lower isolation layer 110 and a lower surface of the lowermost nanosheet of the third plurality of lower nanosheets BNW3. In an implementation, an upper surface of the third lower source/drain region BSD3 may be between an upper surface of the uppermost nanosheet of the third plurality of lower nanosheets BNW3 and the lower surface of the upper isolation layer 120.

The first upper source/drain region USD1 may be on the first lower source/drain region BSD1. The first upper source/drain region USD1 may be spaced apart from the first lower source/drain region BSD1 in the vertical direction DR3. The first upper source/drain region USD1 may be on a first side of the first plurality of upper nanosheets in the first horizontal direction DR1. In an implementation, the first upper source/drain region USD1 may be between the first plurality of upper nanosheets UNW1 and the second plurality of upper nanosheets UNW2. In an implementation, a lower surface of the first upper source/drain region USD1 may be between the upper surface of the upper isolation layer 120 and a lower surface of a lowermost nanosheet of the second plurality of upper nanosheets UNW2.

The second upper source/drain region USD2 may be on the second lower source/drain region BSD2. The second upper source/drain region USD2 may be spaced apart from the second lower source/drain region BSD2 in the vertical direction DR3. The second upper source/drain region USD2 may be on a second side of the second plurality of upper nanosheets UNW2 opposite to a first side of the second plurality of upper nanosheets UNW2 in the first horizontal direction DR1. In an implementation, the second upper source/drain region USD2 may be between the second plurality of upper nanosheets UNW2 and the third plurality of upper nanosheets UNW3. In an implementation, a lower surface of the second upper source/drain region USD2 may be between the upper surface of the upper isolation layer 120 and the lower surface of the lowermost nanosheet of the second plurality of upper nanosheets UNW2.

The third upper source/drain region USD3 may be on the third lower source/drain region BSD3. The third upper source/drain region USD3 may be spaced apart from the third lower source/drain region BSD3 in the vertical direction DR3. The third upper source/drain region USD3 may be between the third plurality of upper nanosheets UNW3 and the fourth plurality of upper nanosheets UNW4. In an implementation, a lower surface of the third upper source/drain region USD3 may be between the upper surface of the upper isolation layer 120 and a lower surface of a lowermost nanosheet of the third plurality of upper nanosheets UNW3.

In an implementation, the gate insulating layer 132 may be between each of the first to fourth gate electrodes G1, G2, G3 and G4 and the lower isolation layer 110. The gate insulating layer 132 may be between each of the first to fourth gate electrodes G1, G2, G3 and G4 and the upper isolation layer 120. The gate insulating layer 132 may be between each of the first to fourth gate electrodes G1, G2, G3 and G4 and the gate spacer 131.

In an implementation, the gate insulating layer 132 may be between the first gate electrode G1 and each of the first plurality of lower nanosheets BNW1 and the first plurality of upper nanosheets UNW1. The gate insulating layer 132 may be between the second gate electrode G2 and each of the second plurality of lower nanosheets BNW2 and the second plurality of upper nanosheets UNW2. The gate insulating layer 132 may be between the third gate electrode G3 and each of the third plurality of lower nanosheets BNW3 and the third plurality of upper nanosheets UNW3. The gate insulating layer 132 may be between the fourth gate electrode G4 and each of the fourth plurality of lower nanosheets BNW4 and the fourth plurality of upper nanosheets UNW4.

The gate insulating layer 132 may include, e.g., silicon oxide, silicon oxynitride, silicon nitride, or a high dielectric constant material having a dielectric constant greater than that of the silicon oxide. The high dielectric constant material may include, e.g., hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to some other embodiments may include a negative capacitance (NC) FET based on a negative capacitor. In an implementation, the gate insulating layer 132 may include a ferroelectric material layer having ferroelectric characteristics and a paraelectric material layer having paraelectric characteristics.

The ferroelectric material layer may have a negative capacitance, and the paraelectric material layer may have a positive capacitance. In an implementation, when two or more capacitors are connected in series, and the capacitance of each capacitor has a positive value, the total capacitance may be reduced more than the capacitance of each individual capacitor. In an implementation, when at least one of capacitances of two or more capacitors connected in series has a negative value, the total capacitance may have a positive value and may be greater than an absolute value of each individual capacitance.

When a ferroelectric material layer having a negative capacitance and a paraelectric material layer having a positive capacitance are connected in series, the total capacitance value of the ferroelectric material layer and the paraelectric material layer, which are connected in series, may be increased. Based on the total capacitance value that is increased, a transistor having a ferroelectric material layer may have a subthreshold swing (SS) less than 60 mV/decade at room temperature.

The ferroelectric material layer may have ferroelectric characteristics. The ferroelectric material layer may include, e.g., hafnium oxide, hafnium zirconium oxide, barium strontium titanium oxide, barium titanium oxide, or lead zirconium titanium oxide. In an implementation, the hafnium zirconium oxide may be a hafnium oxide material doped with zirconium (Zr). In an implementation, the hafnium zirconium oxide may be a compound of hafnium (Hf), zirconium (Zr) and oxygen (O).

The ferroelectric material layer may further include a doped dopant. In an implementation, the dopant may include, e.g., aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). A type of the dopant included in the ferroelectric material layer may be varied depending on the ferroelectric material of the ferroelectric material layer.

When the ferroelectric material layer includes hafnium oxide, the dopant included in the ferroelectric material layer may include gadolinium (Gd), silicon (Si), zirconium (Zr), aluminum (Al), or yttrium (Y).

When the dopant is aluminum (Al), the ferroelectric material layer may include aluminum in an amount of 3 at % to 8 at % (atomic %). In this case, a ratio of the dopant may be a ratio of aluminum to a sum of hafnium and aluminum.

When the dopant is silicon (Si), the ferroelectric material layer may include silicon in an amount of 2 at % to 10 at %. When the dopant is yttrium (Y), the ferroelectric material layer may include yttrium in an amount of 2 at % to 10 at %. When the dopant is gadolinium (Gd), the ferroelectric material layer may include gadolinium in an amount of 1 at % to 7 at %. When the dopant is zirconium (Zr), the ferroelectric material layer may include zirconium in an amount of 50 at % to 80 at %.

The paraelectric material layer may have paraelectric characteristics. The paraelectric material layer may include, e.g., silicon oxide or metal oxide having a high dielectric constant. The metal oxide included in the paraelectric material layer may include, e.g., hafnium oxide, zirconium oxide, or aluminum oxide.

The ferroelectric material layer and the paraelectric material layer may include the same material. The ferroelectric material layer has ferroelectric characteristics, and the paraelectric material layer may not have ferroelectric characteristics. In an implementation, when the ferroelectric material layer and the paraelectric material layer include hafnium oxide, a crystal structure of hafnium oxide included in the ferroelectric material layer is different from that of hafnium oxide included in the paraelectric material layer.

The ferroelectric material layer may have a thickness and may have ferroelectric characteristics. In an implementation, the thickness of the ferroelectric material layer may be, e.g., 0.5 nm to 10 nm. A threshold thickness indicating ferroelectric characteristics may be varied depending on each ferroelectric material, and the thickness of the ferroelectric material layer may be varied depending on the ferroelectric material.

In an implementation, the gate insulating layer 132 may include one ferroelectric material layer. In an implementation, the gate insulating layer 132 may include a plurality of ferroelectric material layers spaced apart from each other. The gate insulating layer 132 may have a stacked layer structure in which a plurality of ferroelectric material layers and a plurality of paraelectric material layers are alternately stacked.

The capping pattern 133 may extend in the second horizontal direction DR2 on an upper surface of each of the first to twelfth gate electrodes G1 to G12. In an implementation, the capping pattern 133 may extend in the second horizontal direction DR2 on an upper surface of the gate spacer 131, the uppermost surface of the gate insulating layer 132, and the upper surface of each of the first to twelfth gate electrodes G1 to G12. In an implementation, the capping pattern 133 may be between the gate spacers 131. The capping pattern 133 may include, e.g., silicon nitride (SiN), silicon oxynitride (SiON), silicon oxide ($SiO_2$), silicon carbonitride (SiCN), silicon oxycarbonitride (SiOCN), or their combination.

The second lower interlayer insulating layer 140 may be on the first lower interlayer insulating layer 100. In an implementation, the second lower interlayer insulating layer 140 may be in contact with the sidewalls of the lower isolation layer 110 in the first horizontal direction DR1. The third lower interlayer insulating layer 160 may be on the first lower interlayer insulating layer 100 and the second lower interlayer insulating layer 140. The third lower interlayer insulating layer 160 may cover each of the first to third lower source/drain regions BSD1, BSD2 and BSD3.

The first upper interlayer insulating layer 170 may be on the third lower interlayer insulating layer 160. The first upper interlayer insulating layer 170 may cover each of the first to third upper source/drain regions USD1, USD2 and USD3. The first upper interlayer insulating layer 170 may surround a sidewall of the gate spacer 131 and a sidewall of the capping pattern 133. In an implementation, an upper surface of the first upper interlayer insulating layer 170 may be on the same plane as an upper surface of the capping pattern 133. In an implementation, the first upper interlayer insulating layer 170 may cover the upper surface of the capping pattern 133.

Each of the second lower interlayer insulating layer 140, the third lower interlayer insulating layer 160, and the first upper interlayer insulating layer 170 may include, e.g., silicon oxide, silicon nitride, silicon oxynitride, or a low dielectric constant material. In an implementation, each of the second lower interlayer insulating layer 140, the third lower interlayer insulating layer 160 and the first upper interlayer insulating layer 170 may include the same material.

The liner layer 150 may be between the second lower interlayer insulating layer 140 and the third lower interlayer insulating layer 160. The liner layer 150 may be between the lower isolation layer 110 and the third lower interlayer insulating layer 160. The liner layer 150 may be between the upper isolation layer 120 and the third lower interlayer insulating layer 160. The liner layer 150 may be between the gate insulating layer 132 and the third lower interlayer insulating layer 160. The liner layer 150 may be between each of the first to third lower source/drain regions BSD1, BSD2 and BSD3 and the third lower interlayer insulating layer 160.

In an implementation, the liner layer 150 may be between the gate spacer 131 and the first upper interlayer insulating layer 170. The liner layer 150 may be between the capping pattern 133 and the first upper interlayer insulating layer 170. The liner layer 150 may be between each of the first to third upper source/drain regions USD1, USD2 and USD3 and the first upper interlayer insulating layer 170. The liner layer 150 may be between the third lower interlayer insulating layer 160 and the first upper interlayer insulating layer 170.

In an implementation, the liner layer 150 may be formed to be conformal. The liner layer 150 may include, e.g., aluminum oxide, aluminum nitride, hafnium oxide, zirconium oxide, silicon oxide, silicon nitride, silicon oxynitride, or a low dielectric constant material.

The first gate cut GC1 may extend in the first horizontal direction DR1 between each of the first to fourth gate electrodes G1, G2, G3 and G4 and each of the fifth to eighth gate electrodes G5, G6, G7 and G8. In an implementation, the first gate cut GC1 may be on a first side of each of the first to fourth gate electrodes G1, G2, G3 and G4 in the second horizontal direction DR2. The first gate cut GC1 may separate each of the first to fourth gate electrodes G1, G2, G3 and G4 from each of the fifth to eighth gate electrodes G5, G6, G7 and G8.

The second gate cut GC2 may be spaced apart from the first gate cut GC1 in the second horizontal direction DR2. The second gate cut GC2 may extend in the first horizontal direction DR1 between each of the first to fourth gate electrodes G1, G2, G3 and G4 and each of the ninth to twelfth gate electrodes G9, G10, G11 and G12. In an implementation, the second gate cut GC2 may be on a second side of each of the first to fourth gate electrodes G1, G2, G3 and G4 in the second horizontal direction DR2, wherein the second side of each of the first to fourth gate electrodes G1, G2, G3 and G4 opposite to the first side of each of the first to fourth gate electrodes G1, G2, G3 and G4 in the second horizontal direction DR2. The second gate cut GC2 may separate each of the first to fourth gate electrodes G1, G2, G3 and G4 from each of the ninth to twelfth gate electrodes G9, G10, G11 and G12.

In an implementation, each of the first gate cut GC1 and the second gate cut GC2 may extend in the vertical direction DR3 from a lower surface of each of the first to fourth gate electrodes G1, G2, G3 and G4 to an upper surface of each of the first to fourth gate electrodes G1, G2, G3 and G4. In an implementation, a lower surface of each of the first gate cut GC1 and the second gate cut GC2 may be on the same plane as the lower surface of each of the first to fourth gate electrodes G1, G2, G3 and G4.

In an implementation, each of the first gate cut GC1 and the second gate cut GC2 may extend in the vertical direction DR3 from the upper surface of the first lower interlayer insulating layer 100 to the upper surface of the first upper interlayer insulating layer 170 and the upper surface of the capping pattern 133. In an implementation, an upper surface of each of the first gate cut GC1 and the second gate cut GC2 may be on the same plane as each of the upper surface of the first upper interlayer insulating layer 170 and the upper surface of the capping pattern 133. In an implementation, the first gate cut GC1 may be in contact with a sidewall of each of the first to eighth gate electrodes G1 to G8. In an implementation, the second gate cut GC2 may be in contact with a sidewall of each of the first to fourth gate electrodes G1, G2, G3 and G4 and the ninth to twelfth gate electrodes G9, G10, G11 and G12.

In an implementation, each of the first gate cut GC1 and the second gate cut GC2 may include, e.g., silicon oxide ($SiO_2$). In an implementation, each of the first gate cut GC1 and the second gate cut GC2 may include, e.g., silicon nitride (SiN), silicon oxynitride (SiON), silicon carbonitride (SiCN), silicon oxycarbonitride (SiOCN), silicon boron nitride (SiBN), silicon oxyboron nitride (SiOBN), silicon oxycarbide (SiOC) or their combination.

The first through via TV1 may extend in the first horizontal direction DR1 inside the first gate cut GC1. In an implementation, the first through via TV1 may overlap each of the first gate electrode G1 and the second gate electrode G2 in the second horizontal direction DR2. In an implementation, the first through via TV1 may not overlap each of the third gate electrode G3 and the fourth gate electrode G4 in the second horizontal direction DR2. In an implementation, the first through via TV1 may be electrically insulated from each of the first gate electrode G1, the second gate electrode G2, the fifth gate electrode G5 and the sixth gate electrode G6. In an implementation, the first gate cut GC1 may be between the first through via TV1 and each of the first gate electrode G1, the second gate electrode G2, the fifth gate electrode G5, and the sixth gate electrode G6.

In an implementation, the lowermost surface of the first through via TV1 may be in contact with the first lower interlayer insulating layer 100. In an implementation, the lowermost surface of the first through via TV1 may be on the same plane as a lower surface of the first gate cut GC1. In an implementation, the lowermost surface of the first through via TV1 may be on the same plane as a lower surface of each of the first gate electrode G1, the second gate electrode G2, the fifth gate electrode G5, and the sixth gate electrode G6. In an implementation, an upper surface of the first through via TV1 may be lower than an upper surface of each of the first gate electrode G1, the second gate electrode G2, the fifth gate electrode G5, and the sixth gate electrode G6 (e.g., the upper surface of the first through via TV1 may be closer to the first lower interlayer insulating layer 100 in the vertical third direction DR3 than an upper surface of each of the first gate electrode G1, the second gate electrode G2, the fifth gate electrode G5, and the sixth gate electrode G6 is to the first lower interlayer insulating layer 100 in the vertical third direction DR3). In an implementation, the first gate cut GC1 may cover the upper surface of the first through via TV1. In an implementation, the first through via TV1 may include a conductive material.

The second through via TV2 may extend in the first horizontal direction DR1 inside the first gate cut GC1. The second through via TV2 may be spaced apart from the first through via TV1 in the first horizontal direction DR1. The first gate cut GC1 may be between the first through via TV1 and the second through via TV2. In an implementation, the second through via TV2 may overlap the fourth gate electrode G4 in the second horizontal direction DR2. In an implementation, the second through via TV2 may not overlap each of the first to third gate electrodes G1, G2 and G3 in the second horizontal direction DR2. In an implementation, the second through via TV2 may be electrically insulated from each of the fourth gate electrode G4 and the eighth gate electrode G8. In an implementation, the first gate cut GC1 may be between the second through via TV2 and each of the fourth gate electrode G4 and the eighth gate electrode G8.

In an implementation, the lowermost surface of the second through via TV2 may be in contact with the first lower interlayer insulating layer 100. In an implementation, the lowermost surface of the second through via TV2 may be on the same plane as the lower surface of the first gate cut GC1. In an implementation, the lowermost surface of the second through via TV2 may be on the same plane as the lower surface of each of the fourth gate electrode G4 and the eighth gate electrode G8. In an implementation, an upper surface of the second through via TV2 may be lower than an upper surface of each of the fourth gate electrode G4 and the eighth gate electrode G8. In an implementation, the first gate cut GC1 may cover the upper surface of the second through via TV2. In an implementation, the second through via TV2 may include a conductive material.

The third through via TV3 may extend in the first horizontal direction DR1 inside the second gate cut GC2. In an implementation, the third through via TV3 may overlap each of the first to fourth gate electrodes G1, G2, G3 and G4 in the second horizontal direction DR2. In an implementation, the third through via TV3 may be electrically insulated from each of the first to fourth gate electrodes G1, G2, G3 and G4. In an implementation, the second gate cut GC2 may be disposed between each of the first to fourth gate electrodes G1, G2, G3 and G4 and the third through via TV3.

In an implementation, the lowermost surface of the third through via TV3 may be in contact with the first lower interlayer insulating layer 100. In an implementation, the lowermost surface of the third through via TV3 may be on the same plane as a lower surface of the second gate cut GC2. In an implementation, the lowermost surface of the third through via TV3 may be on the same plane as the lower surface of each of the first to fourth gate electrodes G1, G2, G3 and G4. In an implementation, an upper surface of the third through via TV3 may be lower than the upper surface of each of the first to fourth gate electrodes G1, G2, G3 and G4. In an implementation, the second gate cut GC2 may cover the upper surface of the third through via TV3. In an implementation, the third through via TV3 may include a conductive material.

The first lower source/drain contact BCA1 may be between the first gate electrode G1 and the second gate electrode G2. The first lower source/drain contact BCA1 may be connected to a lower portion of the first lower source/drain region BSD1 by passing through the second lower interlayer insulating layer 140, the third lower interlayer insulating layer 160, and the liner layer 150 in the vertical direction DR3. In an implementation, a lower surface of the first lower source/drain contact BCA1 may be in contact with the first lower interlayer insulating layer 100.

The second lower source/drain contact BCA2 may be between the second gate electrode G2 and the third gate electrode G3. The second lower source/drain contact BCA2 may extend in the second horizontal direction DR2. The second lower source/drain contact BCA2 may be connected to a lower portion of the second lower source/drain region BSD2 by passing through the second lower interlayer insulating layer 140, the third lower interlayer insulating layer 160, and the liner layer 150 in the vertical direction DR3. In an implementation, the second lower source/drain contact BCA2 may be connected to a lower portion of the first through via TV1. In an implementation, the second lower source/drain contact BCA2 may electrically connect the second lower source/drain region BSD2 to the first through via TV1. In an implementation, a lower surface of the second lower source/drain contact BCA2 may be in contact with the first lower interlayer insulating layer 100.

The third lower source/drain contact BCA3 may be between the third gate electrode G3 and the fourth gate electrode G4. The third lower source/drain contact BCA3 may be connected to a lower portion of the third lower source/drain region BSD3 by passing through the second lower interlayer insulating layer 140, the third lower interlayer insulating layer 160, and the liner layer 150 in the vertical direction DR3. In an implementation, a lower surface of the third lower source/drain contact BCA3 may be in contact with the first lower interlayer insulating layer 100.

The fourth lower source/drain contact BCA4 may be between the fifth gate electrode G5 and the sixth gate electrode G6. The fourth lower source/drain contact BCA4 may extend in the second horizontal direction DR2. The fourth lower source/drain contact BCA4 may be connected to the lower portion of the first through via TV1. In an implementation, a lower surface of the fourth lower source/drain contact BCA4 may be in contact with the first lower interlayer insulating layer 100.

Each of the first to fourth lower source/drain contacts BCA1, BCA2, BCA3 and BCA4 may include a conductive material. In an implementation, as illustrated in FIGS. 2, 4 and 5, each of the first to fourth lower source/drain contacts BCA1, BCA2, BCA3 and BCA4 may be formed of or as a single layer. In an implementation, each of the first to fourth lower source/drain contacts BCA1, BCA2, BCA3 and BCA4 may be formed of or as a multi-layer.

The first upper source/drain contact UCA1 may be between the first gate electrode G1 and the second gate electrode G2. The first upper source/drain contact UCA1 may extend in the second horizontal direction DR2. The first upper source/drain contact UCA1 may be connected to an upper portion of the first upper source/drain region USD1 by passing through the first upper interlayer insulating layer 170 and the liner layer 150 in the vertical direction DR3. The first upper source/drain contact UCA1 may be connected to an upper portion of the third through via TV3. In an implementation, the first upper source/drain contact UCA1 may electrically connect the first upper source/drain region USD1 with the third through via TV3.

The second upper source/drain contact UCA2 may be between the second gate electrode G2 and the third gate electrode G3. The second upper source/drain contact UCA2 may extend in the second horizontal direction DR2. The second upper source/drain contact UCA2 may be connected to an upper portion of the second upper source/drain region USD2 by passing through the first upper interlayer insulating layer 170 and the liner layer 150 in the vertical direction DR3. In an implementation, the second upper source/drain contact UCA2 may be connected to an upper portion of the first through via TV1. In an implementation, the second upper source/drain contact UCA2 may electrically connect the second upper source/drain region USD2 with the first through via TV1.

The third upper source/drain contact UCA3 may be between the third gate electrode G3 and the fourth gate electrode G4. The third upper source/drain contact UCA3 may extend in the second horizontal direction DR2. The third upper source/drain contact UCA3 may be connected to an upper portion of the third upper source/drain region USD3 by passing through the first upper interlayer insulating layer 170 and the liner layer 150 in the vertical direction DR3.

The lower silicide layer SL1 may be along a boundary surface between each of the first to third lower source/drain regions BSD1, BSD2 and BSD3 and each of the first to third lower source/drain contacts BCA1, BCA2 and BCA3. The upper silicide layer SL2 may be along a boundary surface between each of the first to third upper source/drain regions USD1, USD2 and USD3 and each of the first to third upper source/drain contacts UCA1, UCA2 and UCA3. Each of the lower silicide layer SL1 and the upper silicide layer SL2 may include, e.g., a metal silicide material.

The lower connection pad BP may be inside the second gate cut GC2. The lower connection pad BP may be on a lower surface of the third through via TV3 inside the second gate cut GC2. The lower connection pad BP may extend in the vertical direction DR3 from a lower surface of the third lower interlayer insulating layer 160. The lower connection pad BP may be electrically connected to the third through via TV3. In an implementation, an upper surface of the lower connection pad BP may be on the same plane as an upper surface of the first lower source/drain contact BCA1. In an implementation, a lower surface of the lower connection pad BP may be on the same plane as the lower surface of the second gate cut GC2.

The upper connection pad UP may be inside the first gate cut GC1. The upper connection pad UP may be on the upper surface of the first through via TV1 inside the first gate cut GC1. The upper connection pad UP may extend from the upper surface of the first upper interlayer insulating layer 170 to the upper surface of the first through via TV1. The upper connection pad UP may be electrically connected to the first through via TV1. In an implementation, an upper surface of the upper connection pad UP may be on the same plane as an upper surface of the first upper source/drain contact UCA1. In an implementation, a lower surface of the upper connection pad UP may be on the same plane as a lower surface of the first upper source/drain contact UCA1.

Each of the lower connection pad BP and the upper connection pad UP may include a conductive material. In an implementation, as illustrated in FIG. 4, each of the lower connection pad BP and the upper connection pad UP may be a single layer. In an implementation, each of the lower connection pad BP and the upper connection pad UP may be a multi-layer.

In an implementation, the gate contact CB may be connected to the second gate electrode G2 by passing through the capping pattern 133 in the vertical direction DR3. In an implementation, the gate contact CB may be arranged, e.g., as shown in FIG. 3. The gate contact CB may include a conductive material. In an implementation, as illustrated in FIG. 3, the gate contact CB may be a single layer. In an implementation, the gate contact CB may be a multi-layer.

The second upper interlayer insulating layer 180 may be on the first upper interlayer insulating layer 170. The second upper interlayer insulating layer 180 may include, e.g., silicon oxide, silicon nitride, silicon oxynitride, or a low dielectric constant material. In an implementation, the first lower via BV1 may be connected to the first lower source/drain contact BCA1 by passing through the first lower interlayer insulating layer 100 in the vertical direction DR3. The second lower via BV2 may be connected to the lower connection pad BP by passing through the first lower interlayer insulating layer 100 in the vertical direction DR3. In an implementation, the first upper via UV1 may be connected to the gate contact CB by passing through the second upper interlayer insulating layer 180 in the vertical direction DR3. The second upper via UV2 may be connected to the upper connection pad UP by passing through the second upper interlayer insulating layer 180 in the vertical direction DR3. Each of the first lower via BV1, the second lower via BV2, the first upper via UV1, and the second upper via UV2 may include a conductive material.

In the semiconductor device having a structure in which a plurality of upper nanosheets are stacked on a plurality of lower nanosheets, the through via may connect each of the lower source/drain contacts with each of the upper source/drain contacts, whereby an area of a cell region may be increased. In the structure of the semiconductor device according to some embodiments of the present disclosure, in which a plurality of upper nanosheets are stacked on a plurality of lower nanosheets, the through via connecting each of the lower source/drain contacts with each of the upper source/drain contacts may be inside the gate cut. The semiconductor device according to some embodiments of the present disclosure may not require a separate region for the through via in the cell region, and the area of the cell region may be reduced so that the degree of integration of the semiconductor device may be improved.

Hereinafter, a method for manufacturing a semiconductor device according to some embodiments of the present disclosure will be described with reference to FIGS. 1 to 58.

Figure 6:
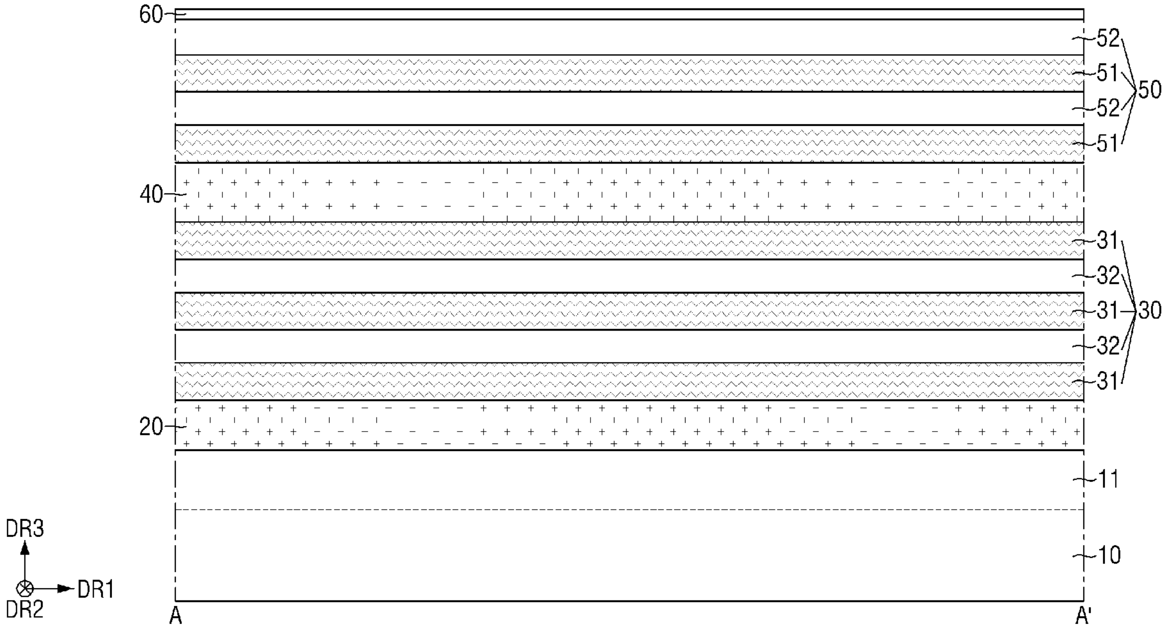
FIGS. 6 to 58 are views of stages in a method for manufacturing a semiconductor device according to some embodiments of the present disclosure.
Figure 58:
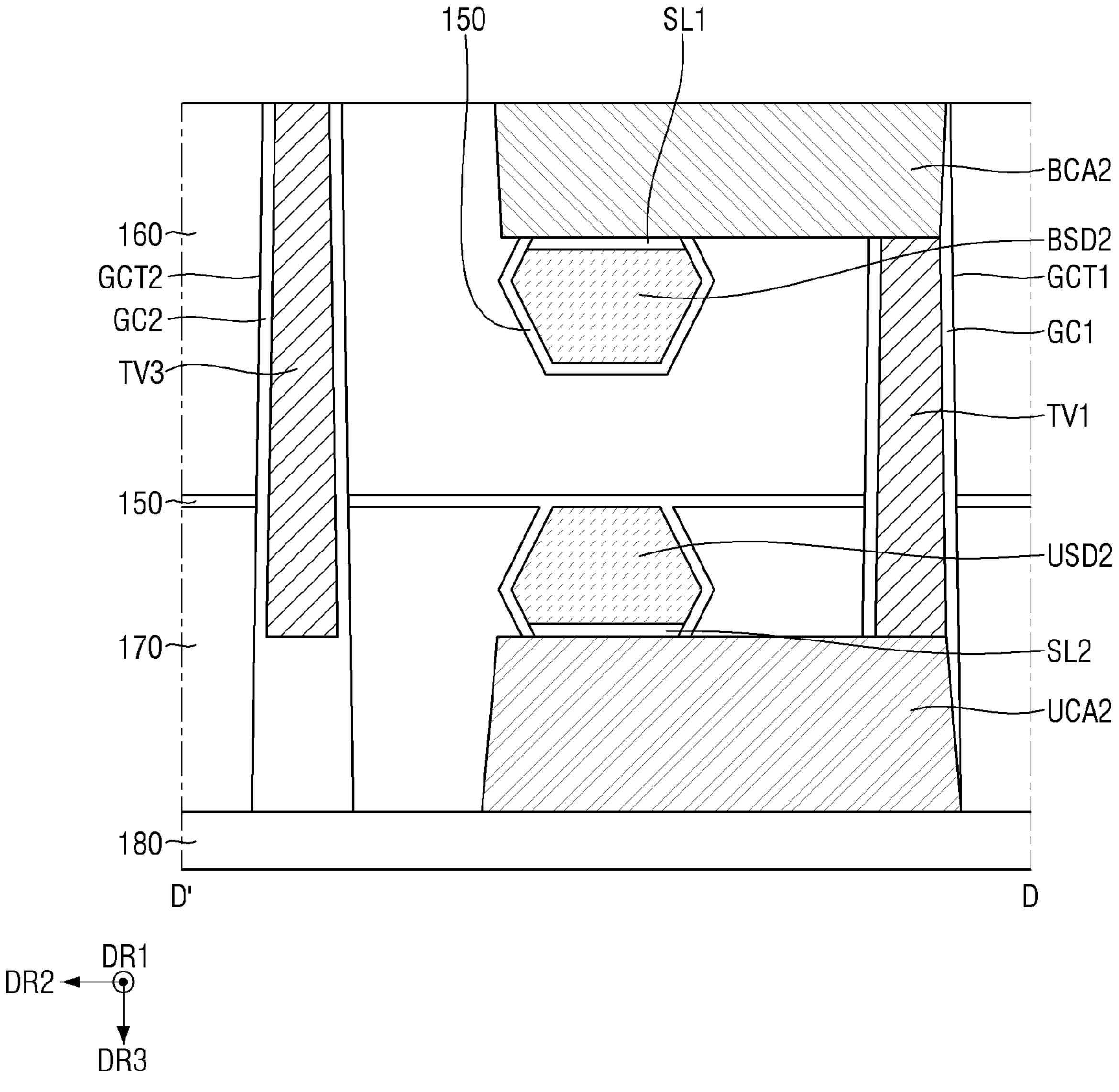

FIGS. 6 to 58 are views of stages in a method for manufacturing a semiconductor device according to some embodiments of the present disclosure.

Figure 7:
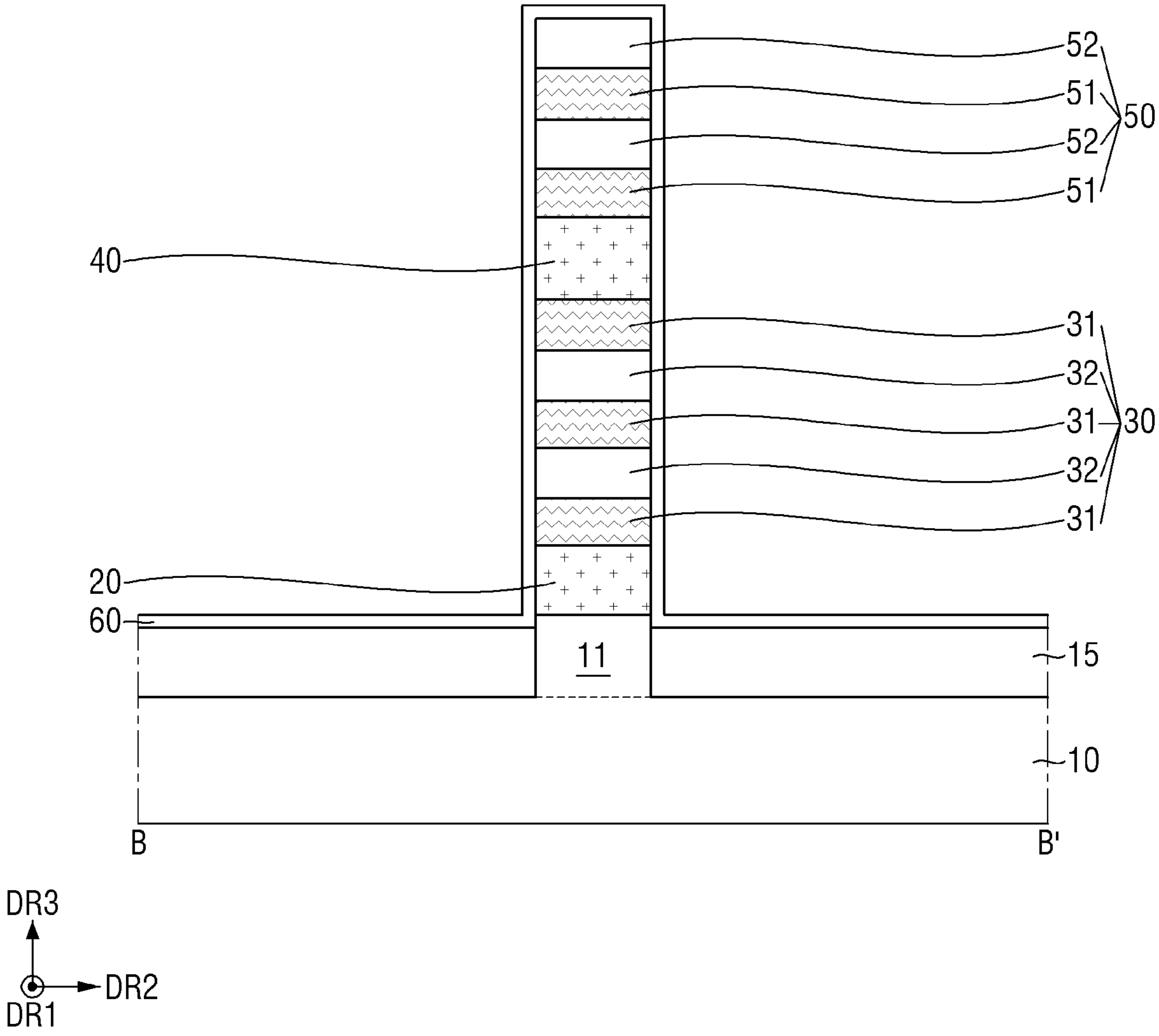

Referring to FIGS. 6 and 7, a first isolation material layer 20, a first stacked structure 30, a second isolation material layer 40 and a second stacked structure 50 may be sequentially stacked on a substrate 10. In an implementation, the substrate 10 may be a silicon substrate or a silicon-on-insulator (SOI). In an implementation, the substrate 10 may include silicon germanium, silicon germanium on insulator (SGOI), indium antimonide, lead telluride, indium arsenide, indium phosphide, gallium arsenide, or gallium antimonide.

The first isolation material layer 20 may be formed on the substrate 10. The first stacked structure 30 may include a first sacrificial layer 31 and a first semiconductor layer 32, which are alternately stacked on the first isolation material layer 20. In an implementation, the first sacrificial layer 31 may be formed on each of the lowermost portion and the uppermost portion of the first stacked structure 30. In an implementation, the first semiconductor layer 32 may be formed on the uppermost portion of the first stacked structure 30.

The second isolation material layer 40 may be formed on the first stacked structure 30. The second stacked structure 50 may include a second sacrificial layer 51 and a second semiconductor layer 52, which are alternately stacked on the second isolation material layer 40. In an implementation, the second sacrificial layer 51 may be formed on the lowermost portion of the second stacked structure 50 and the second semiconductor layer 52 may be formed on the uppermost portion of the second stacked structure 50. In an implementation, the second sacrificial layer 51 may be also formed on the uppermost portion of the second stacked structure 50.

In an implementation, each of the first isolation material layer 20 and the second isolation material layer 40 may include silicon germanium (SiGe). In an implementation, each of the first sacrificial layer 31 and the second sacrificial layer 51 may include silicon germanium (SiGe). In an implementation, a concentration of germanium (Ge) included in each of the first isolation material layer 20 and the second isolation material layer 40 may be greater than that of germanium (Ge) included in each of the first sacrificial layer 31 and the second sacrificial layer 51. In an implementation, each of the first semiconductor layer 32 and the second semiconductor layer 52 may include silicon (Si).

Subsequently, the second stacked structure 50, the second isolation material layer 40, the first stacked structure 30, the first isolation material layer 20, and the substrate 10 may be partially etched, so that an active pattern 11 may be formed on the substrate 10. The active pattern 11 may extend in the first horizontal direction DR1. A field insulating layer 15 surrounding sidewalls of the active pattern 11 may be formed on the substrate 10. In an implementation, the active pattern 11 may protrude more or farther in the vertical direction DR3 than an upper surface of the field insulating layer 15. A pad oxide layer 60 may be formed to cover each of the field insulating layer 15, the first isolation material layer 20, the first stacked structure 30, the second isolation material layer 40, and the second stacked structure 50. In an implementation, the pad oxide layer 60 may be formed to be conformal. The pad oxide layer 60 may include, e.g., silicon oxide ($SiO_2$).

Figure 8:
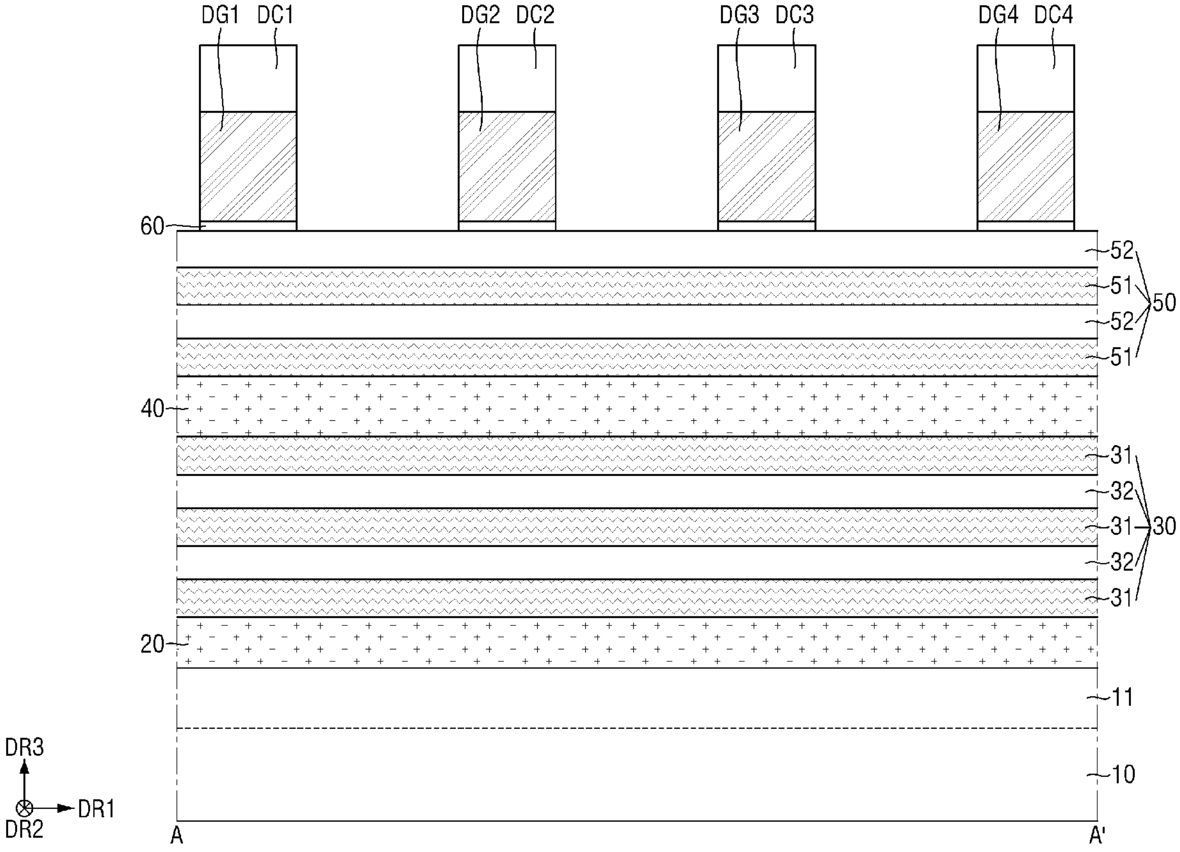
Figure 9:
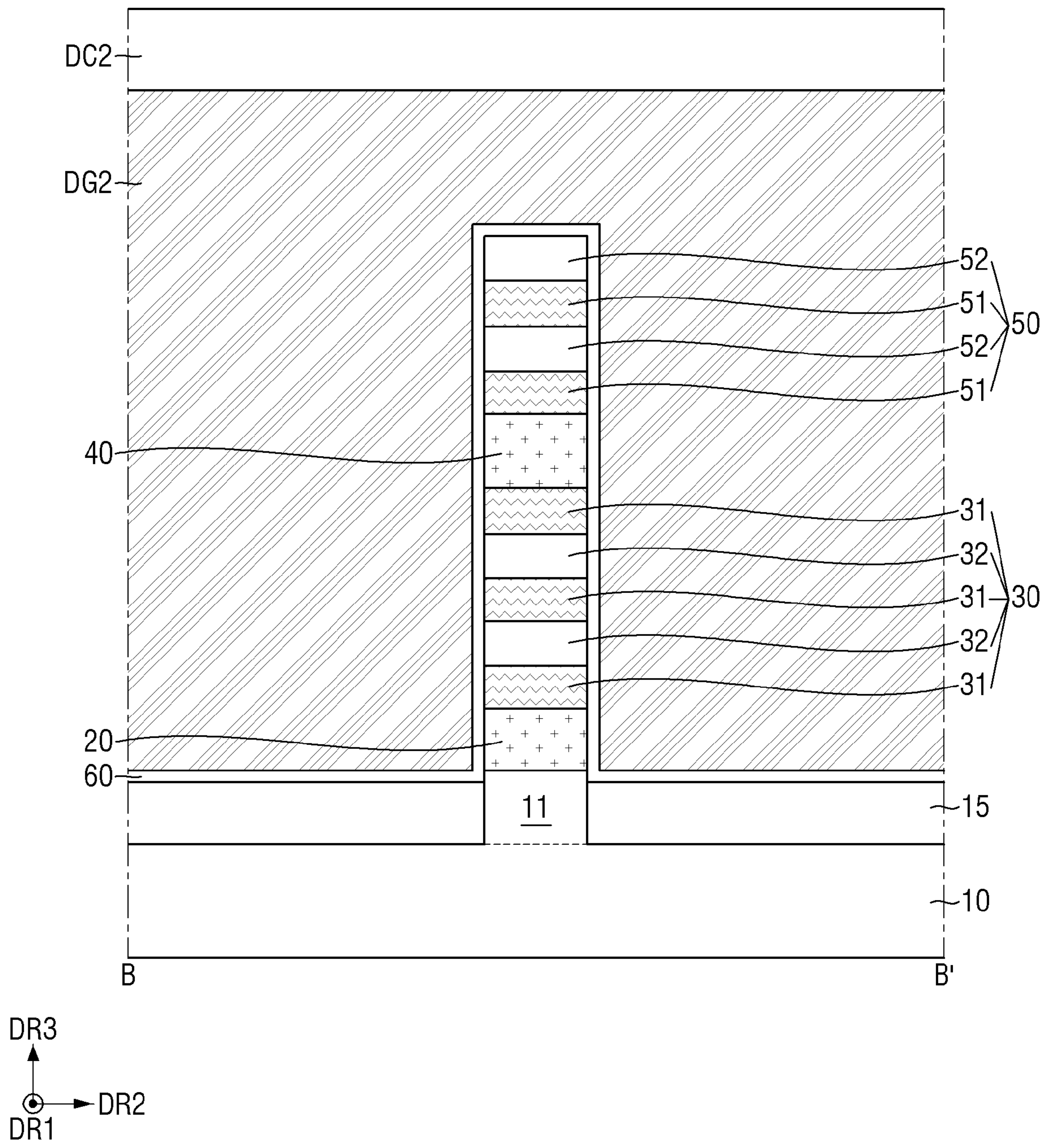
Figure 10:
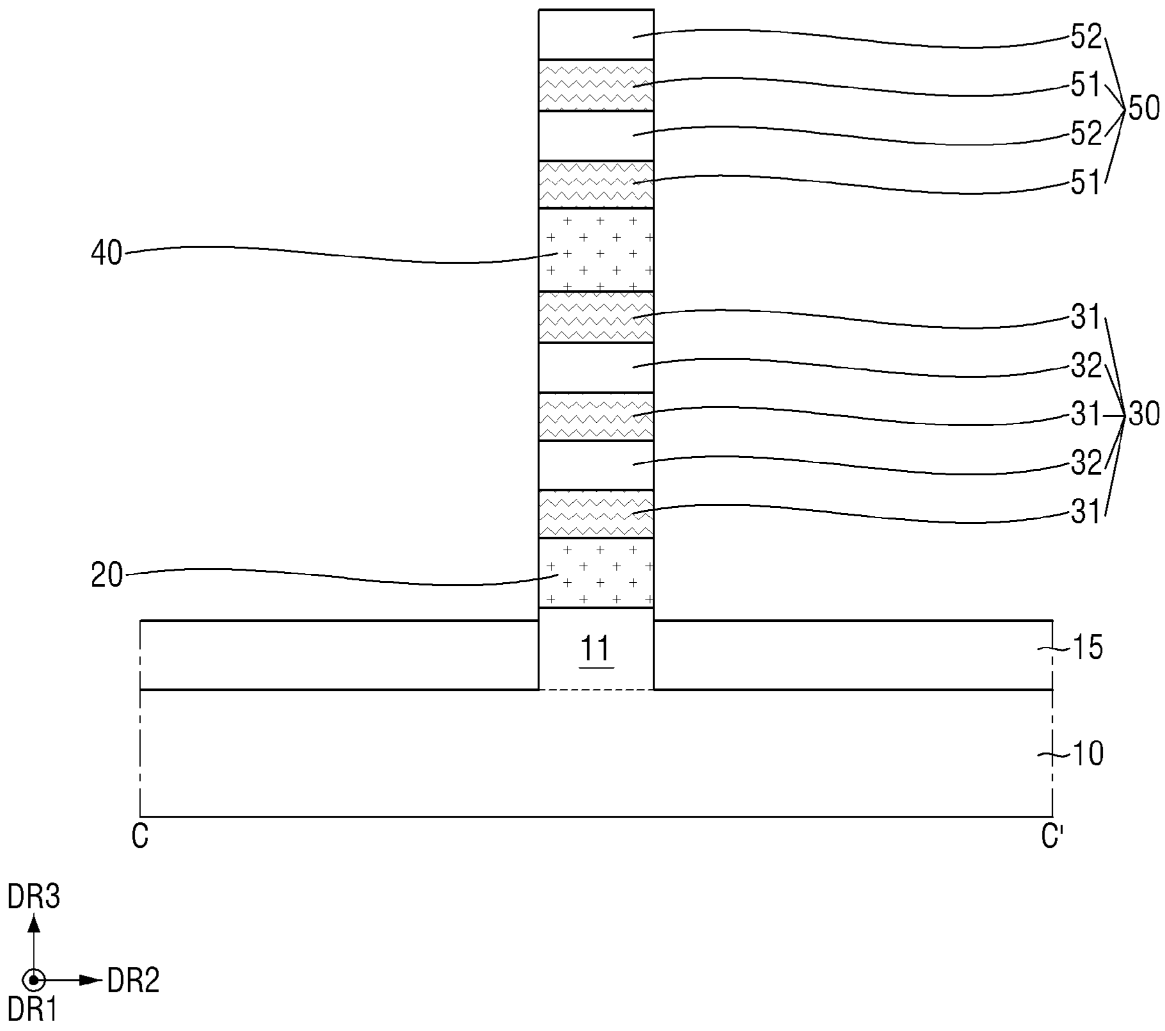

Referring to FIGS. 8 to 10, first to fourth dummy gates DG1, DG2, DG3 and DG4 extending in the second horizontal direction DR2 may be formed on the field insulating layer 15 and the second stacked structure 50. The first to fourth dummy gates DG1, DG2, DG3 and DG4 may be sequentially spaced apart from each other in the first horizontal direction DR1. In addition, first to fourth dummy capping patterns DC1, DC2, DC3 and DC4 may be formed on the first to fourth dummy gates DG1, DG2, DG3, DG4, respectively. In an implementation, the pad oxide layer 60 of the remaining portion except a portion that overlaps each of the first to fourth dummy gates DG1, DG2, DG3 and DG4 in the vertical direction DR3 may be removed.

Figure 11:
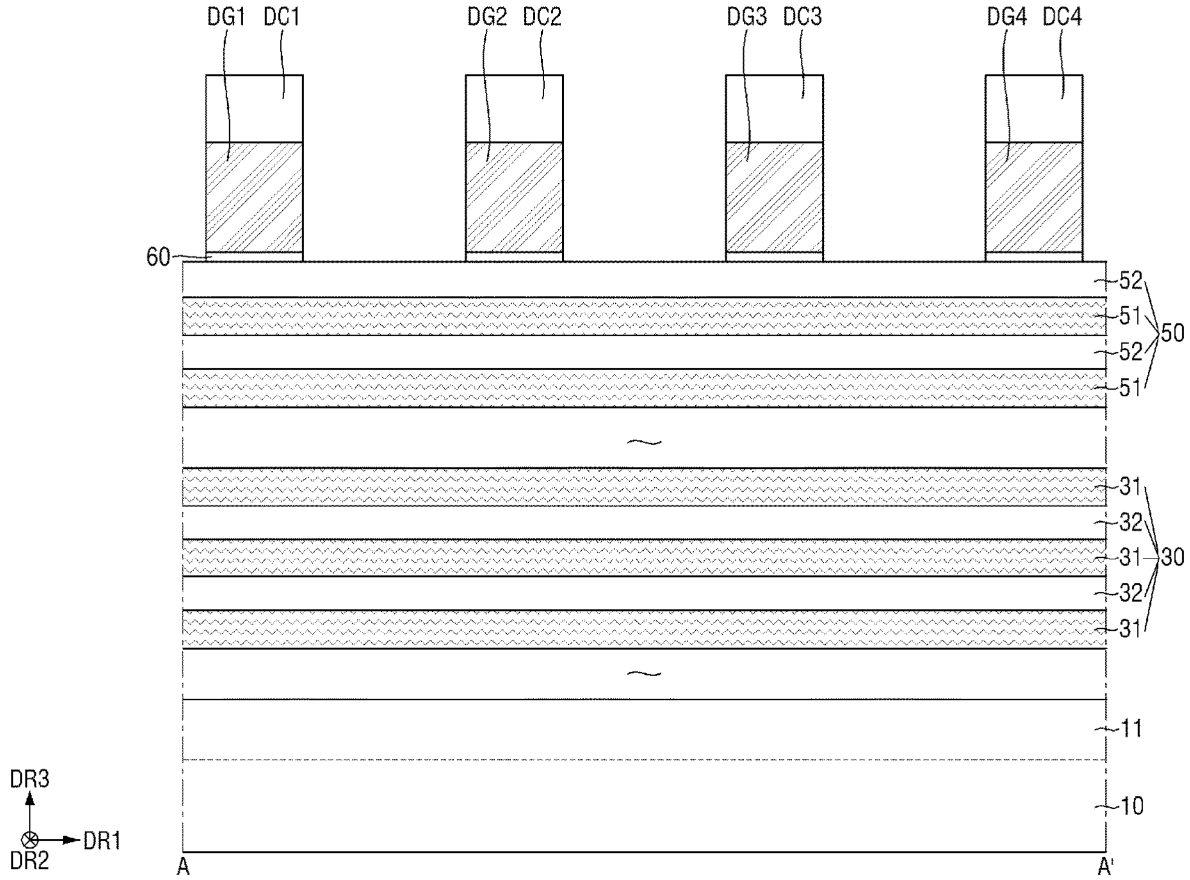
Figure 12:
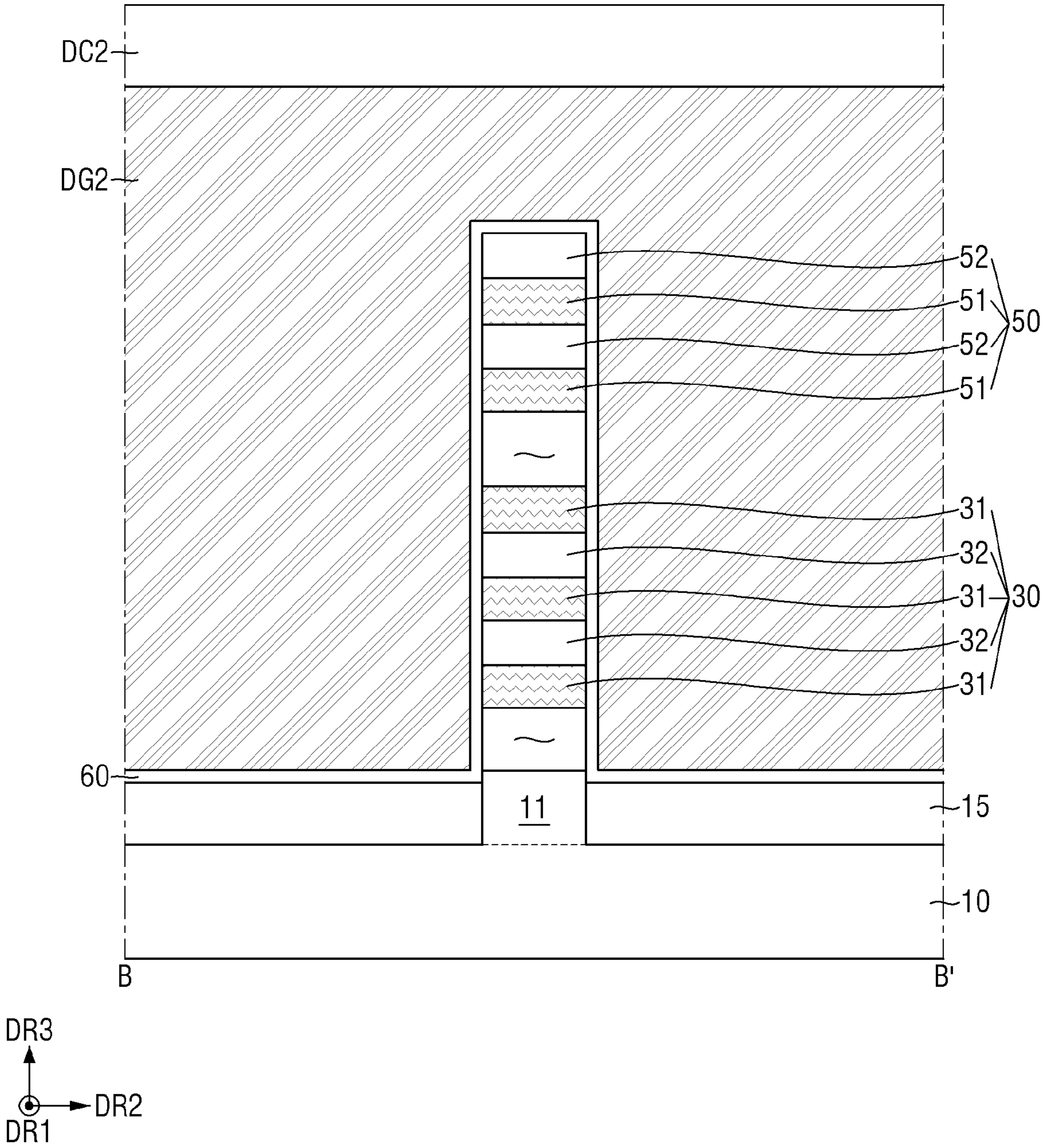
Figure 13:
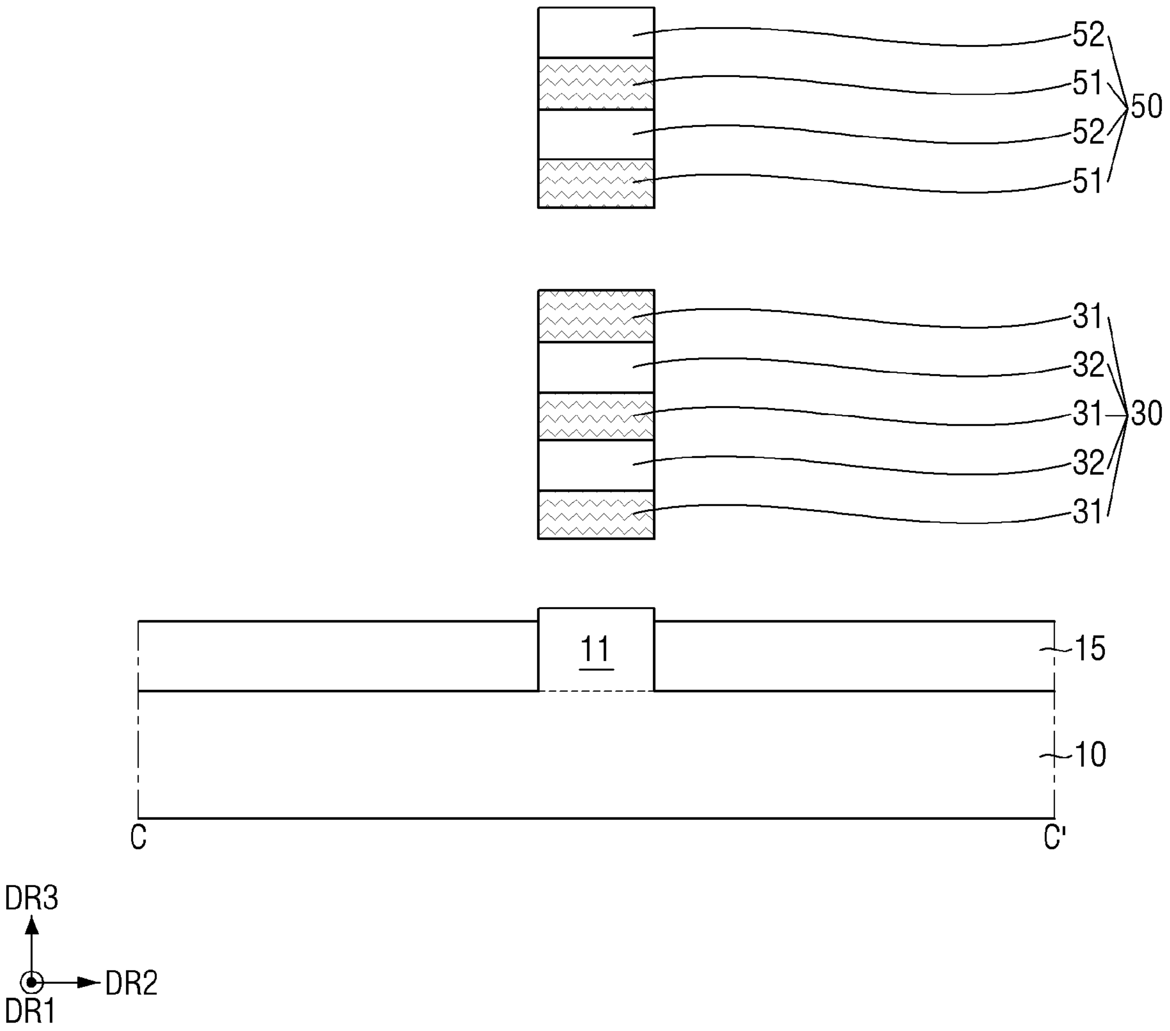

Referring to FIGS. 11 to 13, each of the first isolation material layer (20 in FIGS. 8 to 10) and the second isolation material layer (40 in FIGS. 8 to 10) may be etched. In an implementation, each of the first isolation material layer (20 in FIGS. 8 to 10) and the second isolation material layer (40 in FIGS. 8 to 10) may be etched by a wet etching process.

Figure 14:
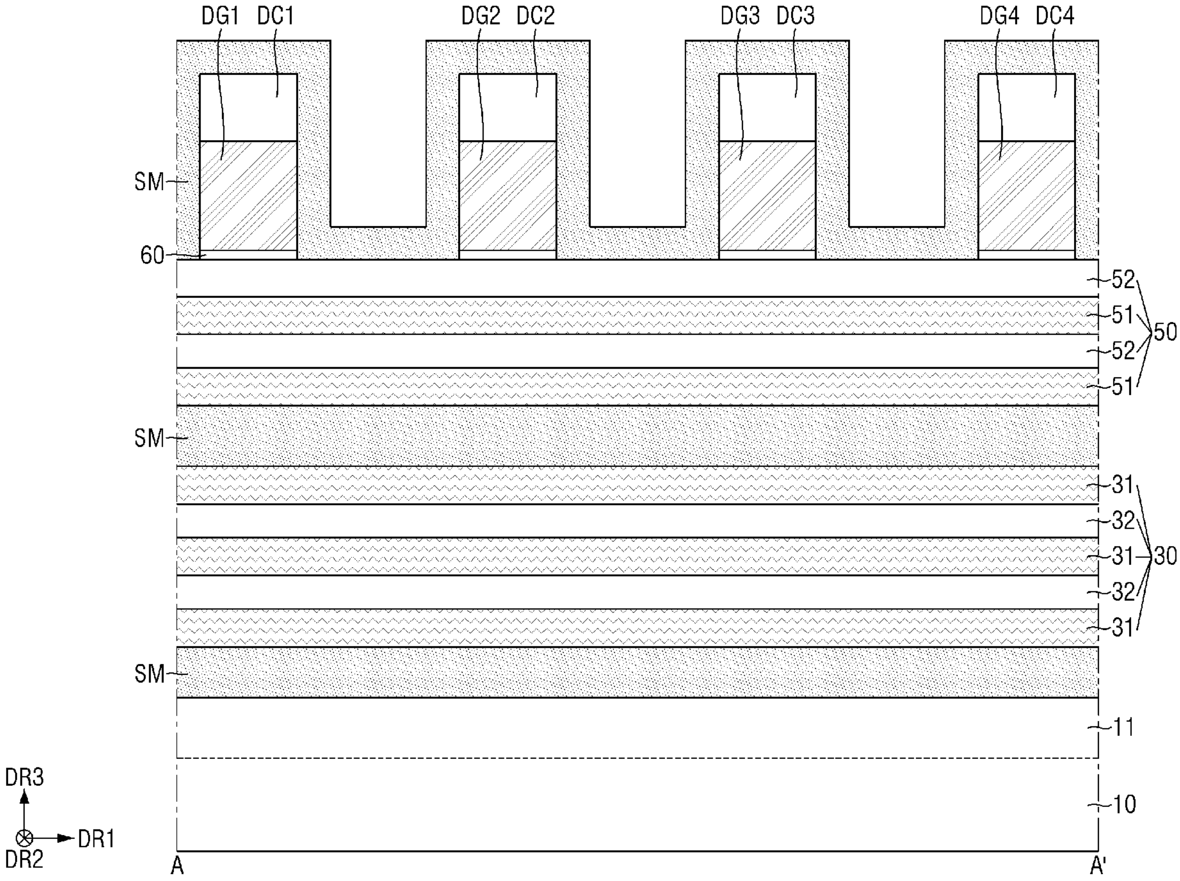
Figure 15:
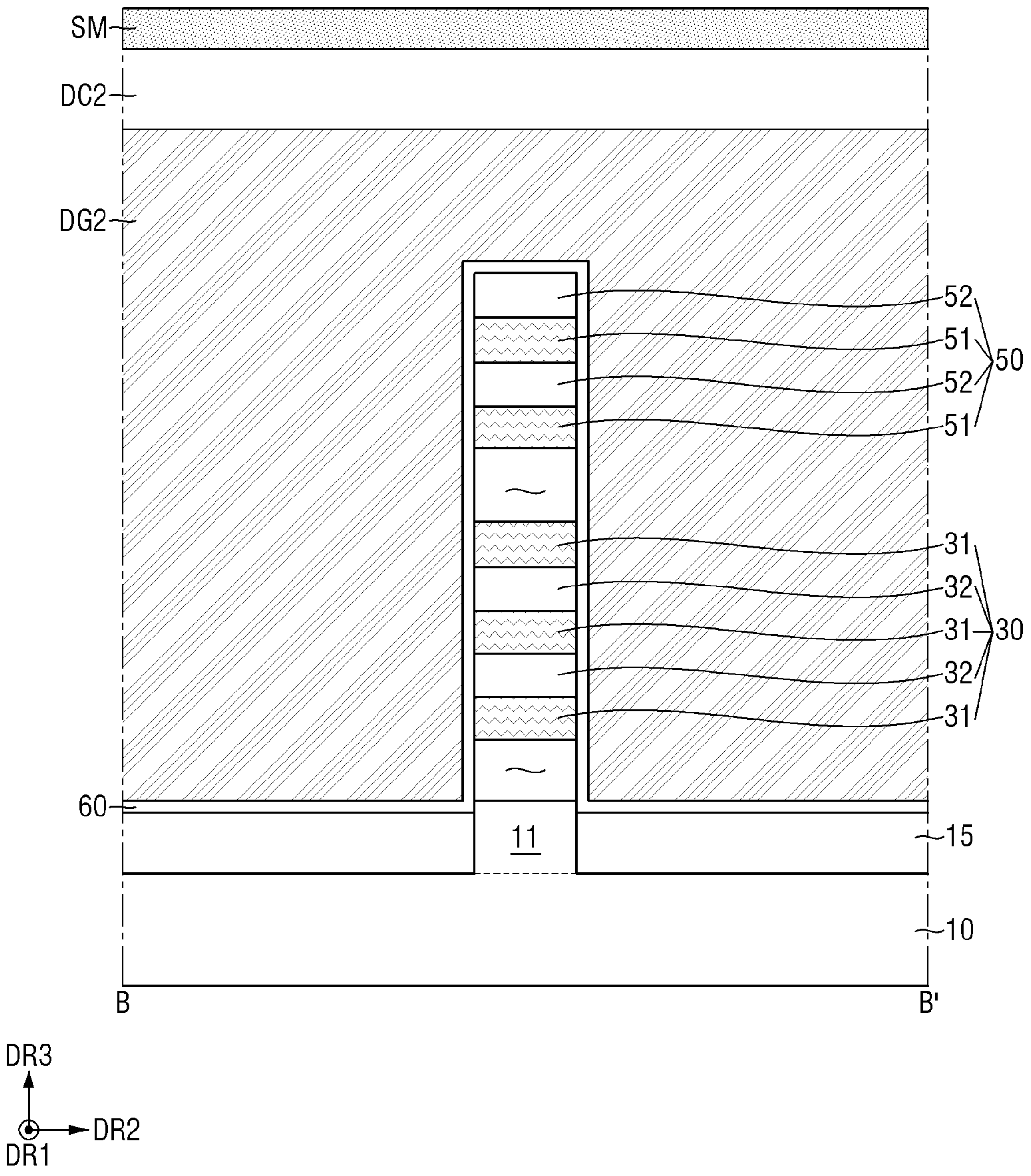
Figure 16:
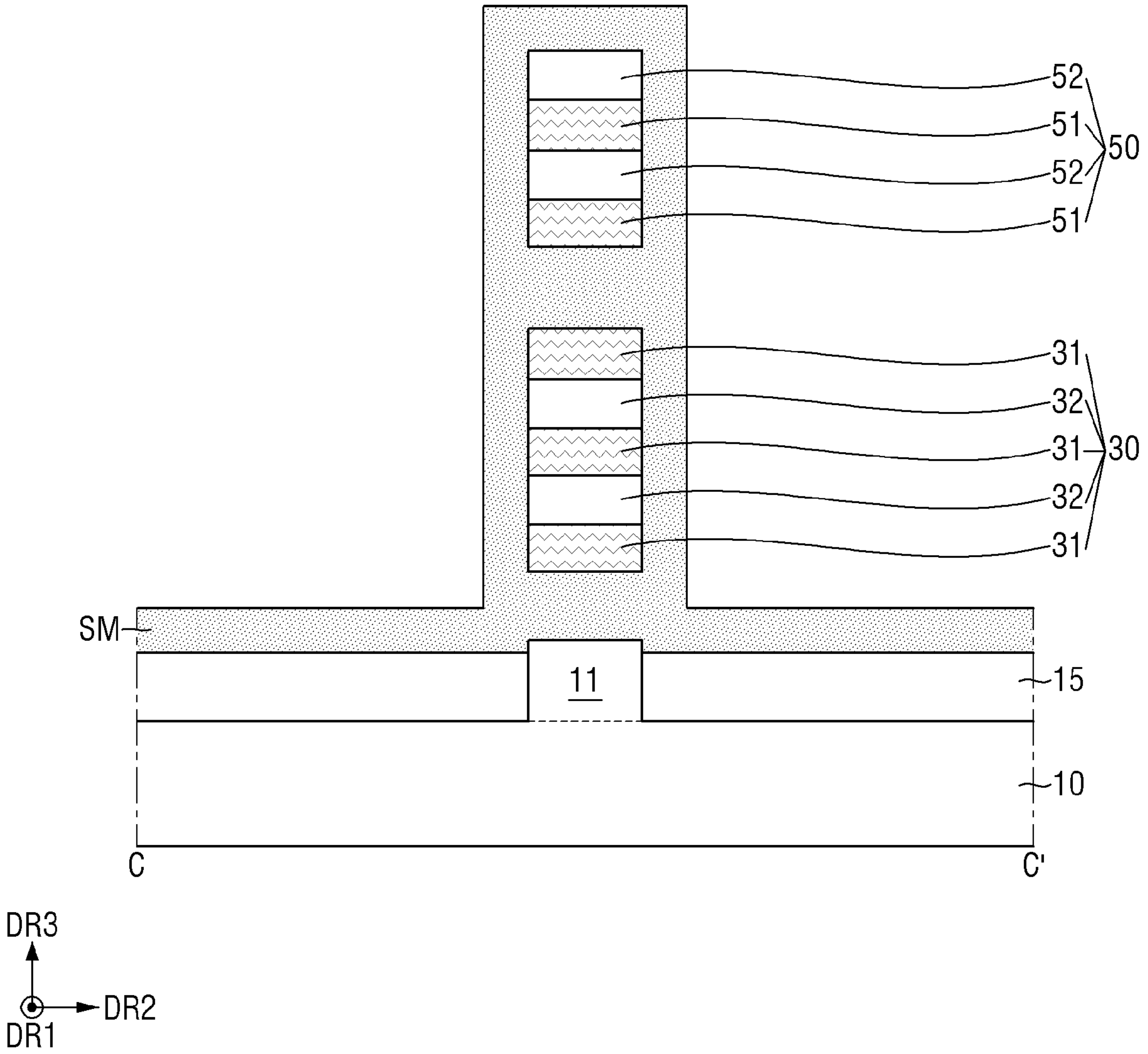

Referring to FIGS. 14 to 16, a spacer material layer SM may be formed to cover sidewalls of each of the first to fourth dummy gates DG1, DG2, DG3 and DG4, sidewalls and an upper surface of each of the first to fourth dummy capping patterns DC1, DC2, DC3 and DC4, and upper surfaces of the first stacked structure 30, the second stacked structure 50, and the field insulating layer 15. The spacer material layer SM may fill the etched portion of each of the first isolation material layer (20 in FIGS. 8 to 10) and the second isolation material layer (40 in FIGS. 8 to 10). In an implementation, the spacer material layer SM may be formed to be conformal. The spacer material layer SM may include, e.g., silicon nitride (SiN), silicon oxycarbonitride (SiOCN), silicon boron carbonitride (SiBCN), silicon carbonitride (SiCN), silicon oxynitride (SiON), or their combination.

Figure 17:
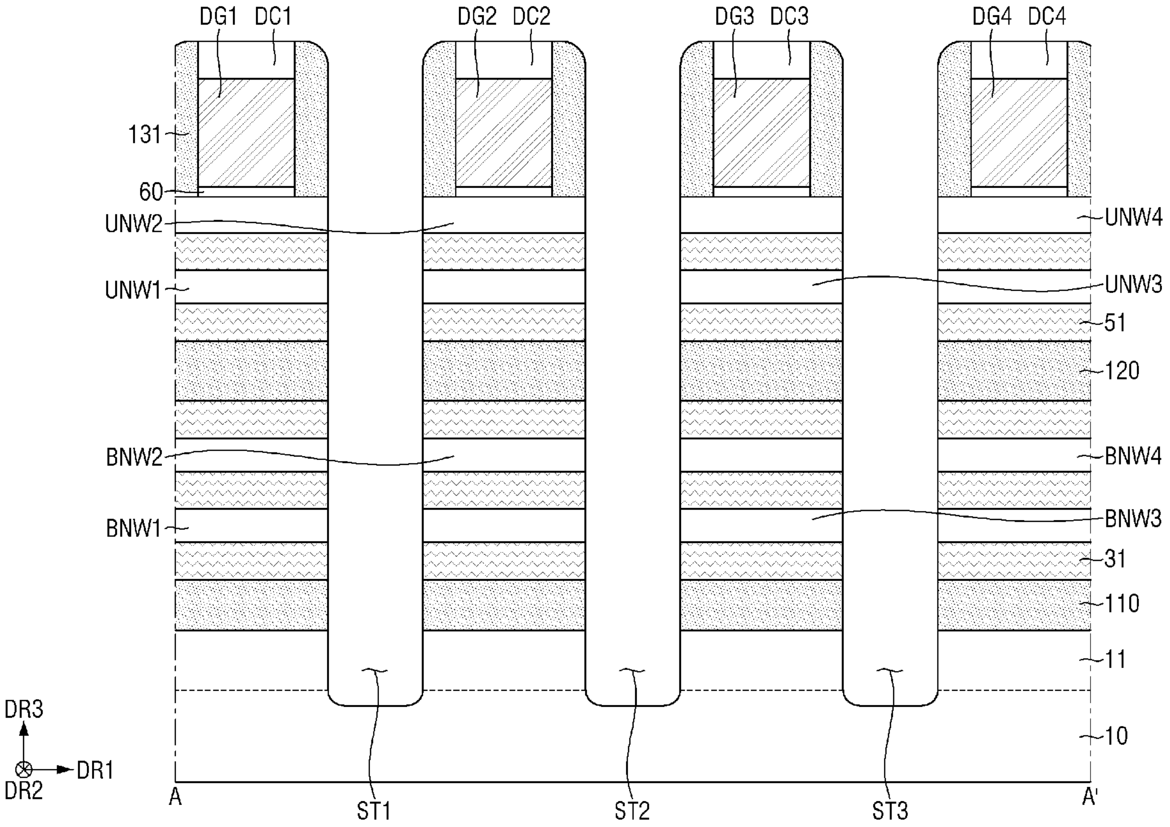
Figure 18:
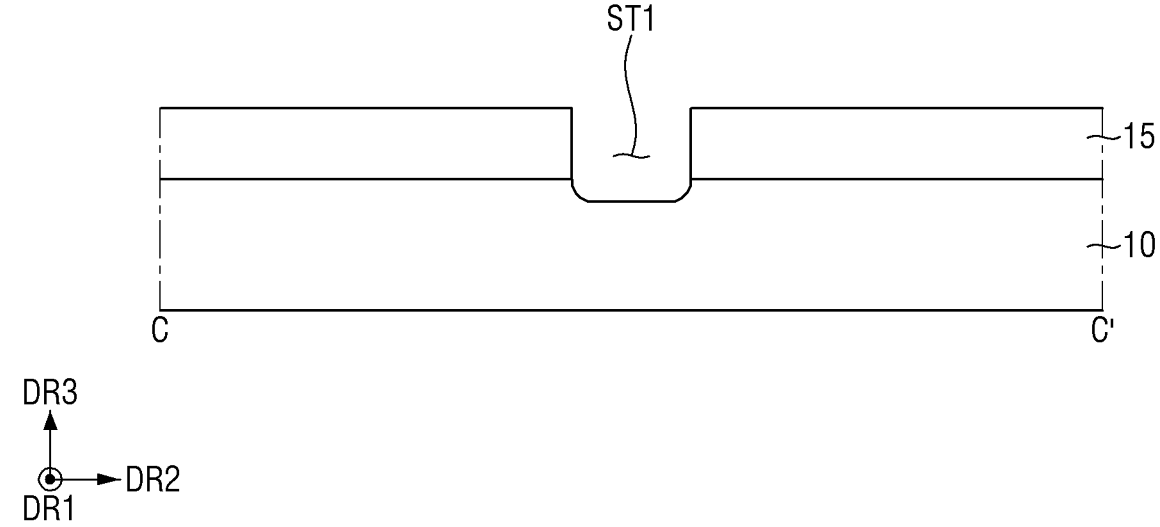

Referring to FIGS. 17 and 18, the first stacked structure (30 in FIGS. 14 to 16), the second stacked structure (50 in FIGS. 14 to 16) and the spacer material layer (SM of FIGS. 14 to 16) may be etched using the first to fourth dummy capping patterns DC1, DC2, DC3 and DG4 and the first to fourth dummy gates DG1, DG2, DG3 and DG4 as masks, so that first to third source/drain trenches ST1, ST2 and ST3 may be formed. In an implementation, each of the first to third source/drain trenches ST1, ST2 and ST3 may be extended into the substrate 10.

In an implementation, the first source/drain trench ST1 may be formed between the first dummy gate DG1 and the second dummy gate DG2 on the substrate 10. The second source/drain trench ST2 may be formed between the second dummy gate DG2 and the third dummy gate DG3 on the substrate 10. The third source/drain trench ST3 may be formed between the third dummy gate DG3 and the fourth dummy gate DG4 on the substrate 10.

While each of the first to third source/drain trenches ST1, ST2 and ST3 is being formed, a portion of each of the first to fourth dummy capping patterns DC1, DC2, DC3 and DC4 and the spacer material layer (SM in FIGS. 14 to 16) formed on the upper surface of each of the first to fourth dummy capping patterns DC1, DC2, DC3 and DC4 may be etched. The spacer material layer (SM in FIGS. 14 to 16) remaining on the sidewalls of each of the first to fourth dummy gates DG1, DG2, DG3 and DG4 and the remaining first to fourth dummy capping patterns DC1, DC2, DC3 and DC4 may be defined as the gate spacer 131.

In an implementation, after each of the first to third source/drain trenches ST1, ST2 and ST3 is formed, the first semiconductor layer (32 in FIGS. 14 to 16) remaining below each of the first to fourth dummy gates DG1, DG2, DG3 and DG4 may be defined as each of the first to fourth plurality of lower nanosheets BNW1, BNW2, BNW3 and BNW4. In addition, after each of the first to third source/drain trenches ST1, ST2 and ST3 is formed, the second semiconductor layer (52 in FIGS. 14 to 16) remaining below each of the first to fourth dummy gates DG1, DG2, DG3 and DG4 may be defined as each of the first to fourth plurality of upper nanosheets UNW1, UNW2, UNW3 and UNW4.

In an implementation, after each of the first to third source/drain trenches ST1, ST2 and ST3 is formed, the spacer material layer (SM in FIGS. 14 to 16) remaining between the active pattern 11 and each of the first to fourth plurality of lower nanosheets BNW1, BNW2, BNW3 and BNW4 may be defined as the lower isolation layer 110. In addition, after each of the first to third source/drain trenches ST1, ST2 and ST3 is formed, the spacer material layer (SM in FIGS. 14 to 16) remaining between each of the first to fourth plurality of lower nanosheets BNW1, BNW2 and BNW3 and BNW4 and each of the first to fourth plurality of upper nanosheets UNW1, UNW2, UNW3 and UNW4 may be defined as the upper isolation layer 120.

Figure 19:
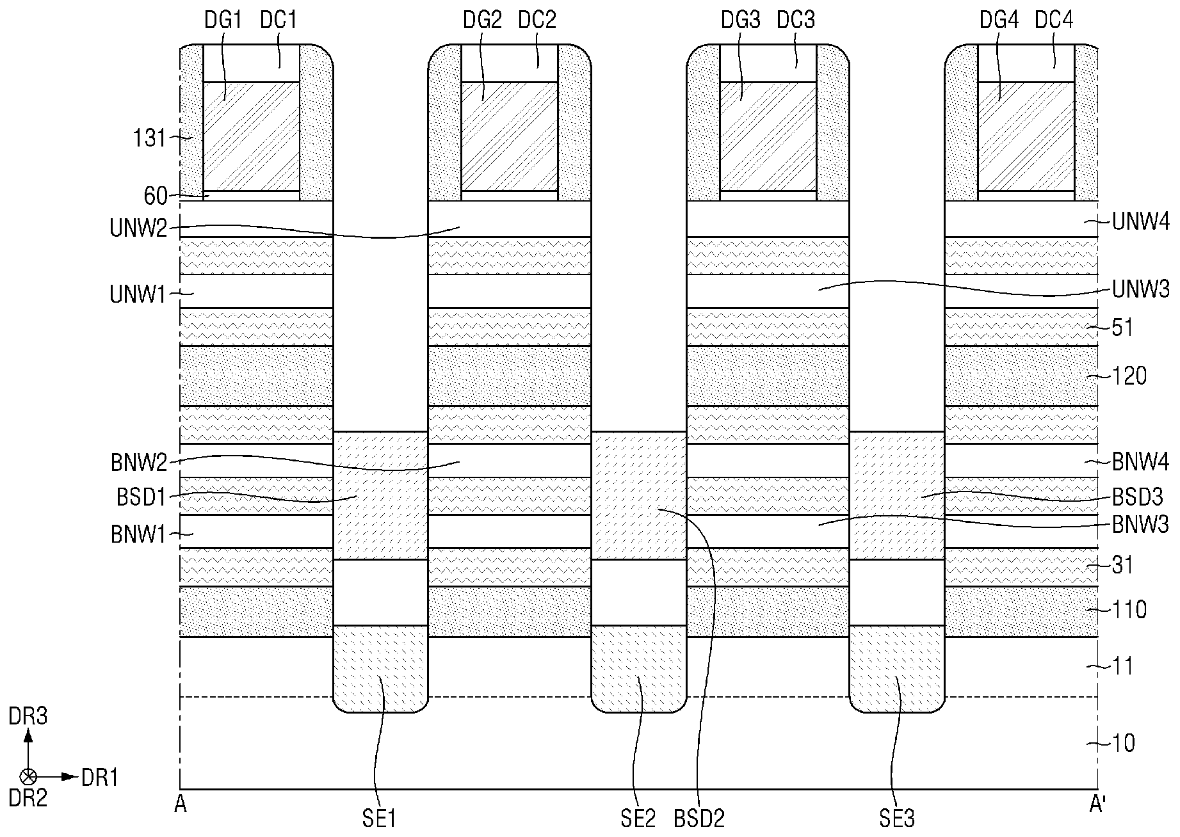
Figure 20:
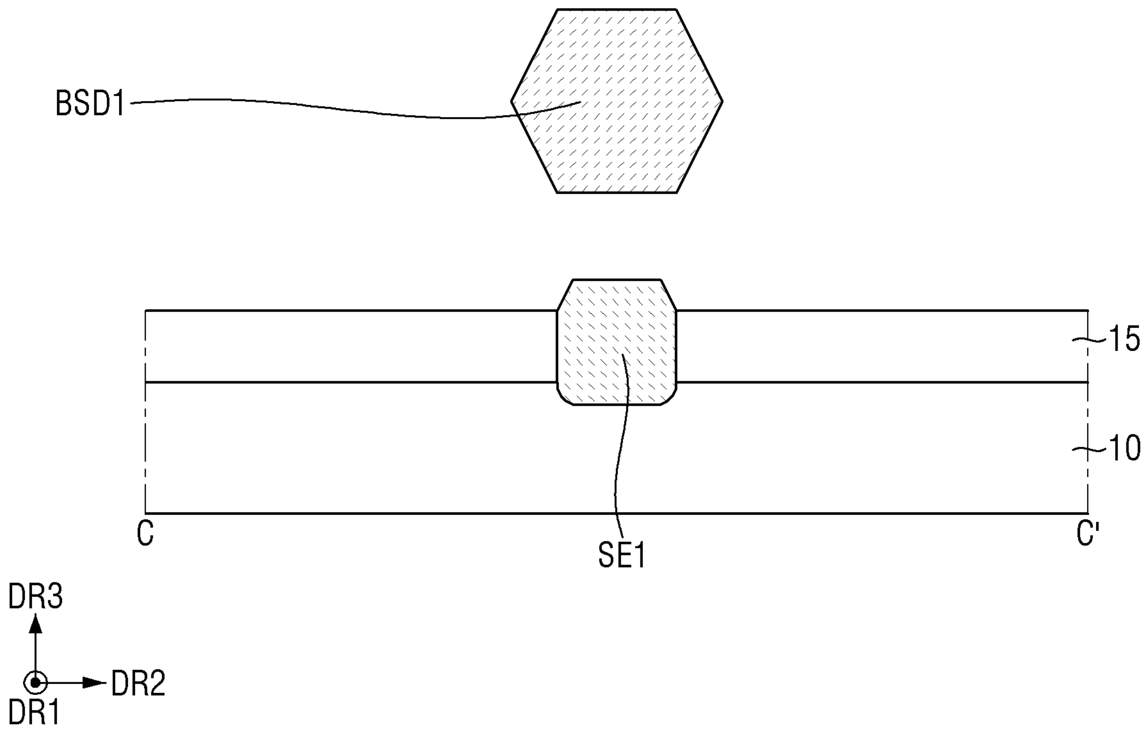

Referring to FIGS. 19 and 20, first to third sacrificial epitaxial layers SE1, SE2 and SE3 and first to third lower source/drain regions BSD1, BSD2 and BD3 may be formed inside each of the first to third source/drain trenches ST1, ST2 and ST3.

In an implementation, each of the first to third sacrificial epitaxial layers SE1, SE2, SE3 may be formed between the active patterns 11 inside each of the first to third source/drain trenches ST1, ST2 and ST3. In an implementation, each of the first to third sacrificial epitaxial layers SE1, SE2 and SE3 may be epitaxially grown from the substrate 10 and the active pattern 11.

In an implementation, the first lower source/drain region BSD1 may be formed between the first plurality of lower nanosheets BNW1 and the second plurality of lower nanosheets BNW2 inside the first source/drain trench ST1. The second lower source/drain region BSD2 may be formed between the second plurality of lower nanosheets BNW2 and the third plurality of lower nanosheets BNW3 inside the second source/drain trench ST2. The third lower source/drain region BSD3 may be formed between the third plurality of lower nanosheets BNW3 and the fourth plurality of lower nanosheets BNW4 inside the third source/drain trench ST3. In an implementation, each of the first to third lower source/drain regions BSD1, BSD2 and BSD3 may be epitaxially grown from each of the first to fourth plurality of lower nanosheets BNW1, BNW2, BNW3 and BNW4.

Figure 21:
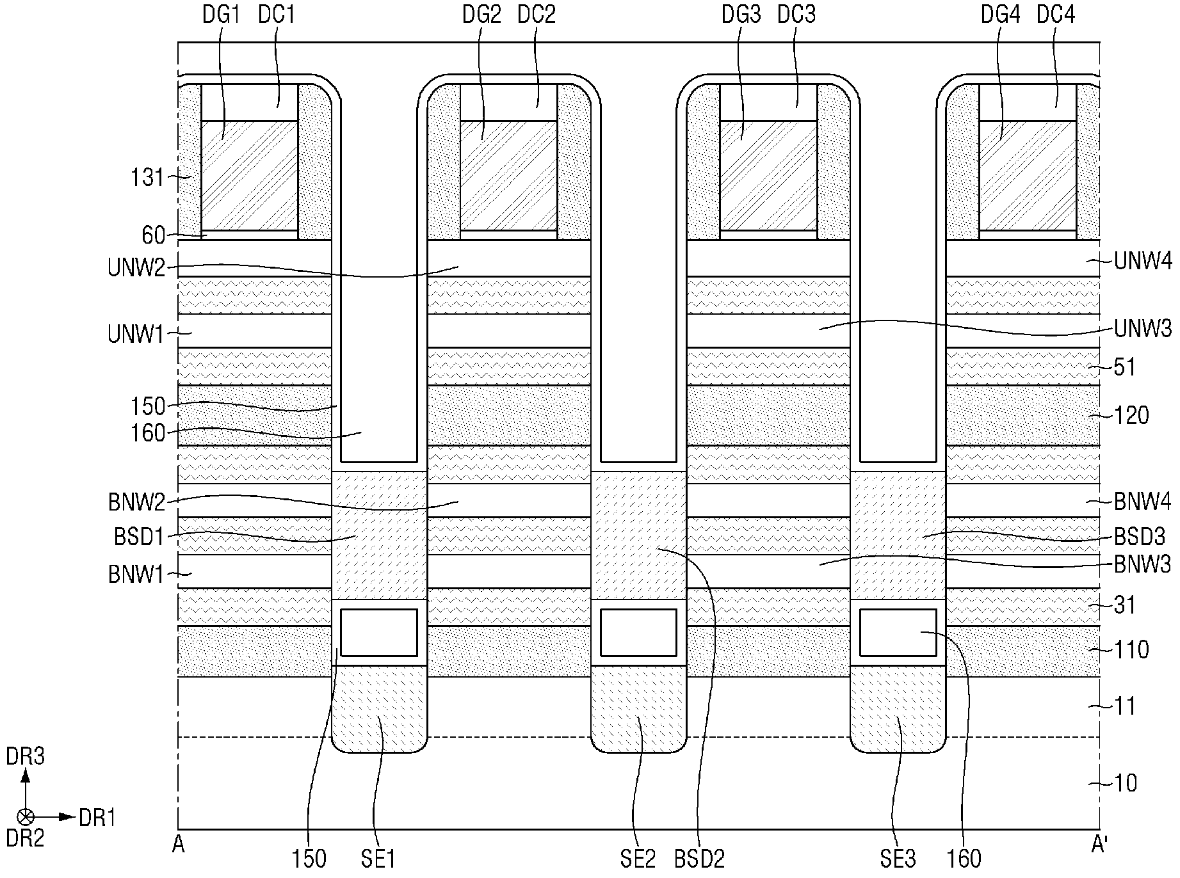
Figure 22:
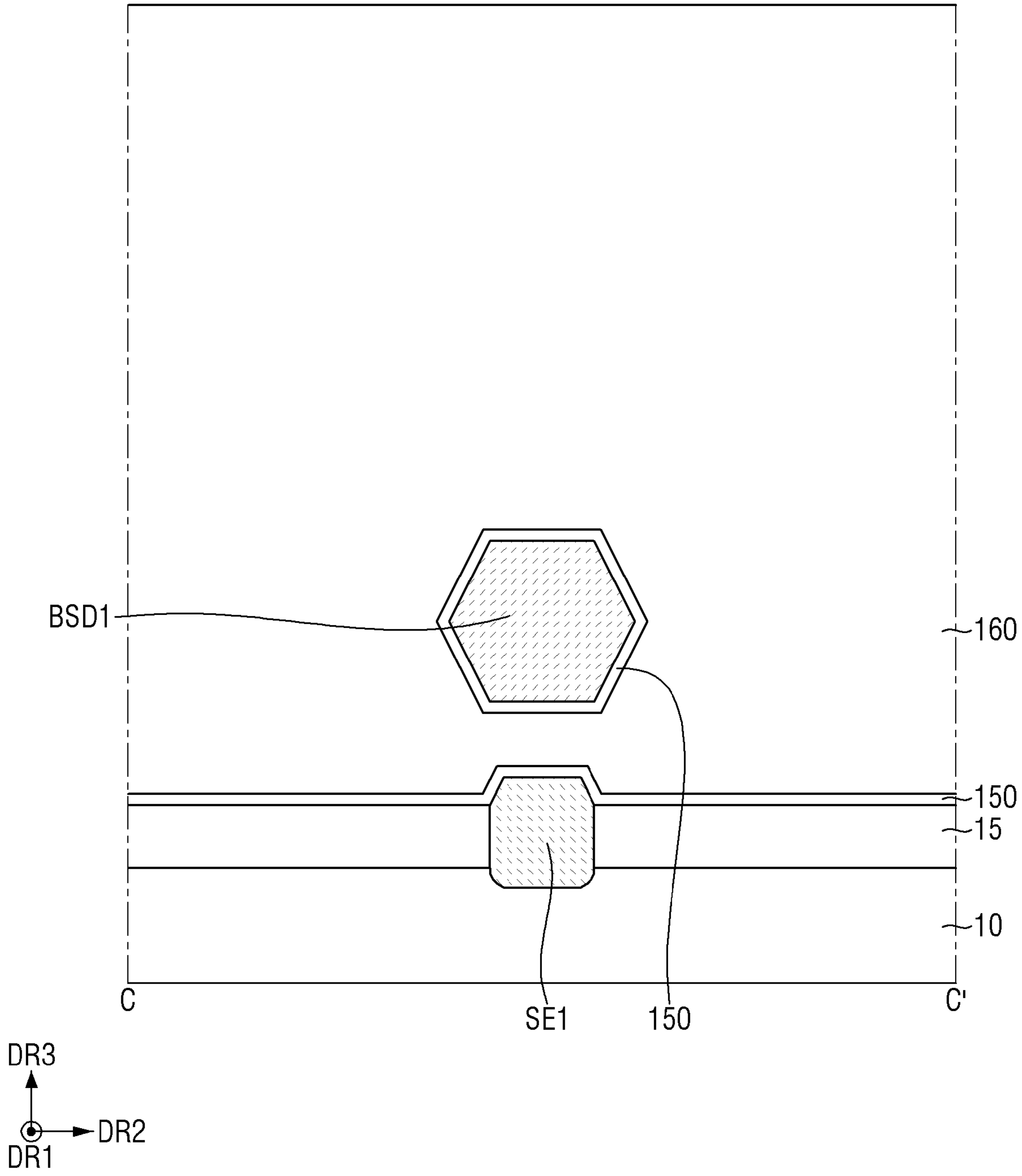

Referring to FIGS. 21 and 22, a liner layer 150 may be formed along an exposed surface of each of the field insulating layer 15, the first to third sacrificial epitaxial layers SE1, SE2 and SE3, the lower isolation layer 110, the upper isolation layer 120, the first to third lower source/drain regions BSD1, BSD2 and BSD3, the first to third upper source/drain regions USD1, USD2 and USD3, the first and second sacrificial layers 31 and 51, the gate spacer 131 and the first to fourth dummy capping patterns DC1, DC2, DC3 and DC4. Then, the third lower interlayer insulating layer 160 may be formed on the liner layer 150. In an implementation, the upper surface of the third lower interlayer insulating layer 160 may be formed to be higher than the upper surface of each of the first to fourth dummy capping patterns DC1, DC2, DC3 and DC4.

Figure 23:
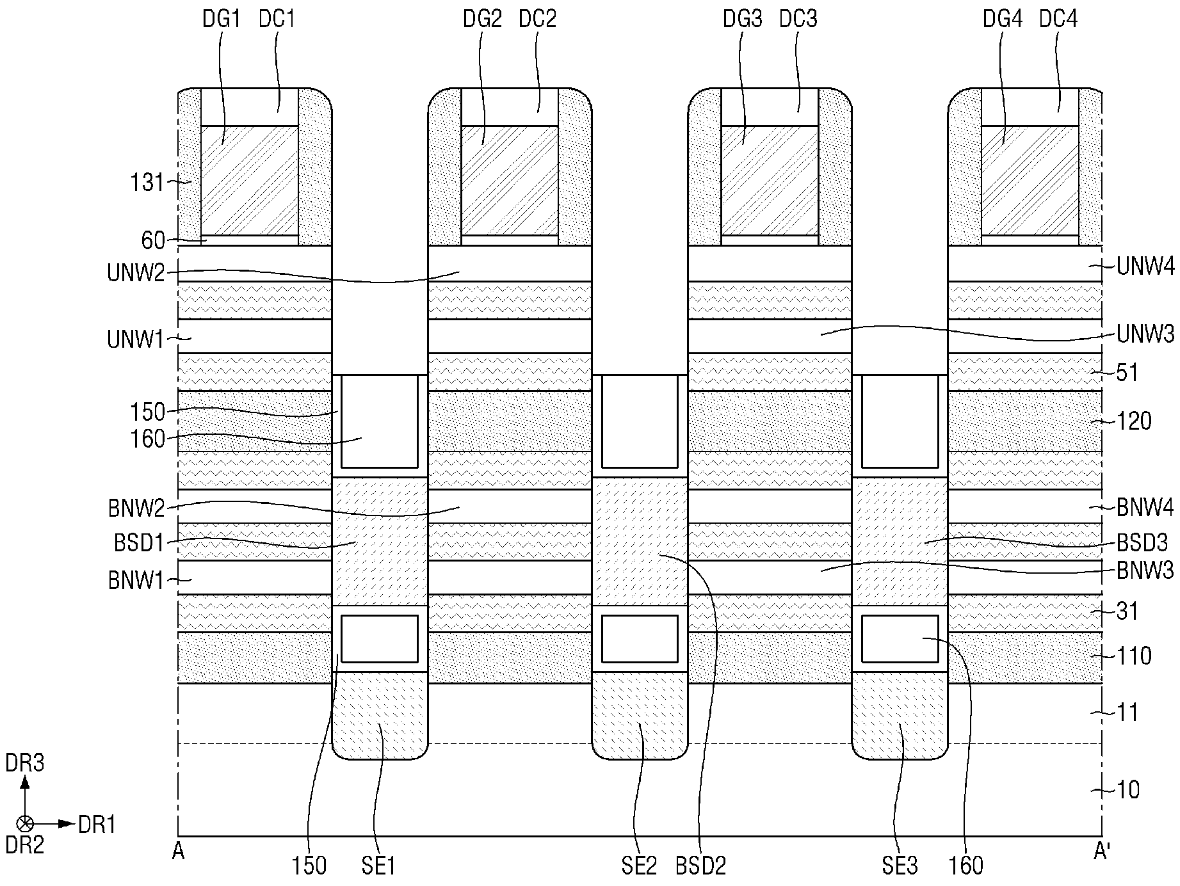
Figure 24:
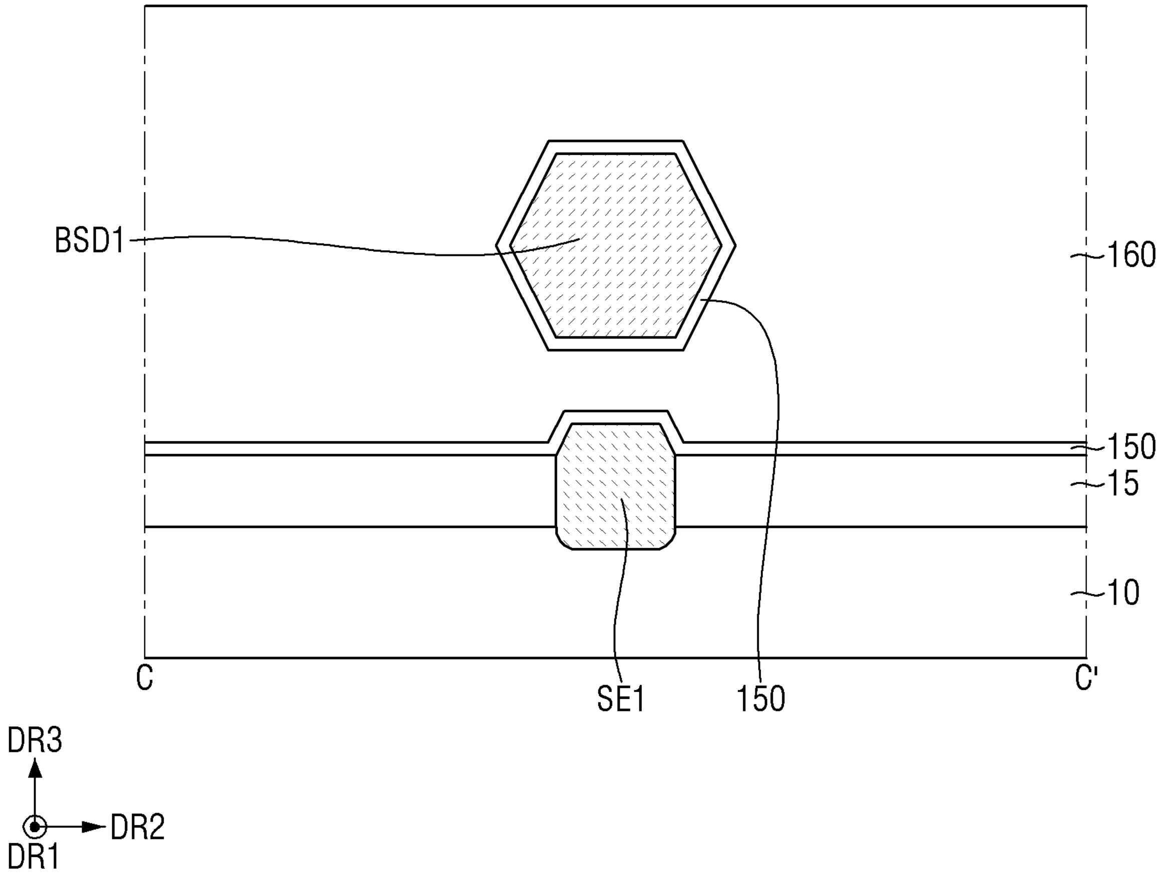

Referring to FIGS. 23 and 24, a portion of each of the third lower interlayer insulating layer 160 and the liner layer 150 may be etched. In an implementation, after the etching process is performed, the uppermost surface of each of the third lower interlayer insulating layer 160 and the liner layer 150 may be between the upper surface of the upper isolation layer 120 and the lower surface of the lowermost nanosheet of the first plurality of upper nanosheets UNW1.

Figure 25:
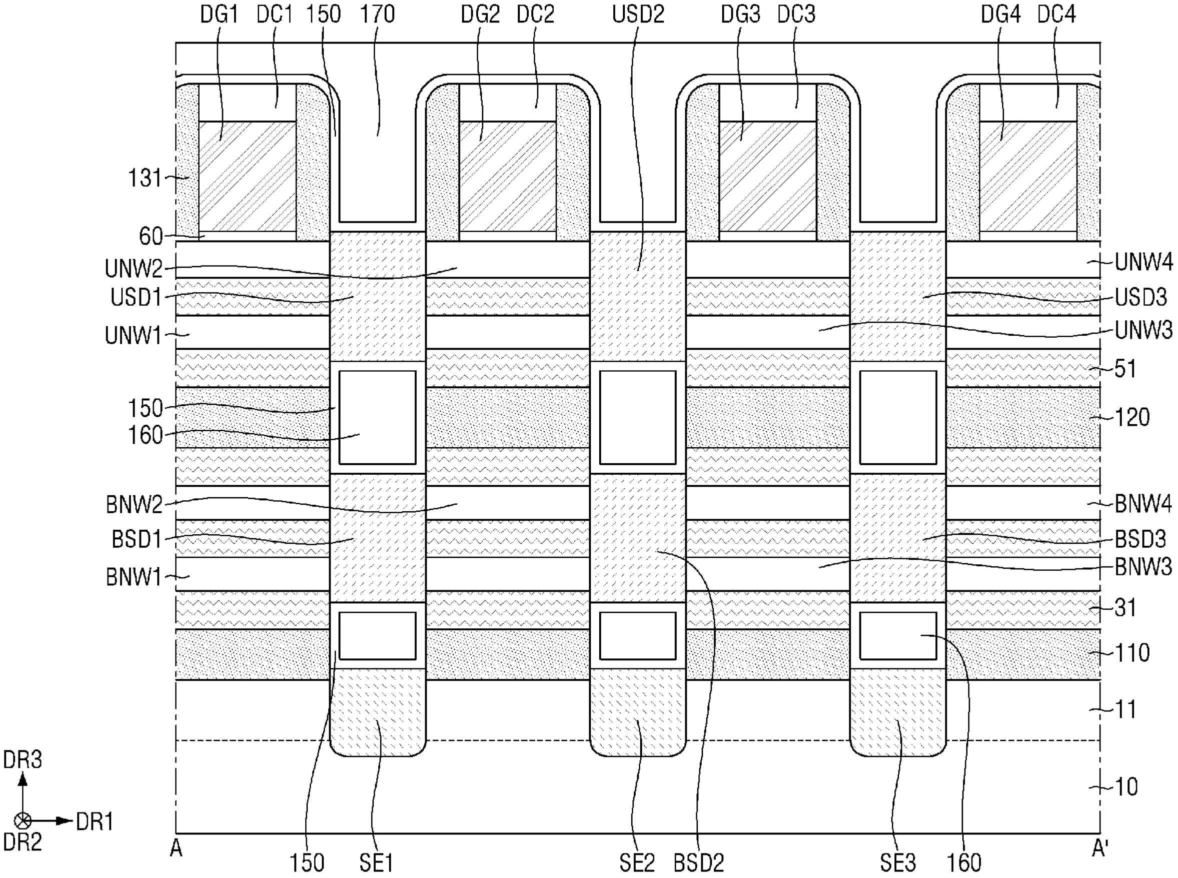
Figure 26:
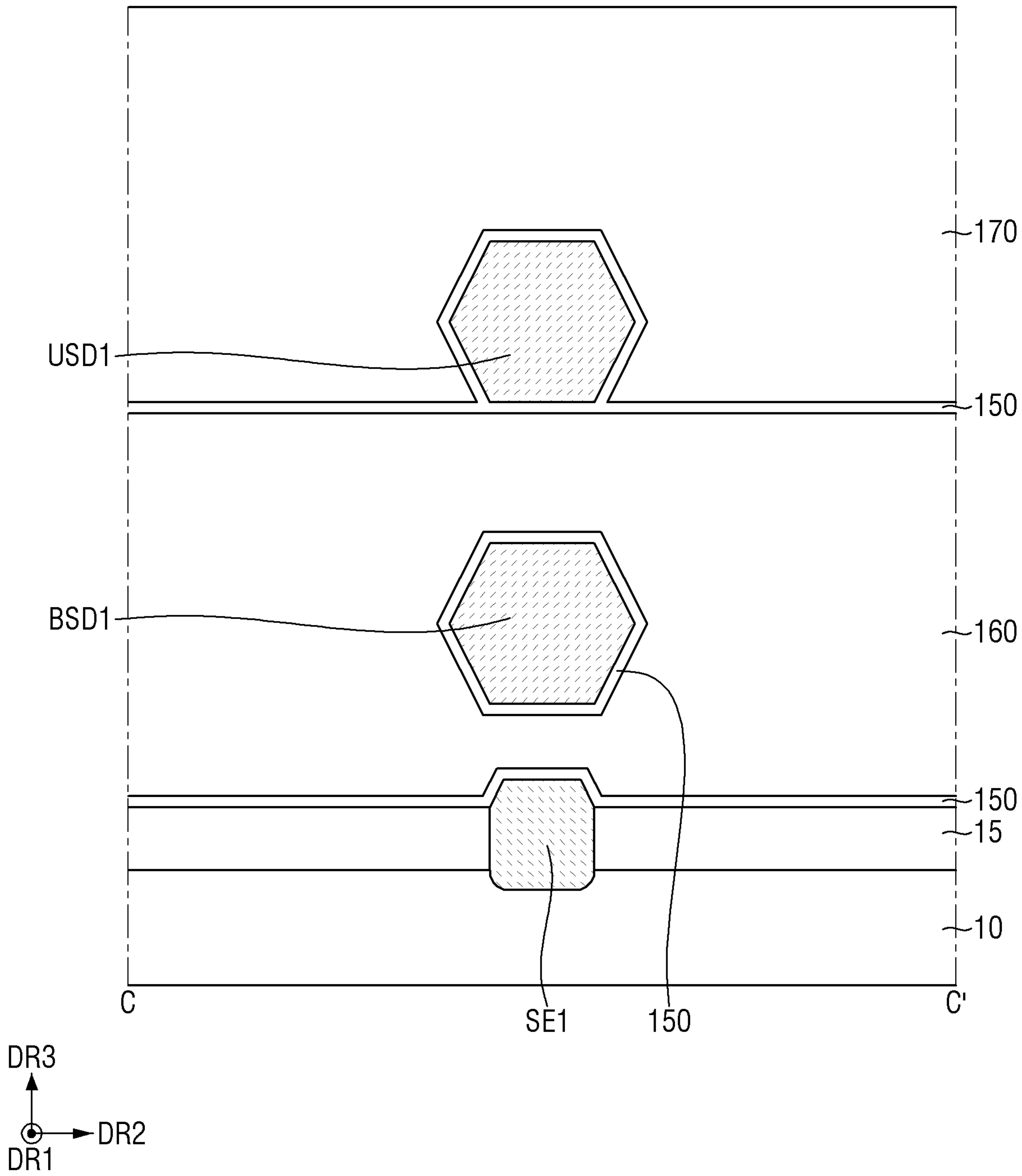

Referring to FIGS. 25 and 26, the first upper source/drain region USD1 may be formed between the first plurality of upper nanosheets UNW1 and the second plurality of upper nanosheets UNW2. The second upper source/drain region USD2 may be formed between the second plurality of upper nanosheets UNW2 and the third plurality of upper nanosheets UNW3. The third upper source/drain region USD3 may be formed between the third plurality of upper nanosheets UNW3 and the fourth plurality of upper nanosheets UNW4. In an implementation, each of the first to third upper source/drain regions USD1, USD2 and USD3 may be epitaxially grown from each of the first to fourth plurality of upper nanosheets UNW1, UNW2, UNW3 and UNW4.

Then, the liner layer 150 may be formed along the exposed surface of each of the third lower interlayer insulating layer 160, the first to third upper source/drain regions USD1, USD2 and USD3, the second sacrificial layer 51, the gate spacer 131 and the first to fourth dummy capping patterns DC1, DC2, DC3 and DC4. Subsequently, the first upper interlayer insulating layer 170 may be formed on the liner layer 150. In an implementation, the upper surface of the first upper interlayer insulating layer 170 may be higher than the upper surface of each of the first to fourth dummy capping patterns DC1, DC2, DC3 and DC4.

Figure 27:
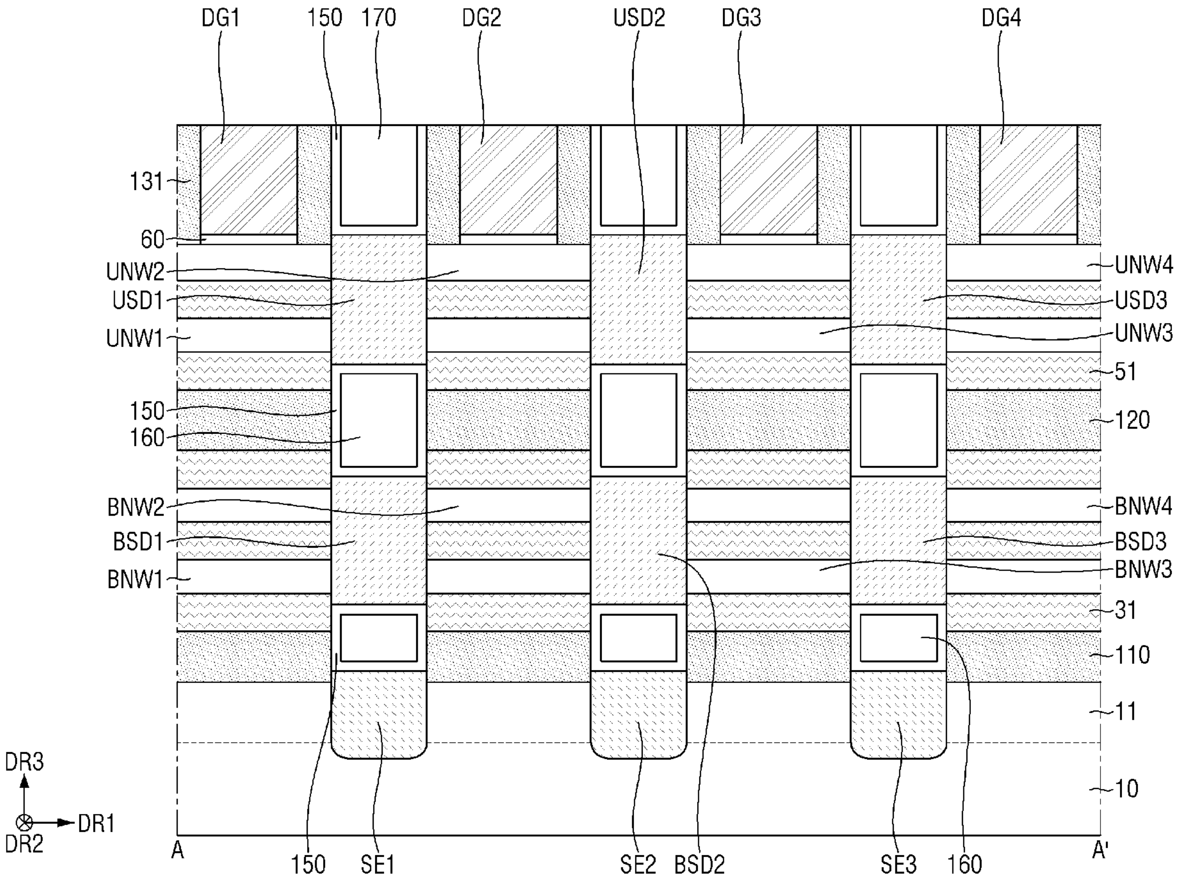
Figure 28:
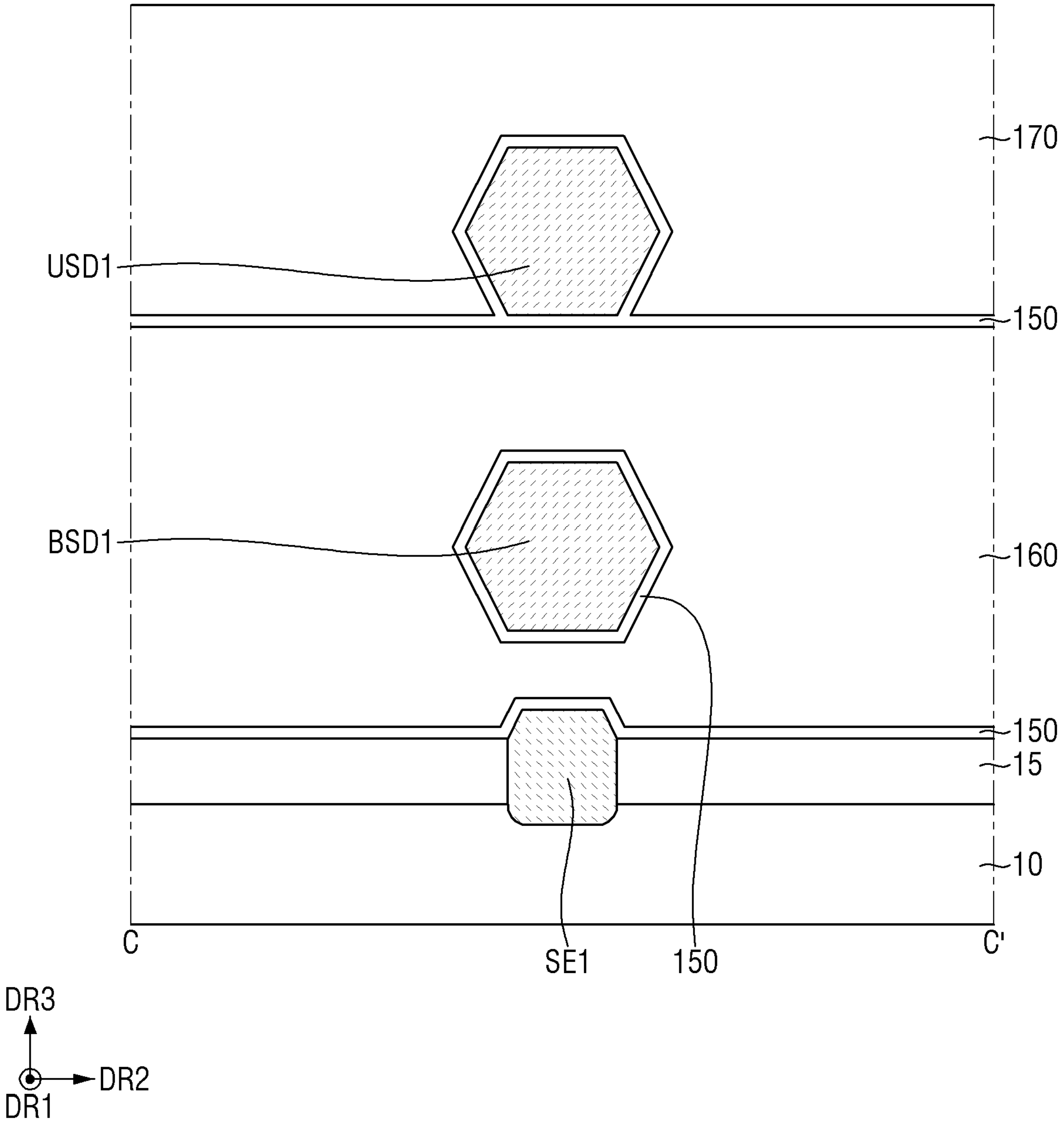

Referring to FIGS. 27 and 28, the upper surface of each of the first to fourth dummy gates DG1, DG2, DG3 and DG4 may be exposed through a planarization process.

Figure 29:
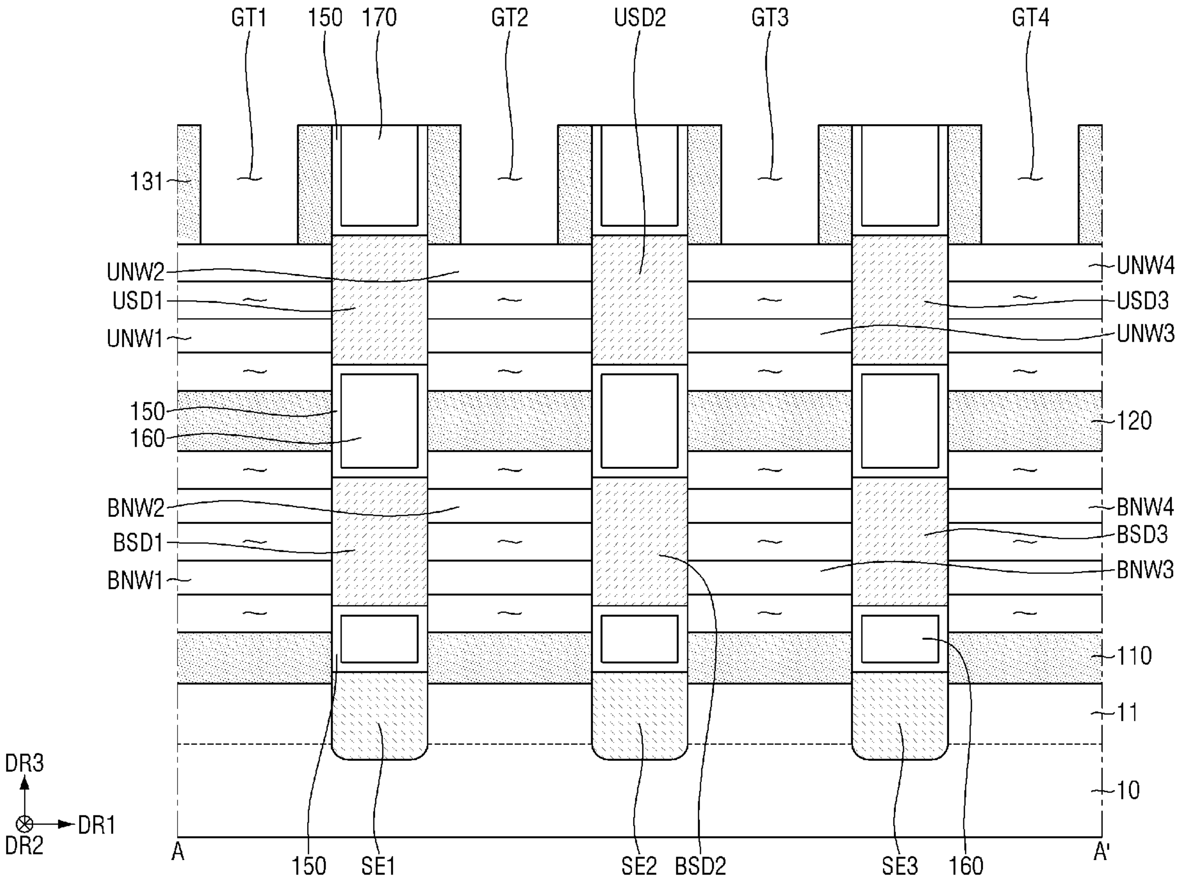
Figure 30:
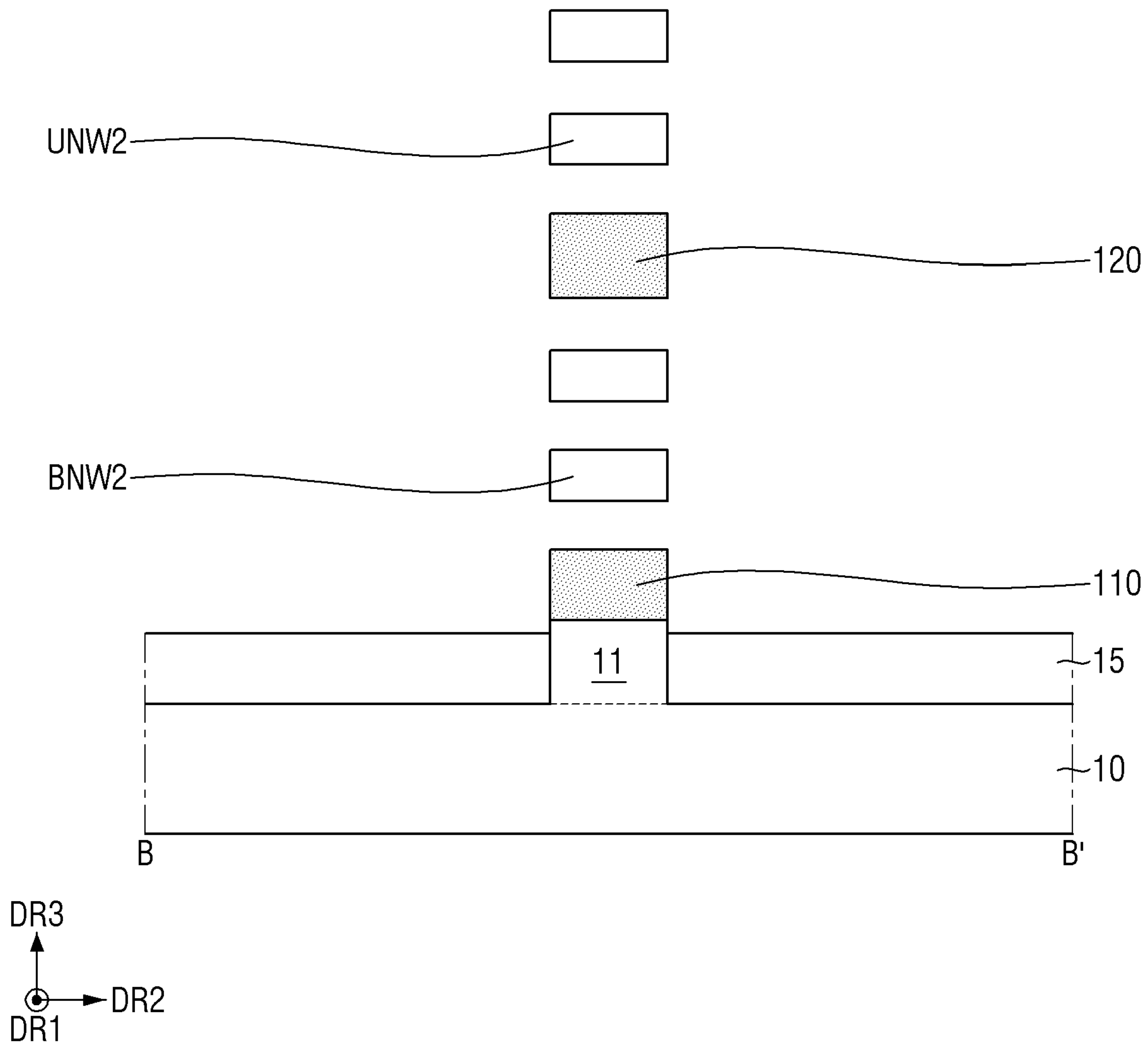

Referring to FIGS. 29 and 30, each of the first to fourth dummy gates DG1, DG2, DG3 and DG4, the pad oxide layer (60 in FIG. 27), the first sacrificial layer (31 in FIG. 27) and the second sacrificial layer (51 in FIG. 27) may be etched. In an implementation, the etched portions of the first to fourth dummy gates DG1, DG2, DG3 and DG4 may be defined as first to fourth gate trenches GT1, GT2, GT3 and GT4.

Figure 31:
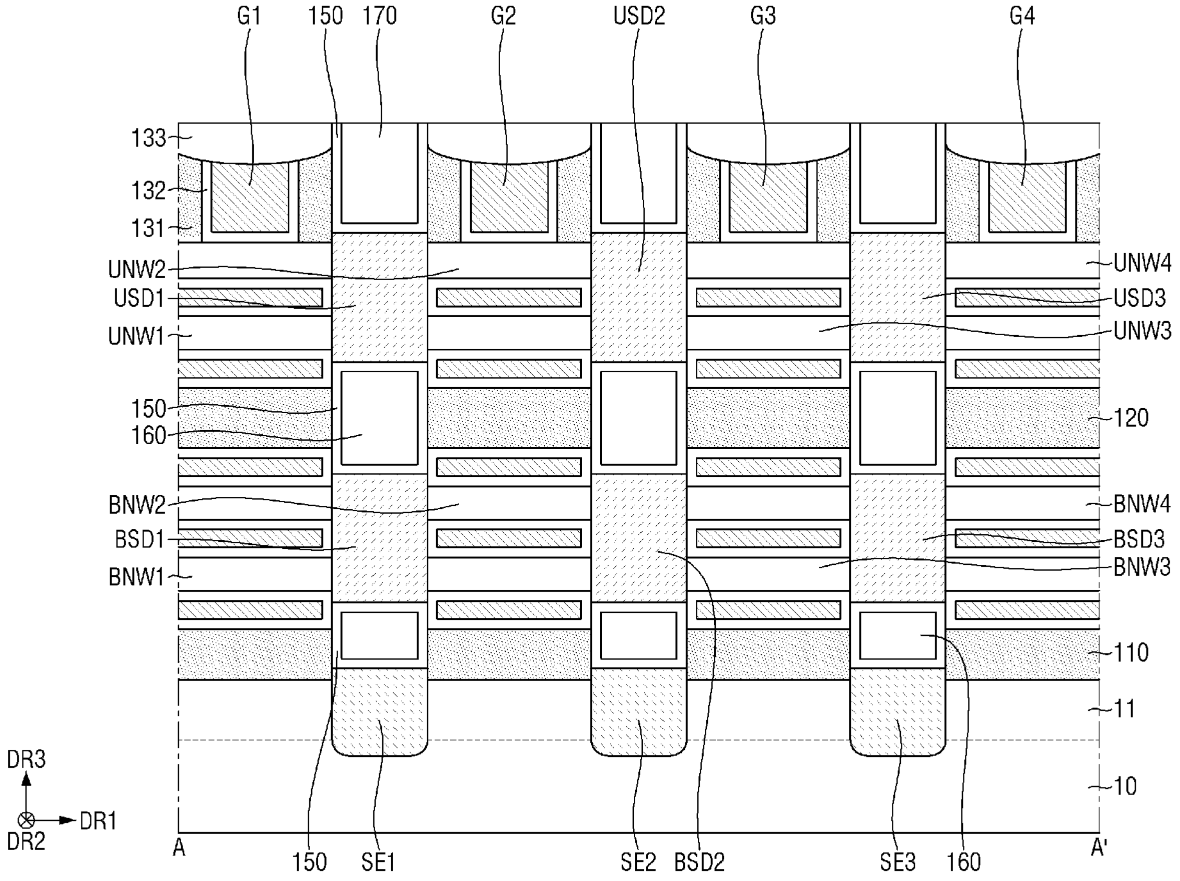
Figure 32:
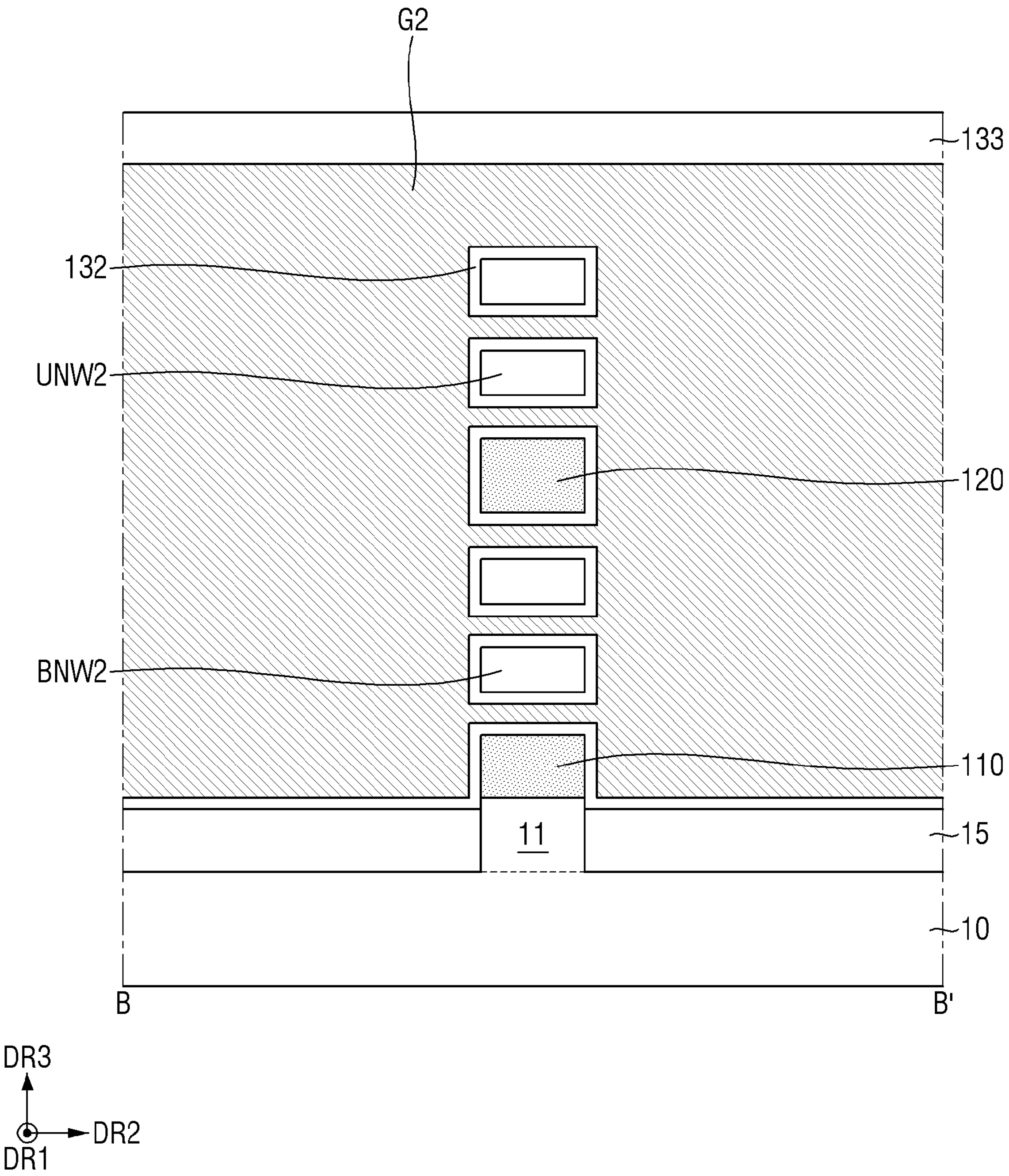

Referring to FIGS. 31 and 32, the gate insulating layer 132, the first gate electrode G1 and the capping pattern 133 may be sequentially formed inside the first gate trench GT1. The gate insulating layer 132, the second gate electrode G2 and the capping pattern 133 may be sequentially formed inside the second gate trench GT2. The gate insulating layer 132, the third gate electrode G3 and the capping pattern 133 may be sequentially formed inside the third gate trench GT3. The gate insulating layer 132, the fourth gate electrode G4 and the capping pattern 133 may be sequentially formed inside the fourth gate trench GT4.

Figure 33:
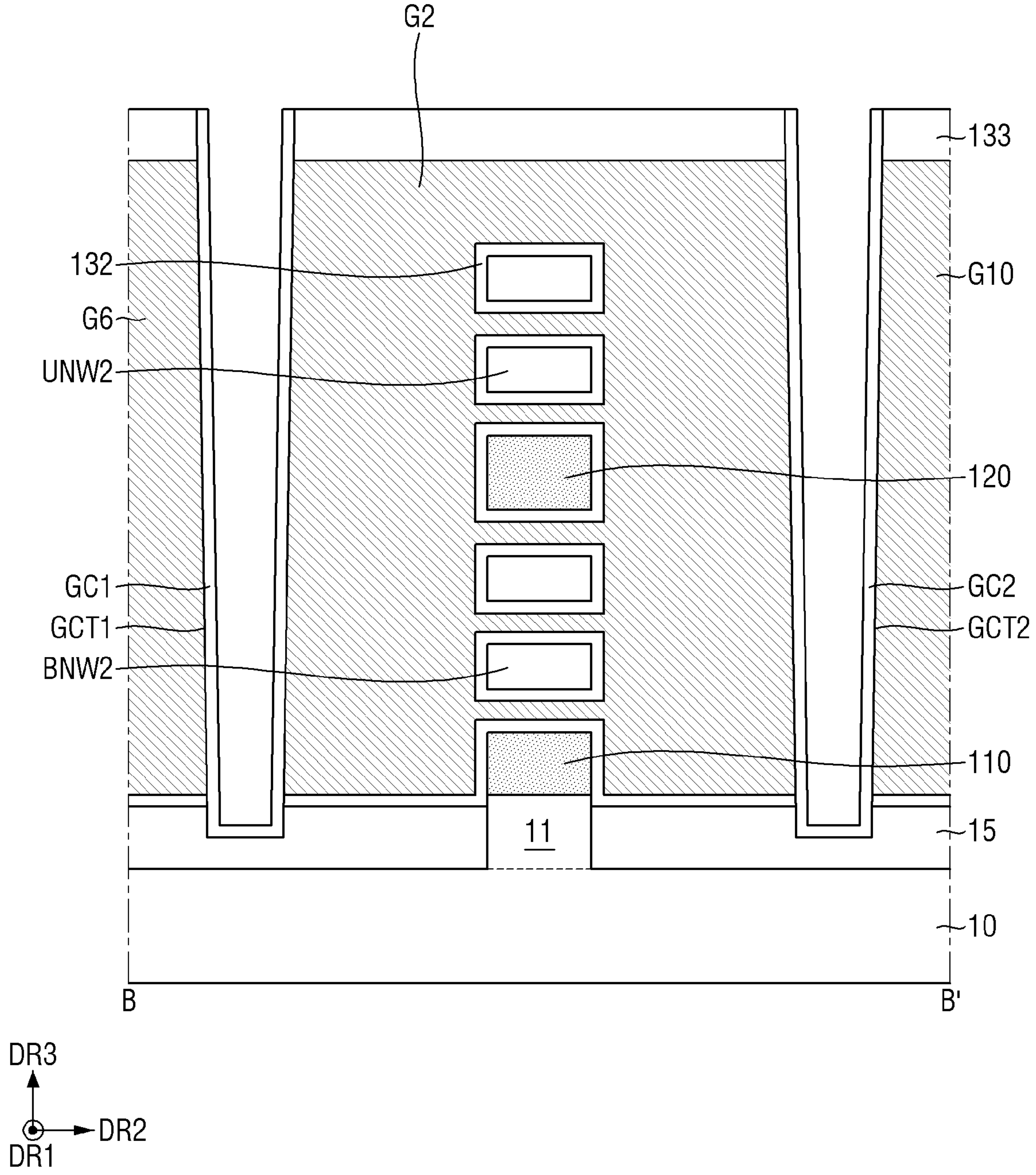
Figure 34:
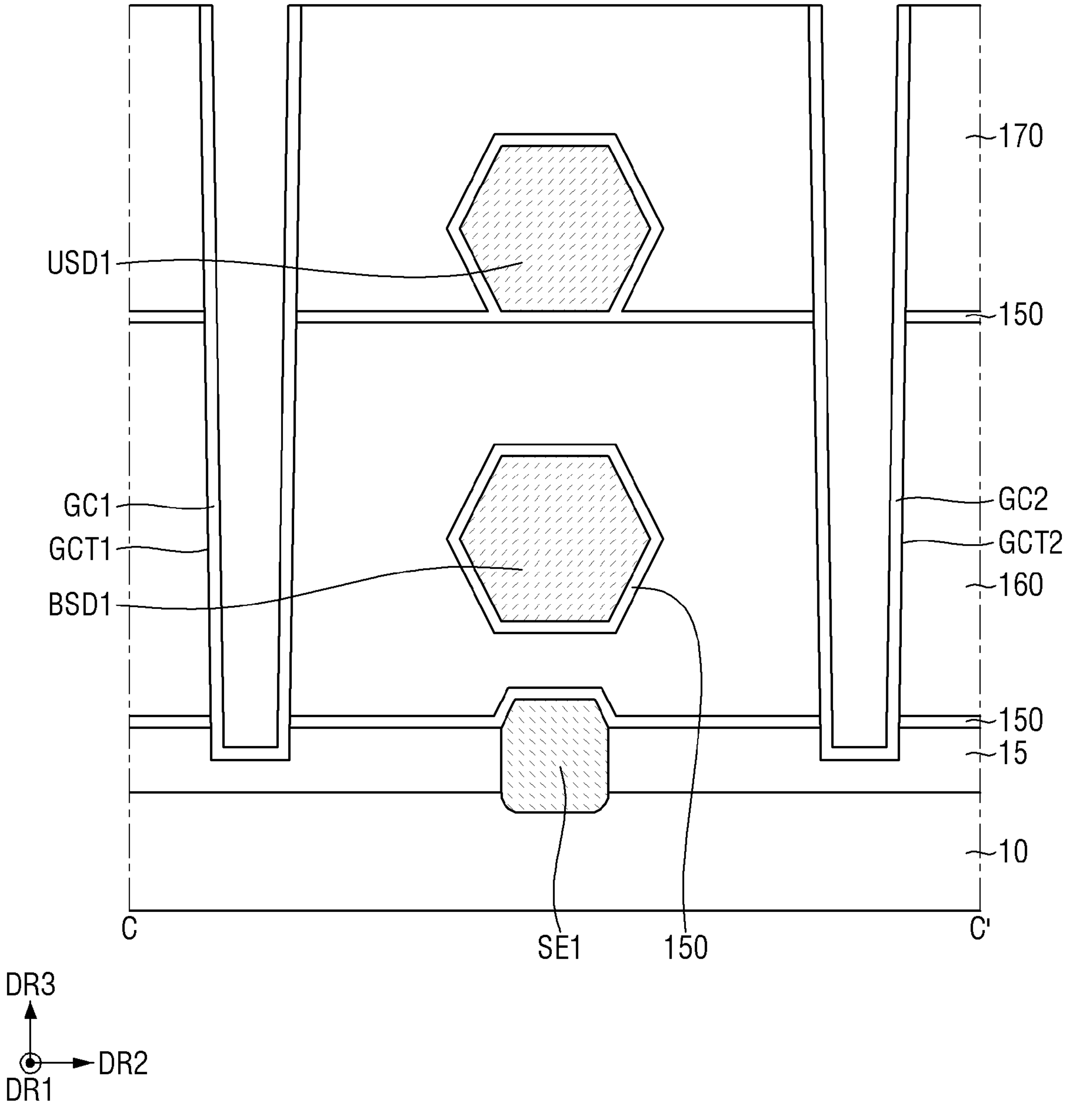

Referring to FIGS. 33 and 34, a first gate cut trench GCT1 and a second gate cut trench GCT2, which pass through each of the capping pattern 133, the first to fourth gate electrodes G1, G2, G3 and G4, the first upper interlayer insulating layer 170, the liner layer 150, and the third lower interlayer insulating layer 160 in the vertical direction DR3, may be formed. Each of the first gate cut trench GCT1 and the second gate cut trench GCT2 may extend in the first horizontal direction DR1. In an implementation, each of the first gate cut trench GCT1 and the second gate cut trench GCT2 may extend into the field insulating layer 15. The second gate cut trench GCT2 may be spaced apart from the first gate cut trench GCT1 in the second horizontal direction DR2.

In an implementation, each of the lower isolation layer 110, the first to fourth plurality of lower nanosheets BNW1, BNW2, BNW3 and BNW4, the upper isolation layer 120, and the first to fourth plurality of upper nanosheets UNW1, UNW2, UNW3 and UNW4 may be positioned between the first gate cut trench GCT1 and the second gate cut trench GCT2. In an implementation, the second gate electrode G2 may be divided into the sixth gate electrode G6, the second gate electrode G2, and the tenth gate electrode G10 by the first gate cut trench GCT1 and the second gate cut trench GCT2.

Then, the first gate cut GC1 may be formed along sidewalls and a bottom surface of the first gate cut trench GCT1. The second gate cut GC2 may be formed along sidewalls and a bottom surface of the second gate cut trench GCT2. In an implementation, each of the first gate cut GC1 and the second gate cut GC2 may be conformal.

Figure 35:
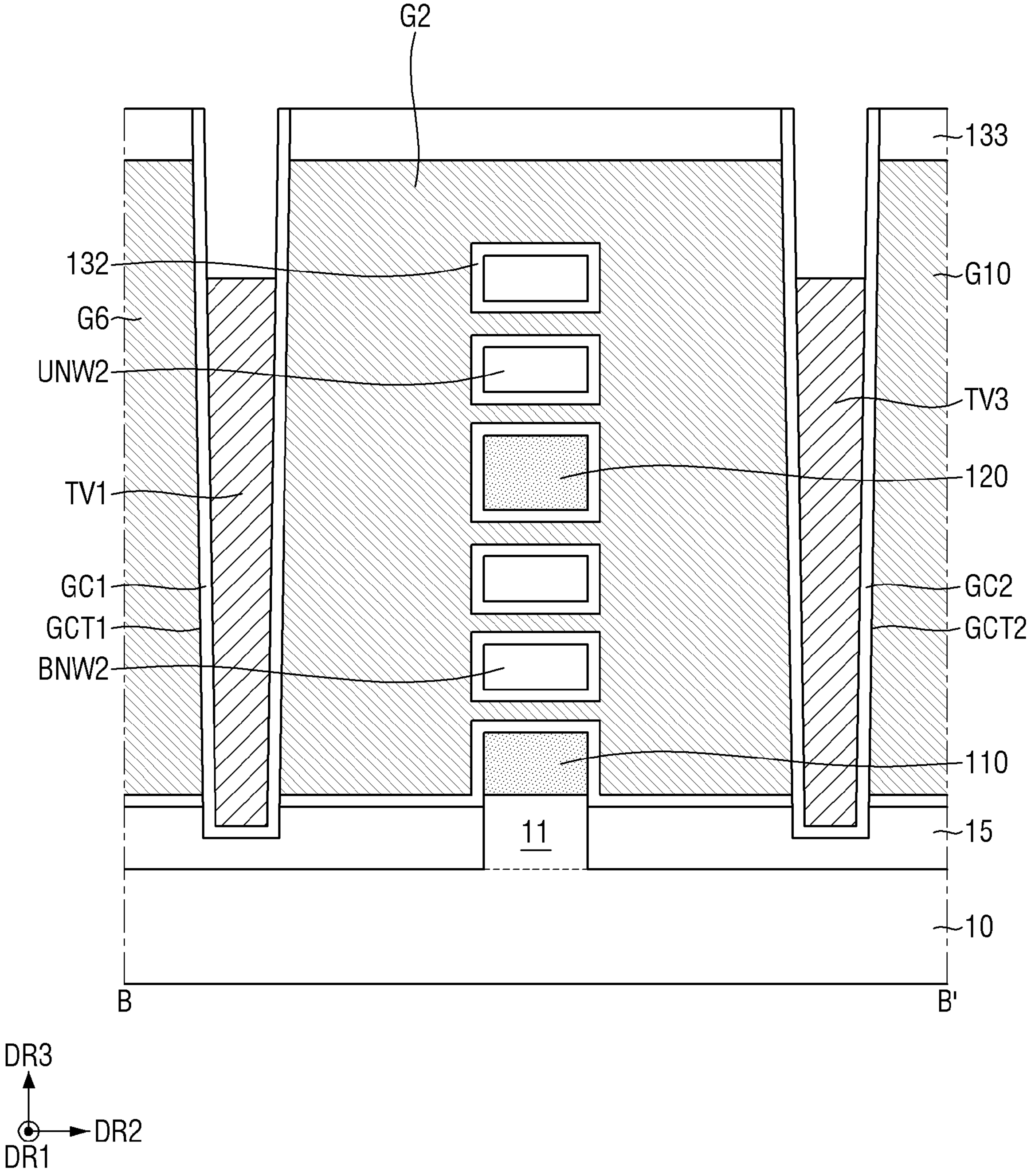
Figure 36:
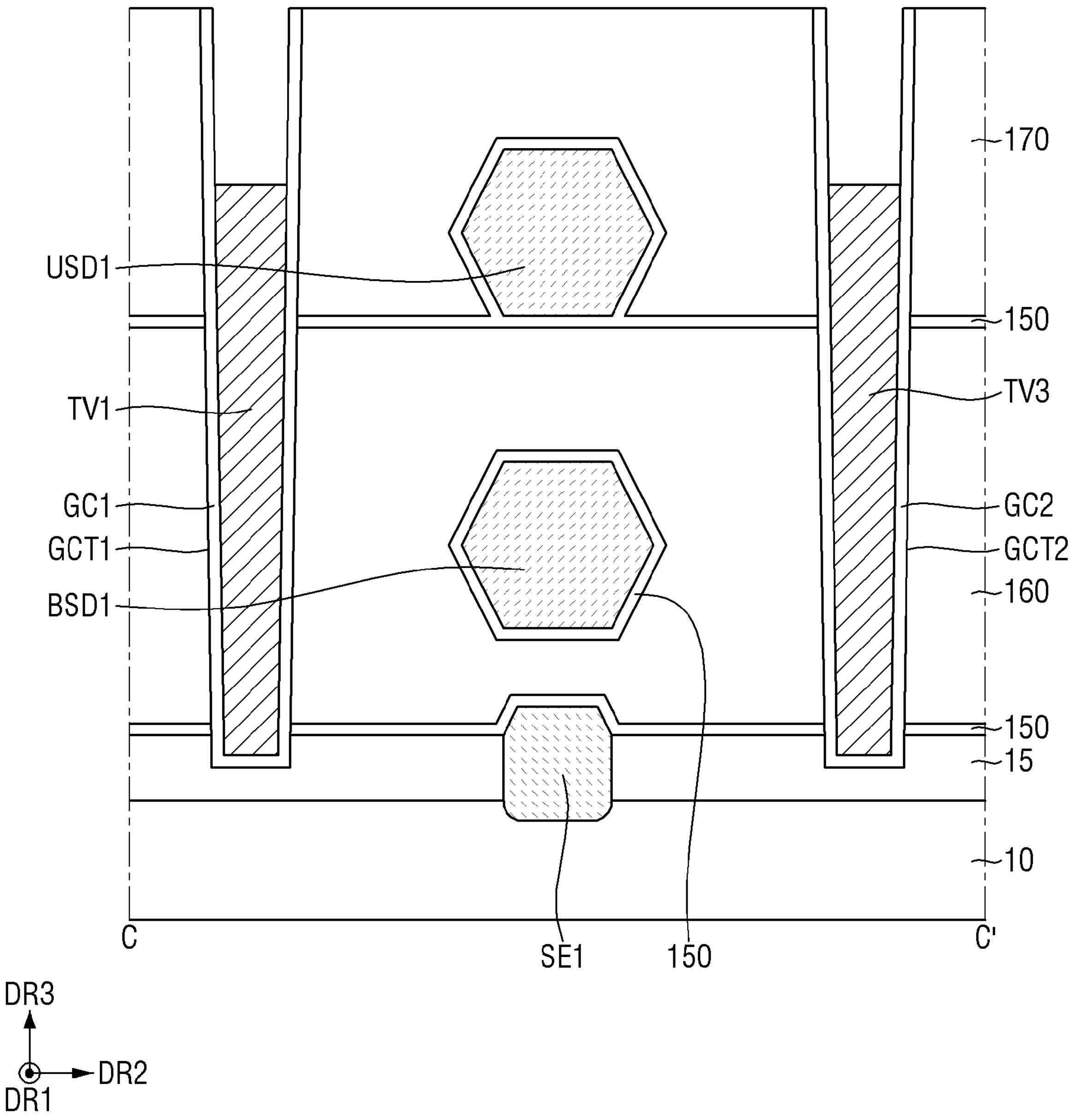

Referring to FIGS. 35 and 36, the first through via TV1 may be formed on the first gate cut GC1 inside the first gate cut trench GCT1. In an implementation, the third through via TV3 may be formed on the second gate cut GC2 inside the second gate cut trench GCT2. In an implementation, each of the first through via TV1 and the third through via TV3 may extend in the first horizontal direction DR1. In an implementation, the upper surface of each of the first through via TV1 and the third through via TV3 may be formed to be lower than the upper surface of the second gate electrode G2.

Figure 37:
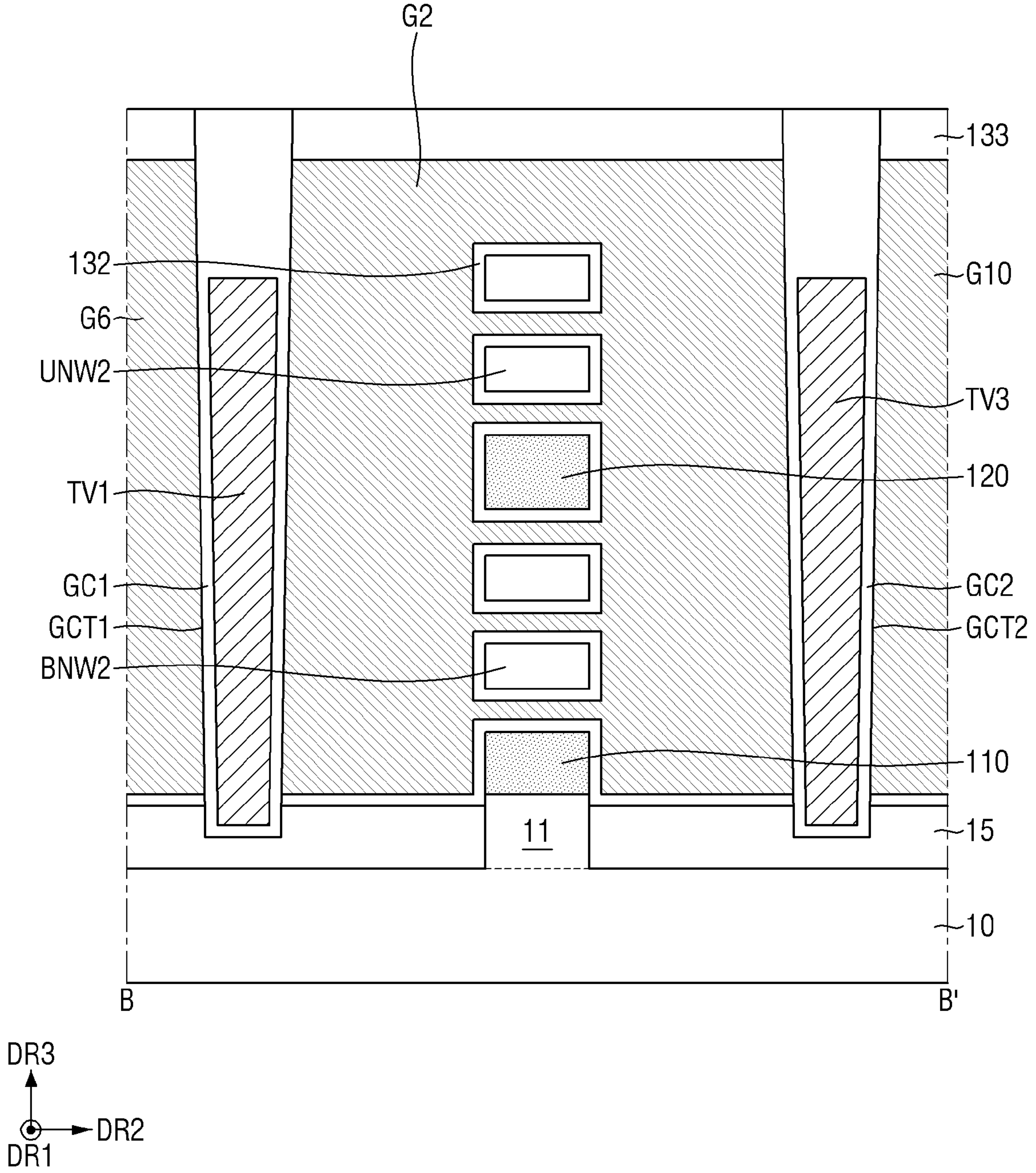
Figure 38:
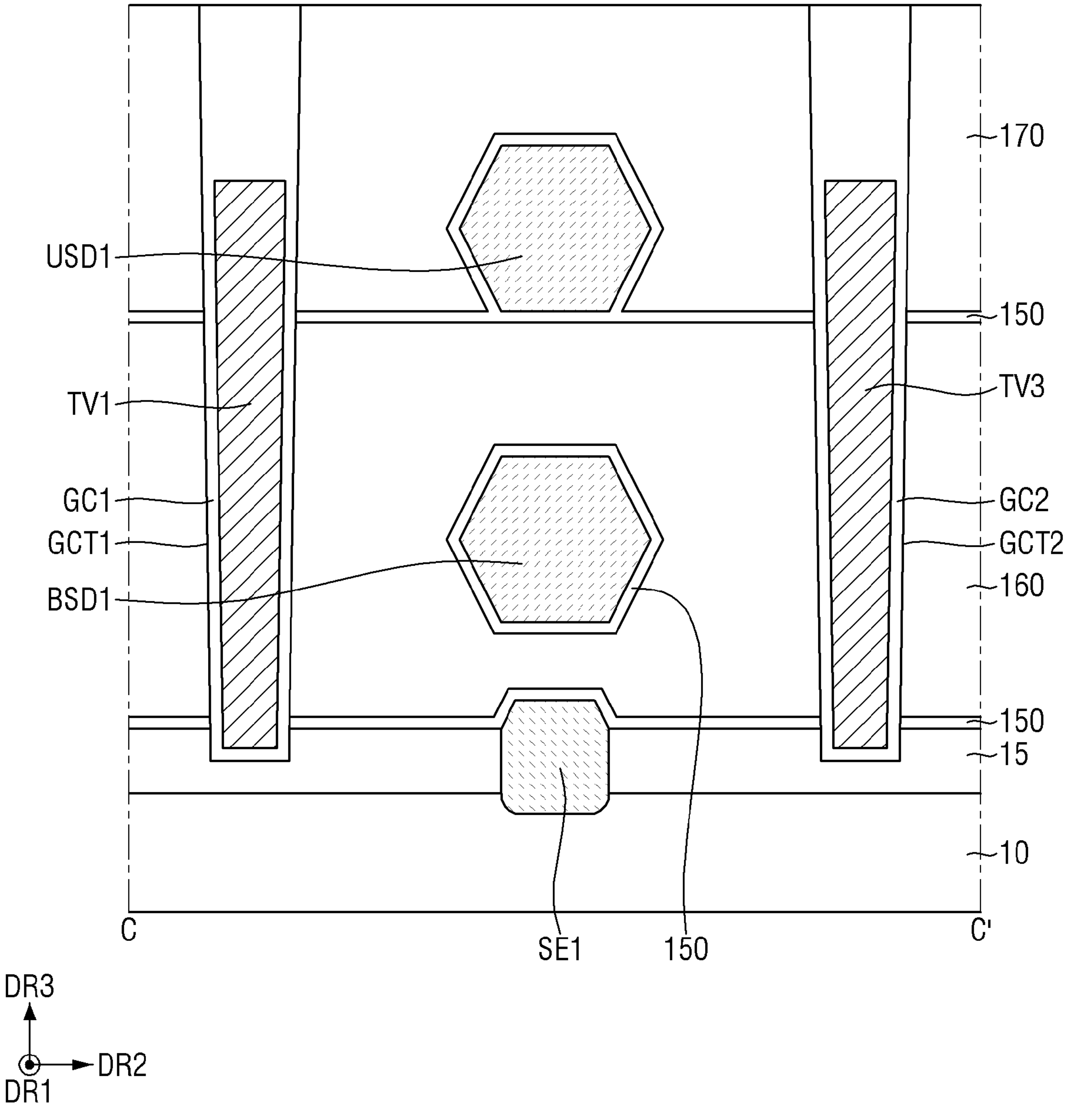
Figure 39:
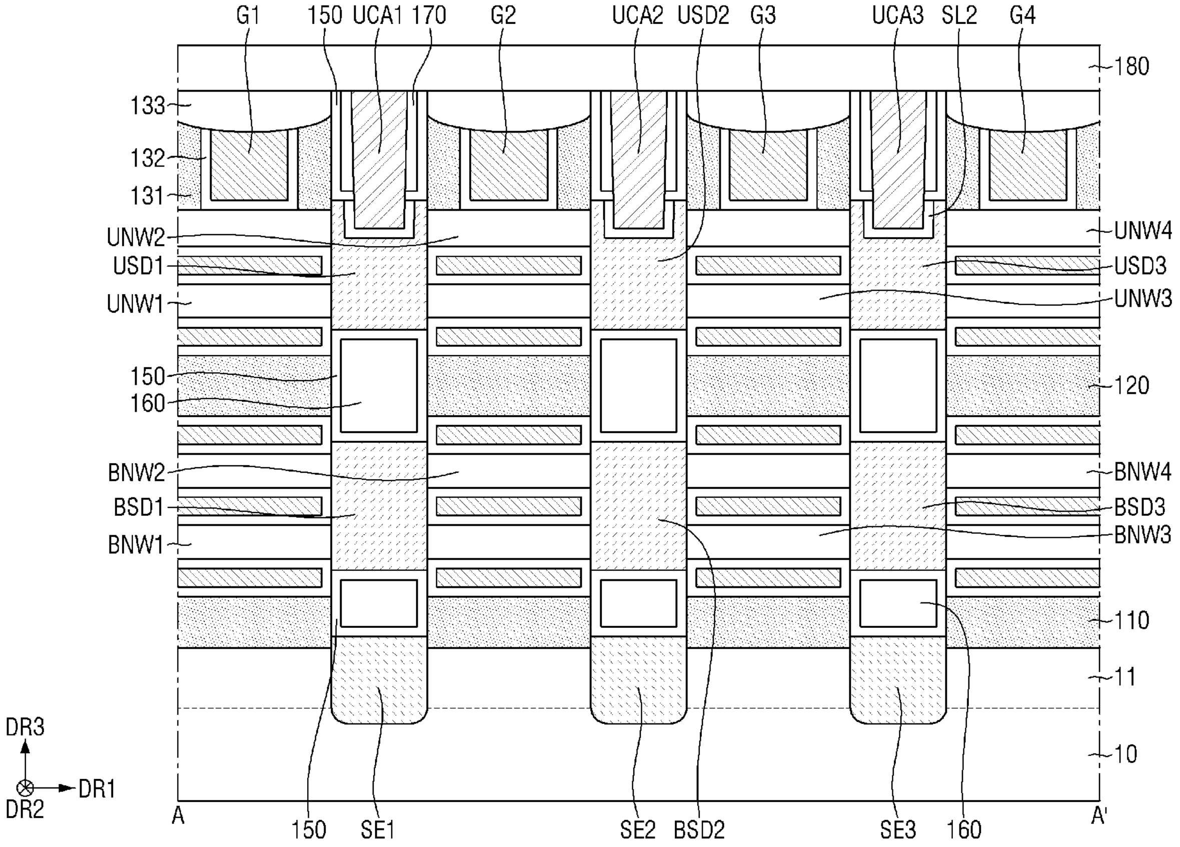
Figure 40:
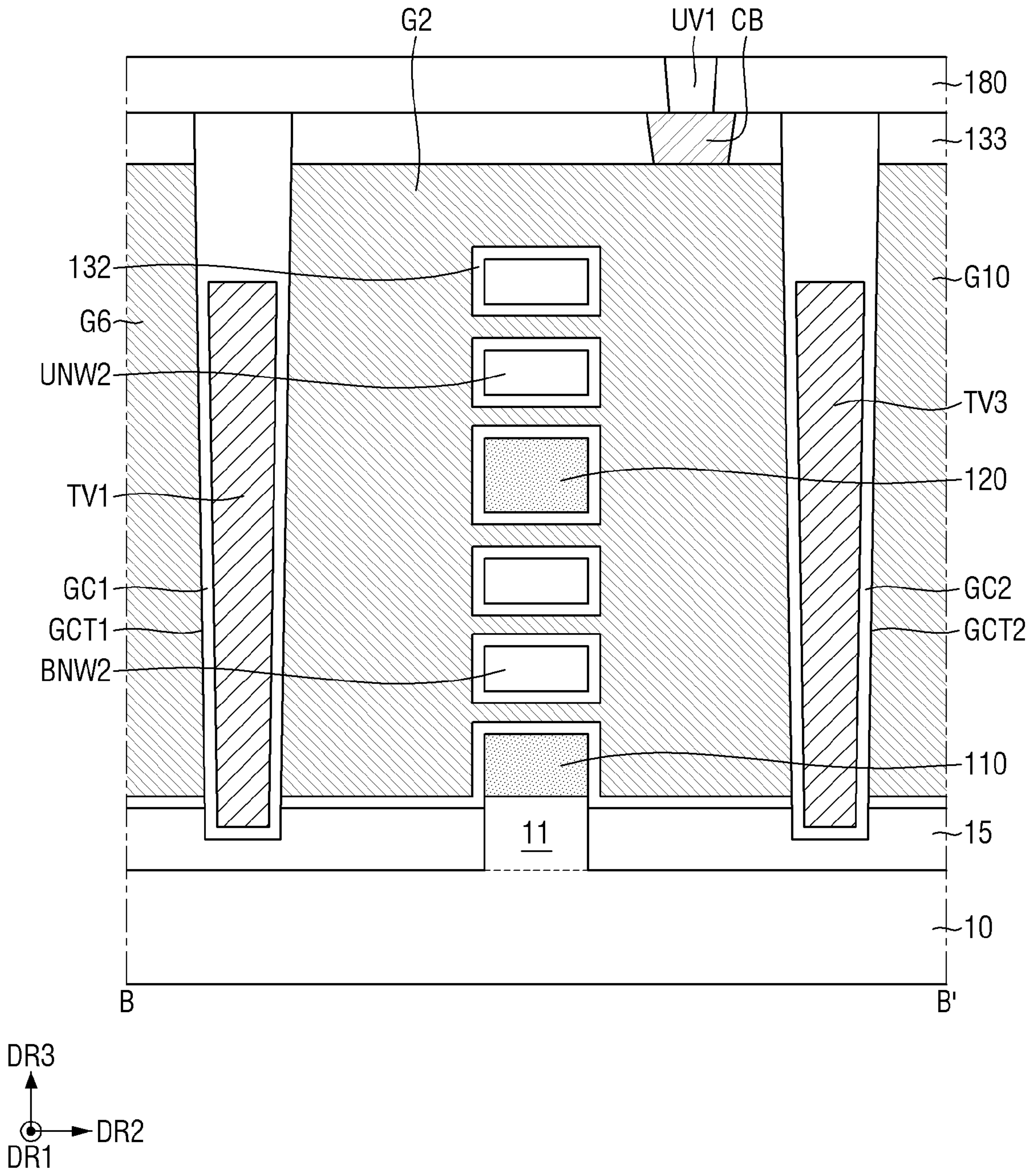
Figure 41:
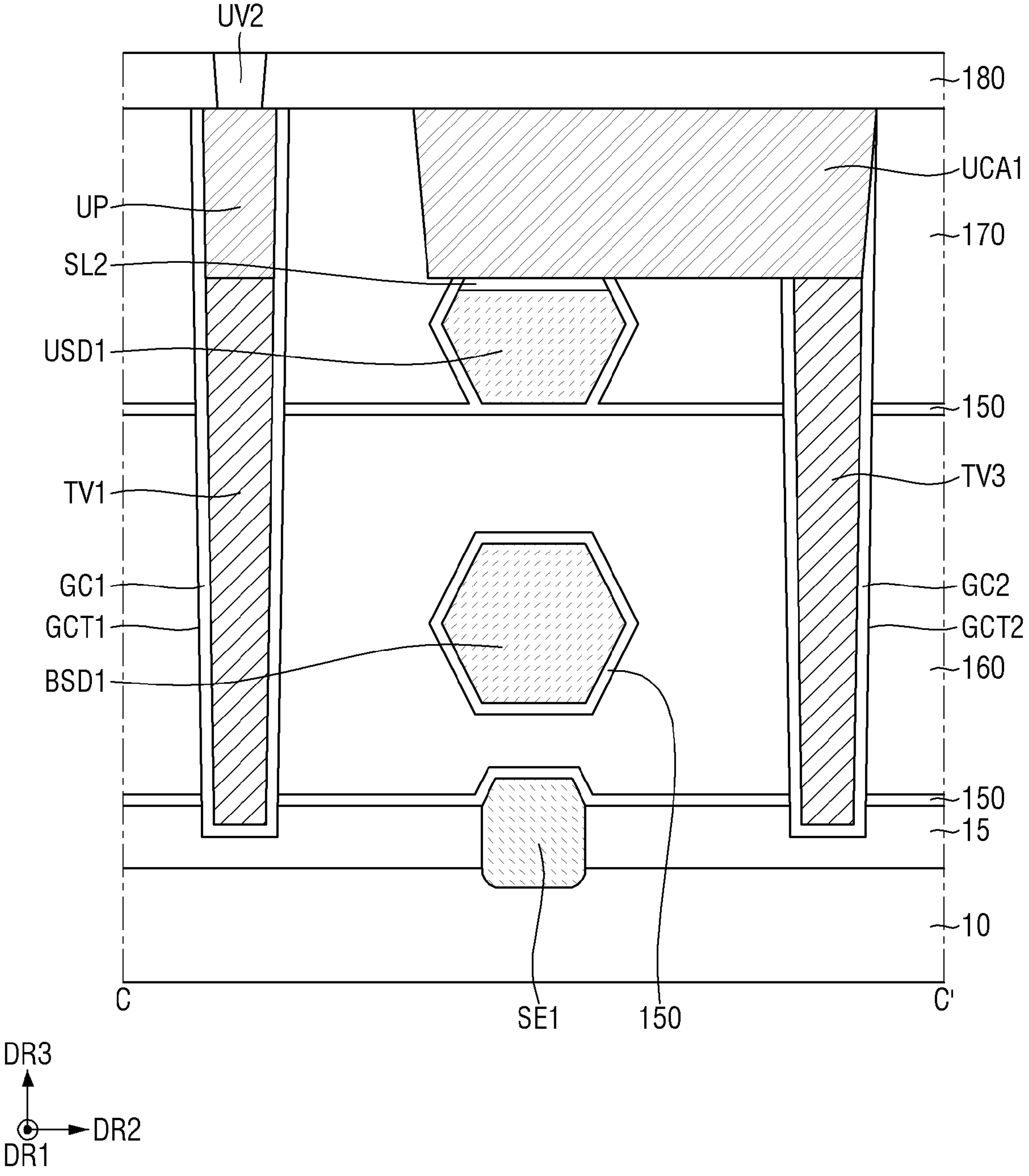
Figure 42:
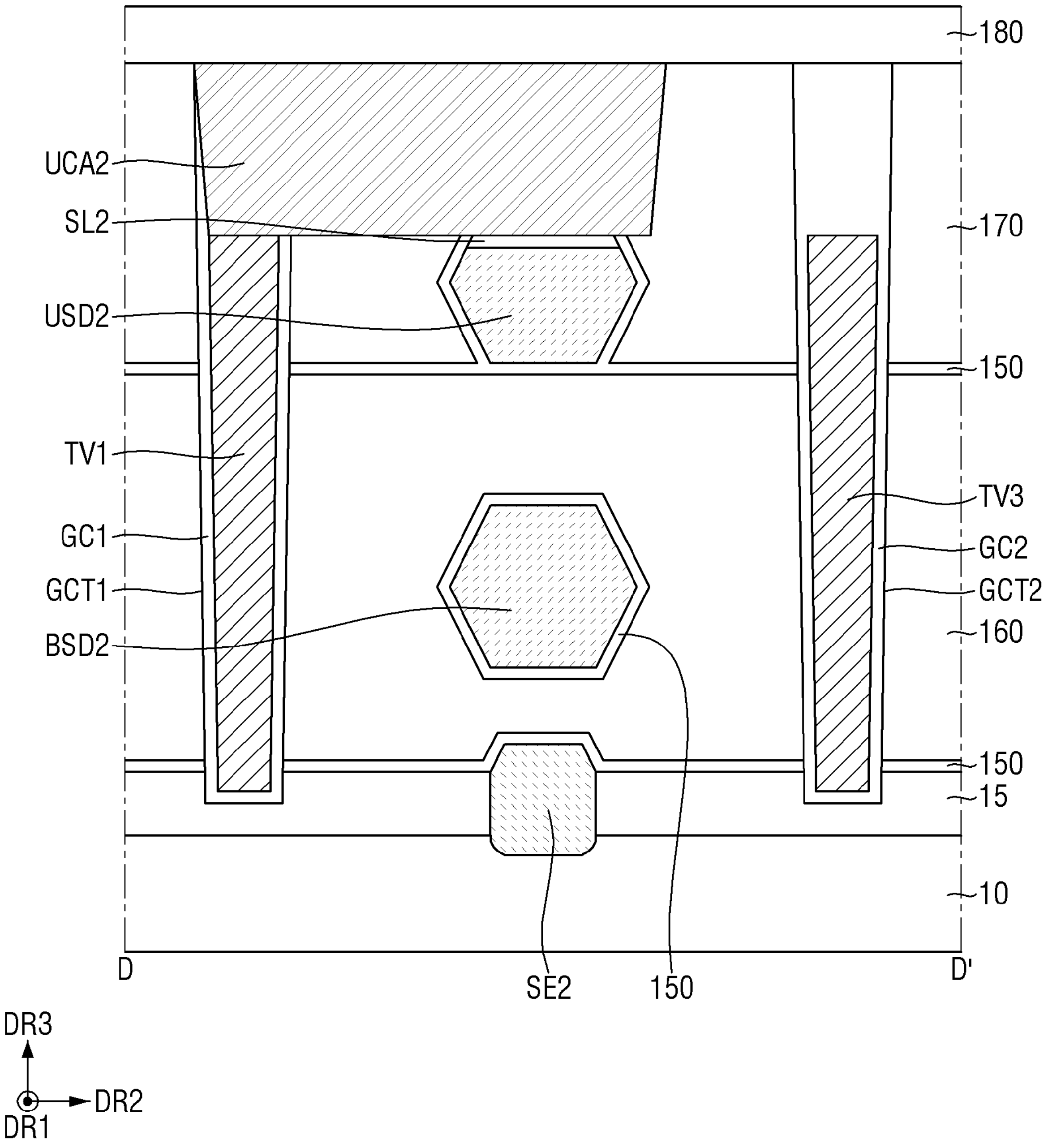
Figure 43:
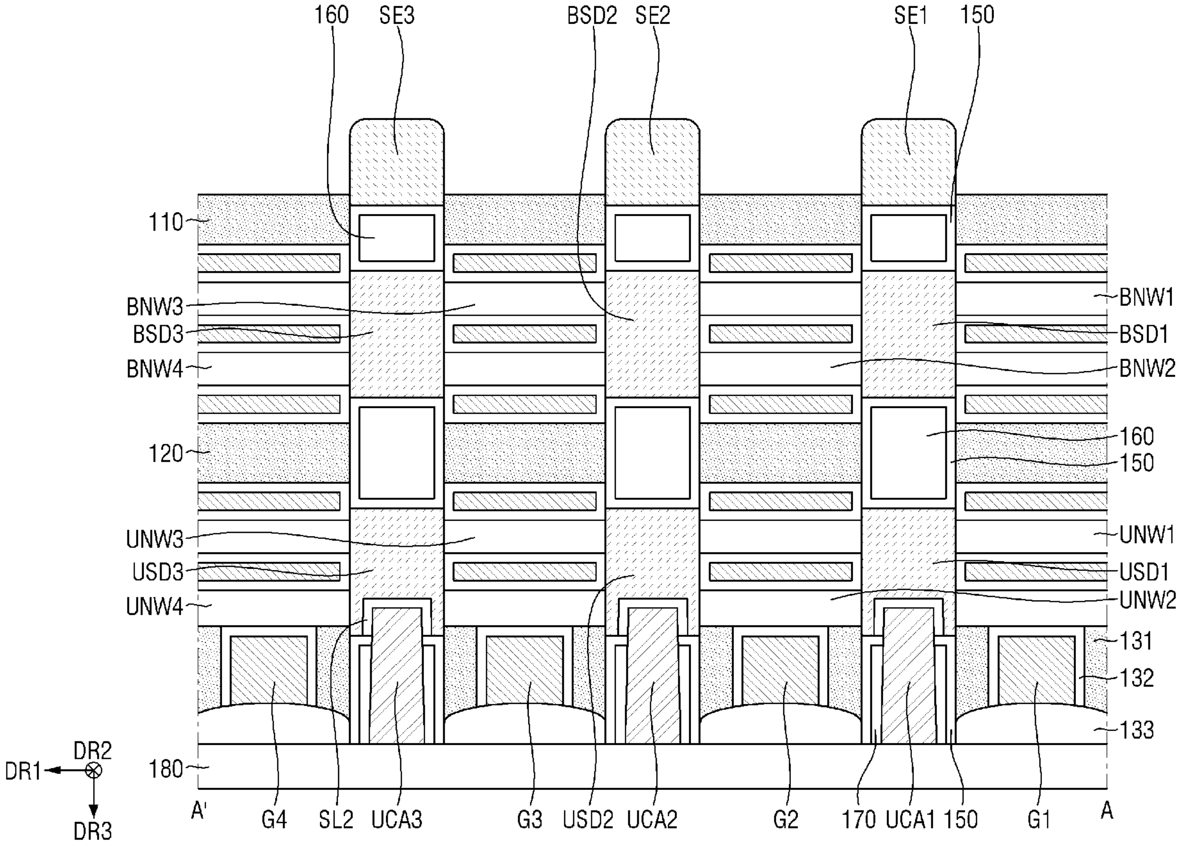
Figure 44:
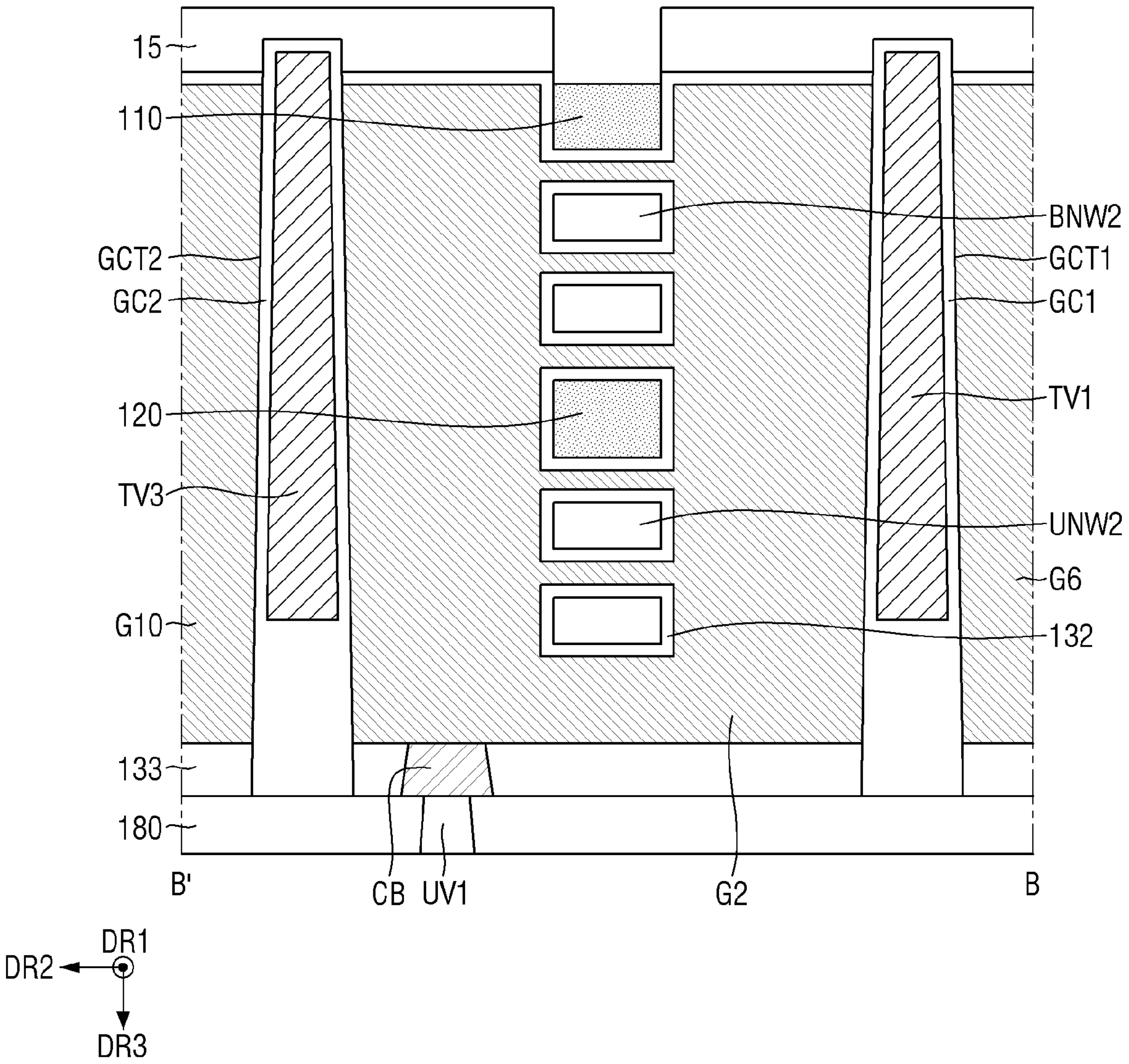
Figure 45:
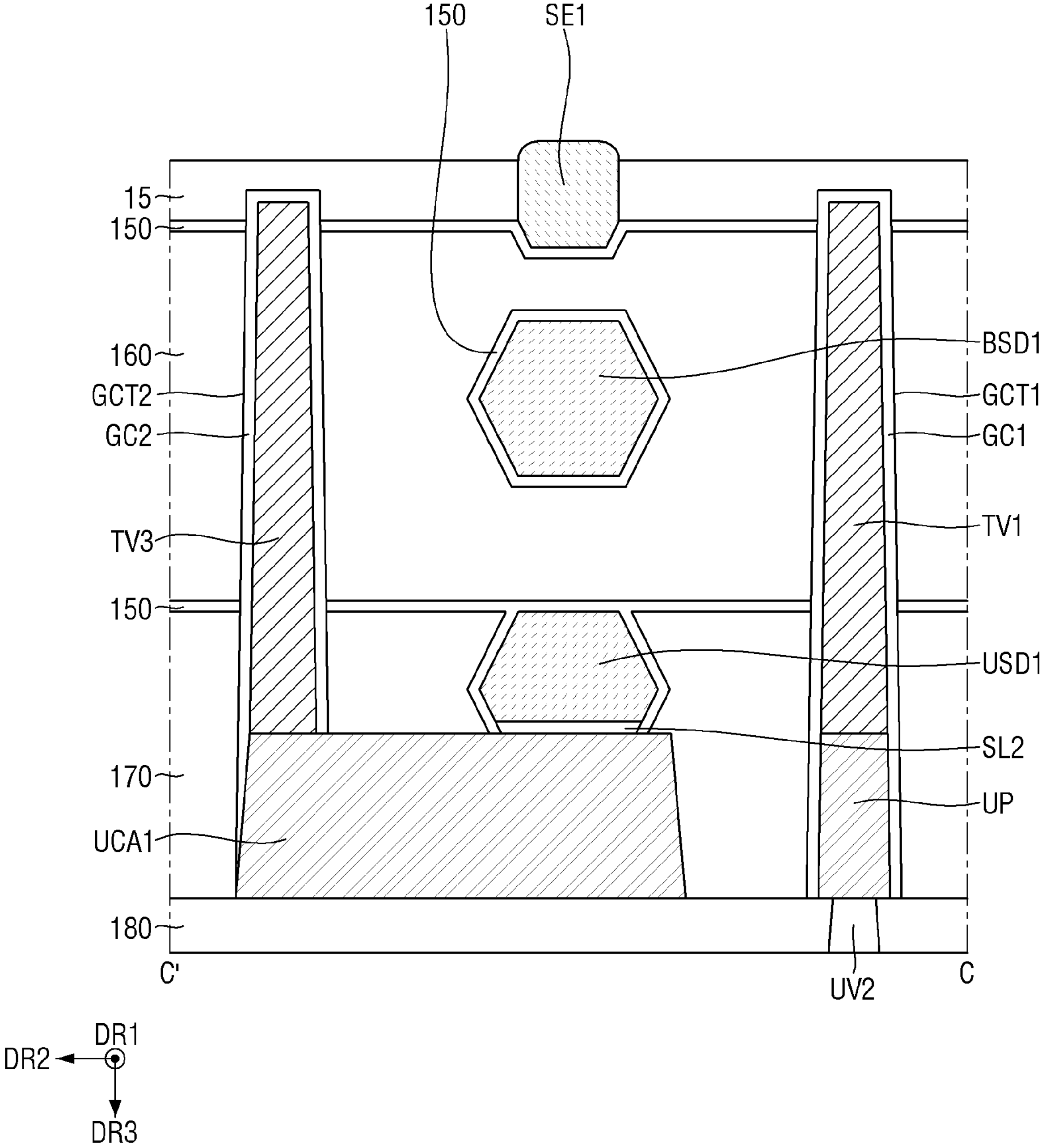
Figure 46:
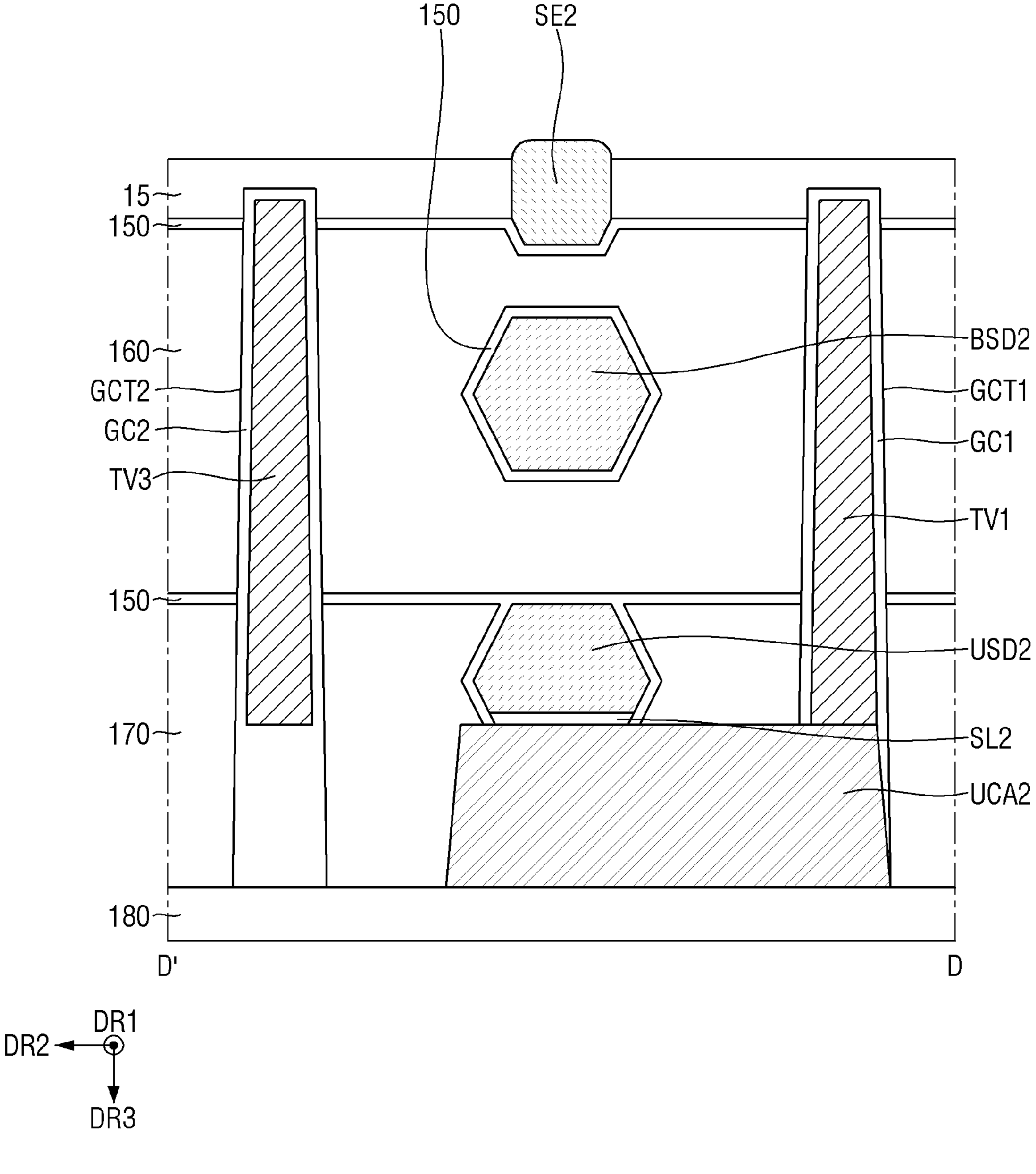
Figure 47:
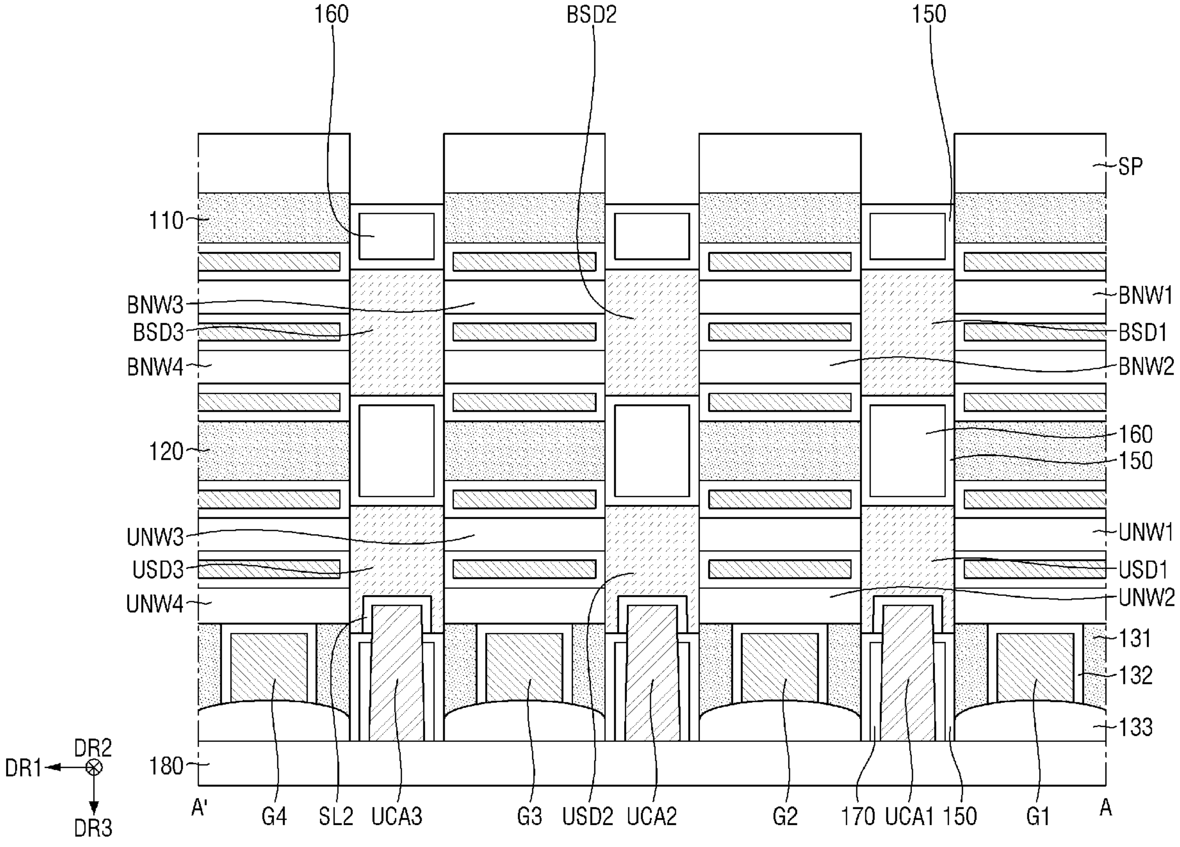
Figure 48:
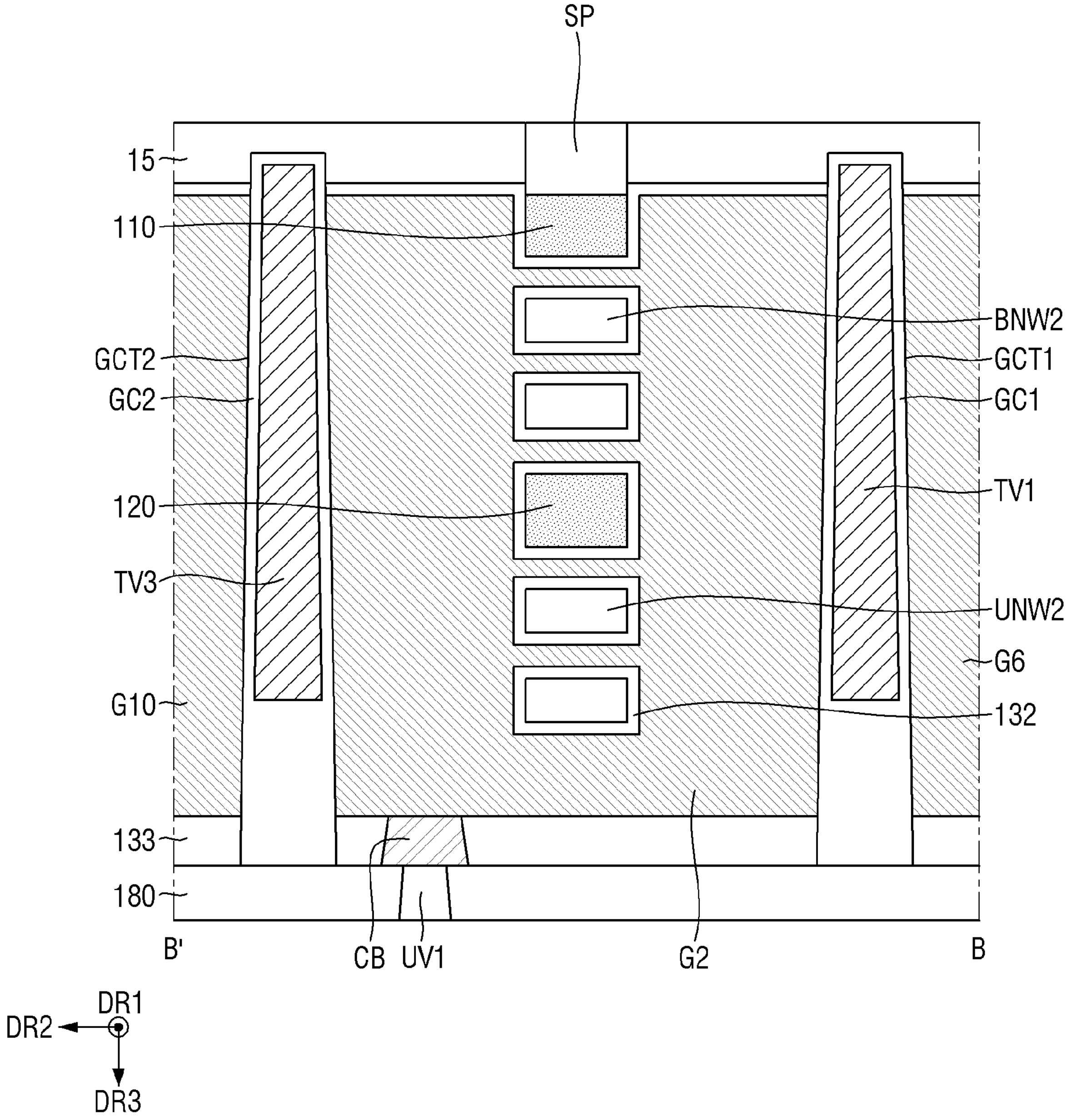
Figure 49:
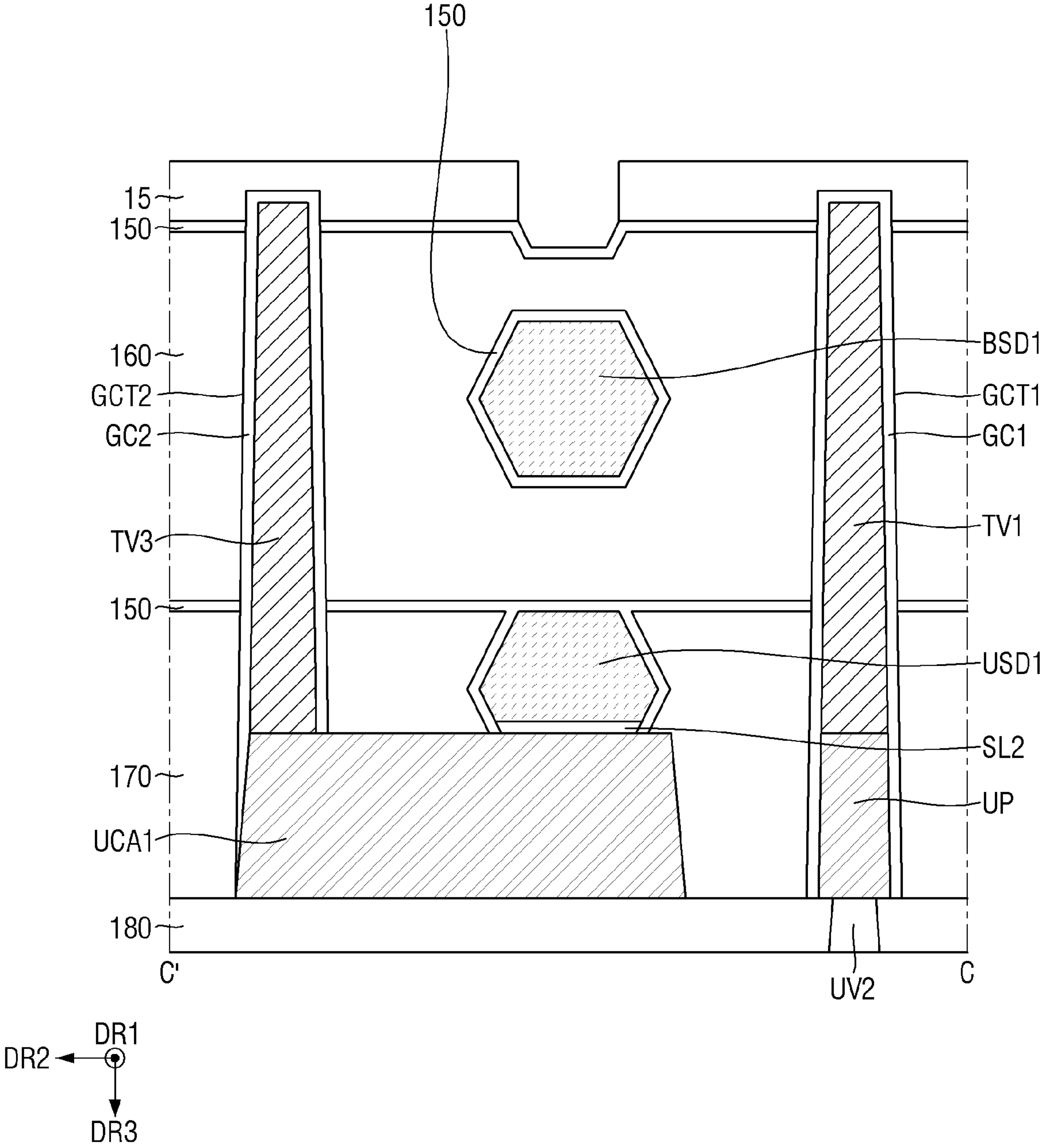
Figure 50:
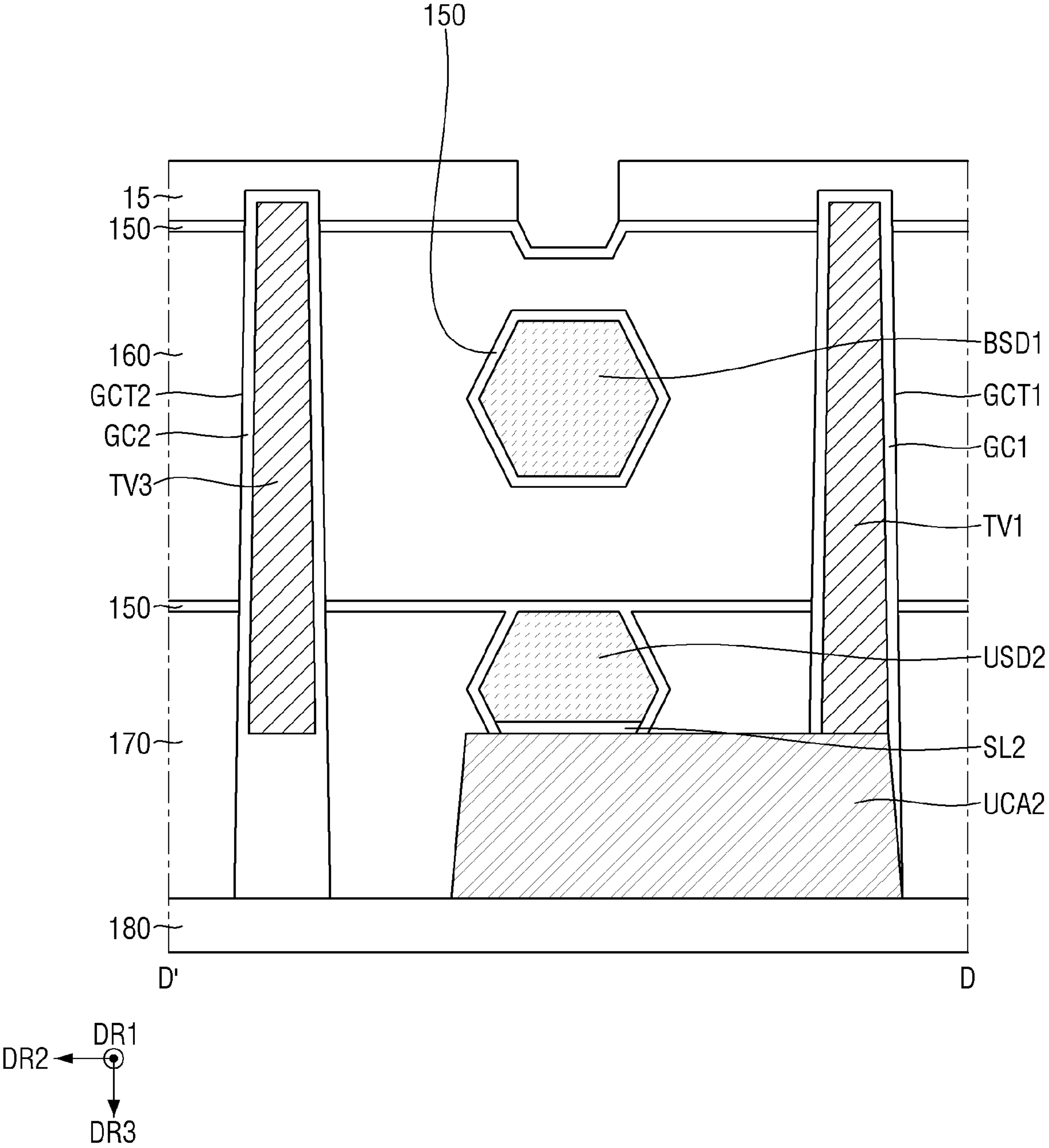
Figure 51:
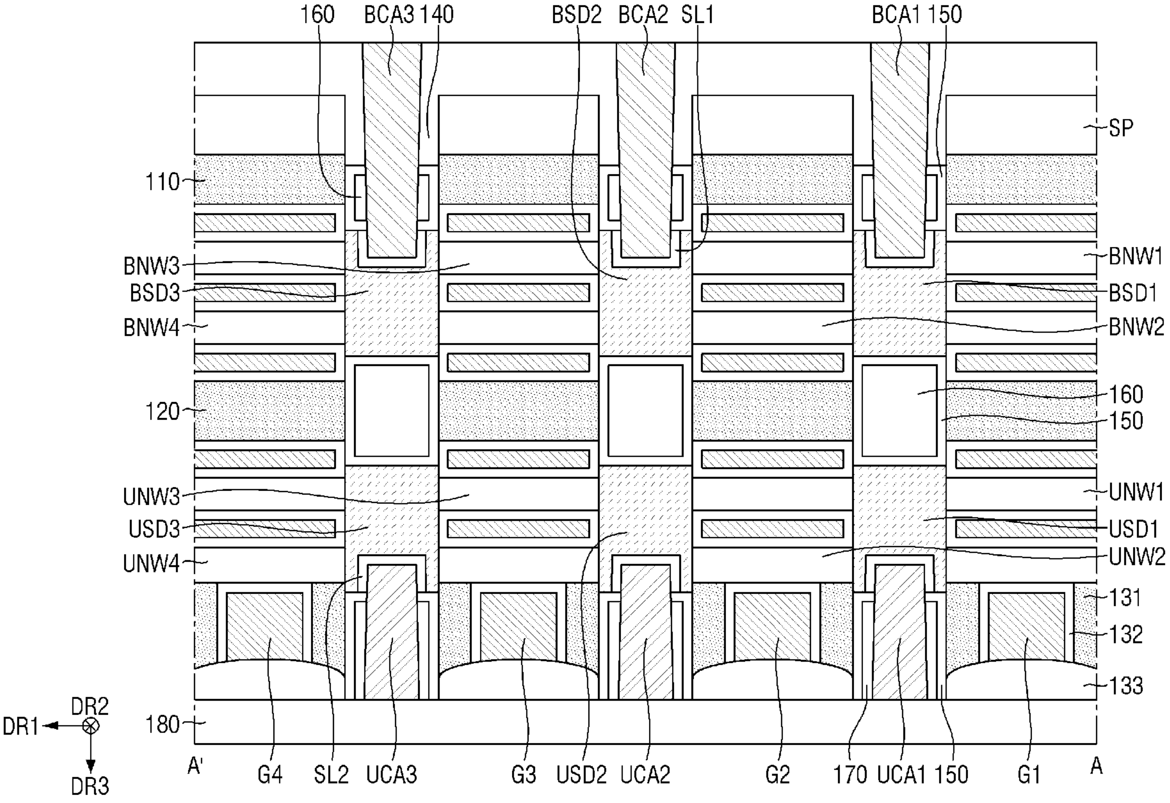
Figure 52:
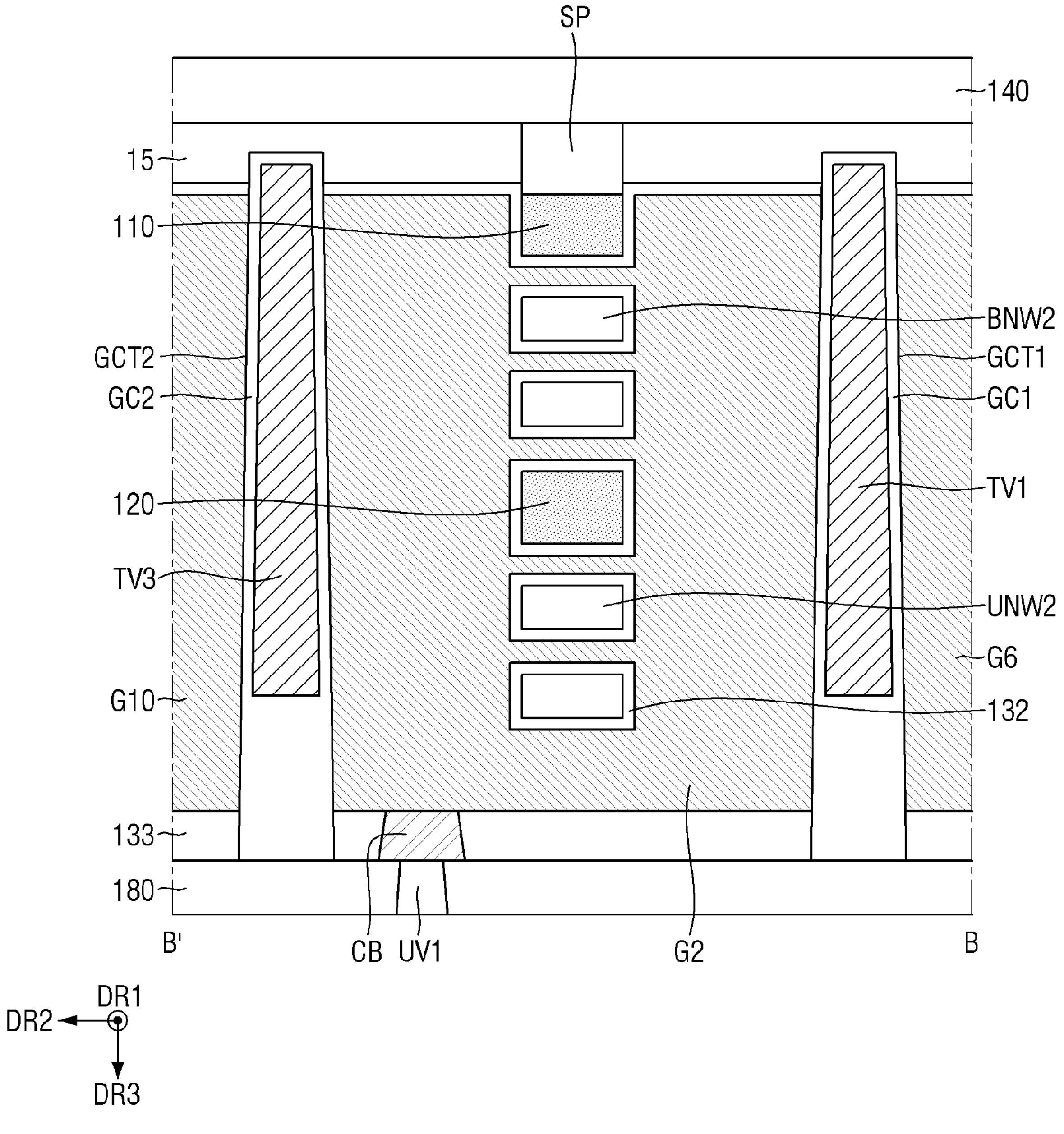
Figure 53:
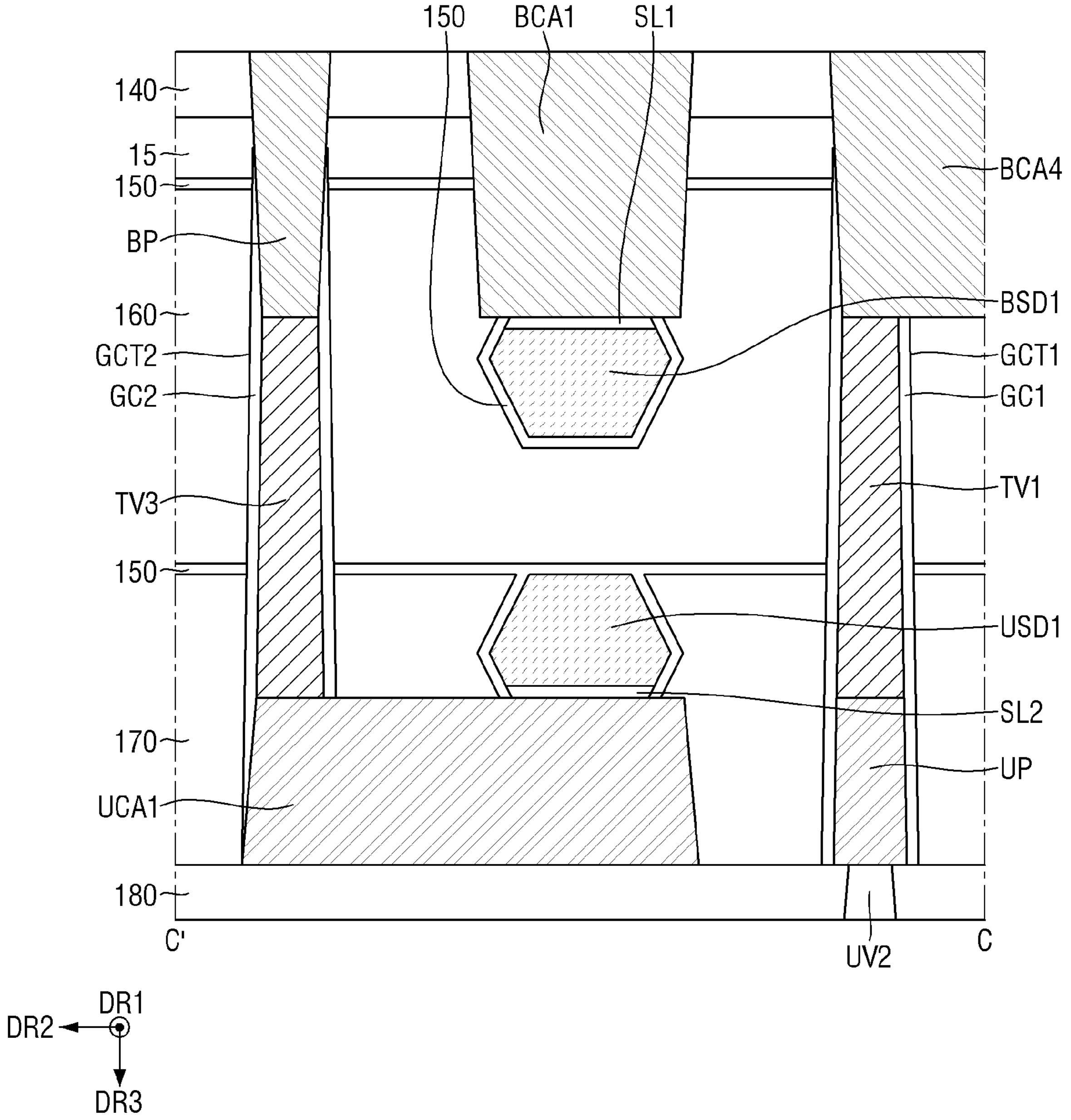
Figure 54:
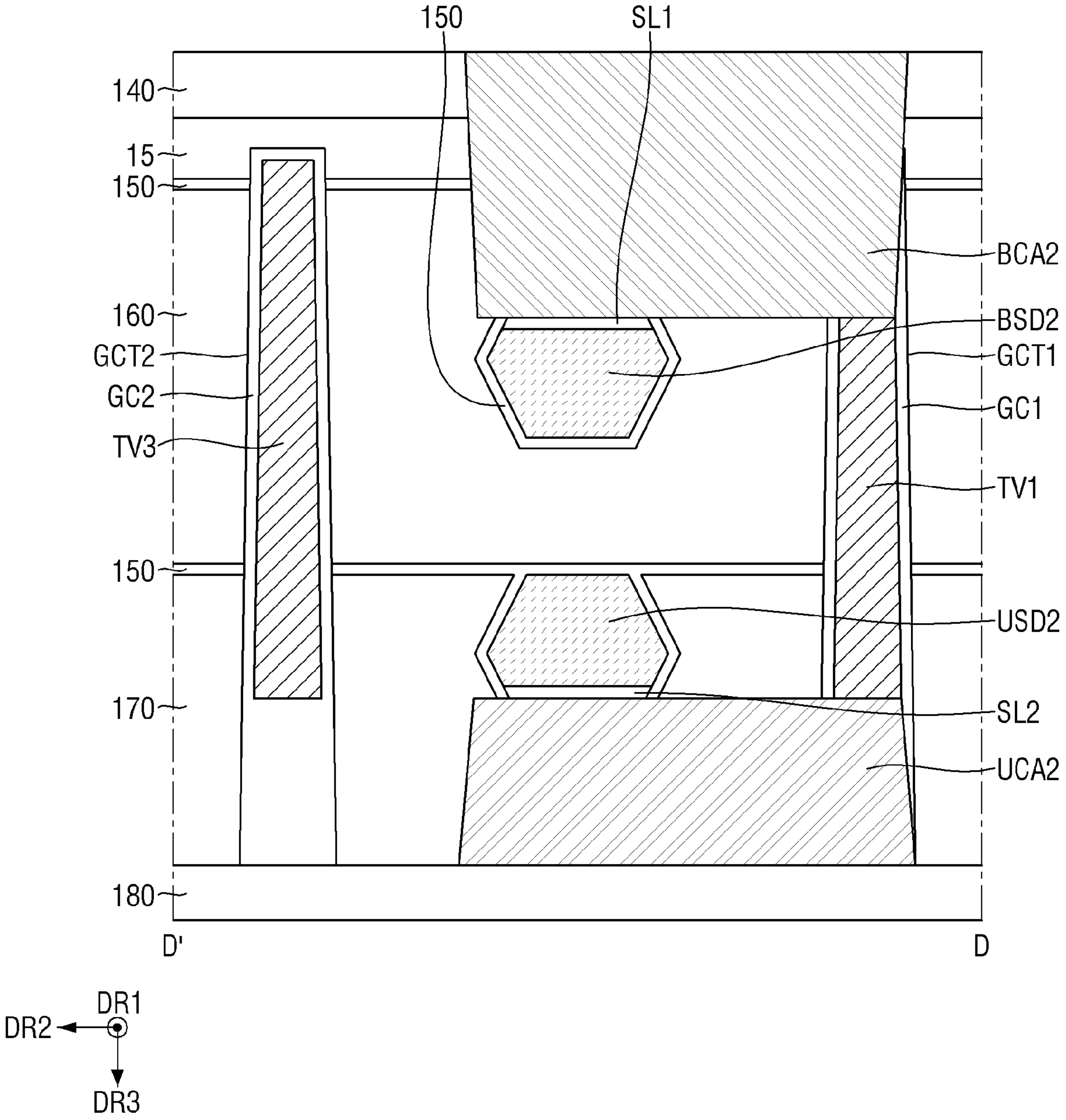
Figure 55:
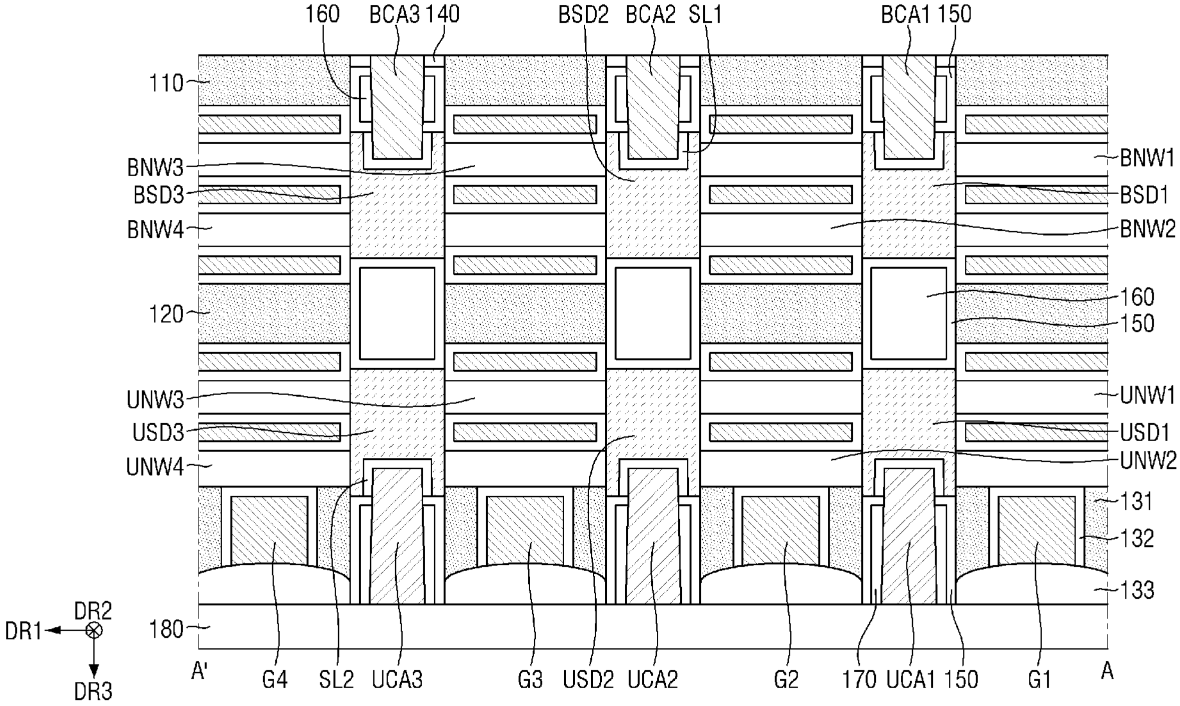
Figure 56:
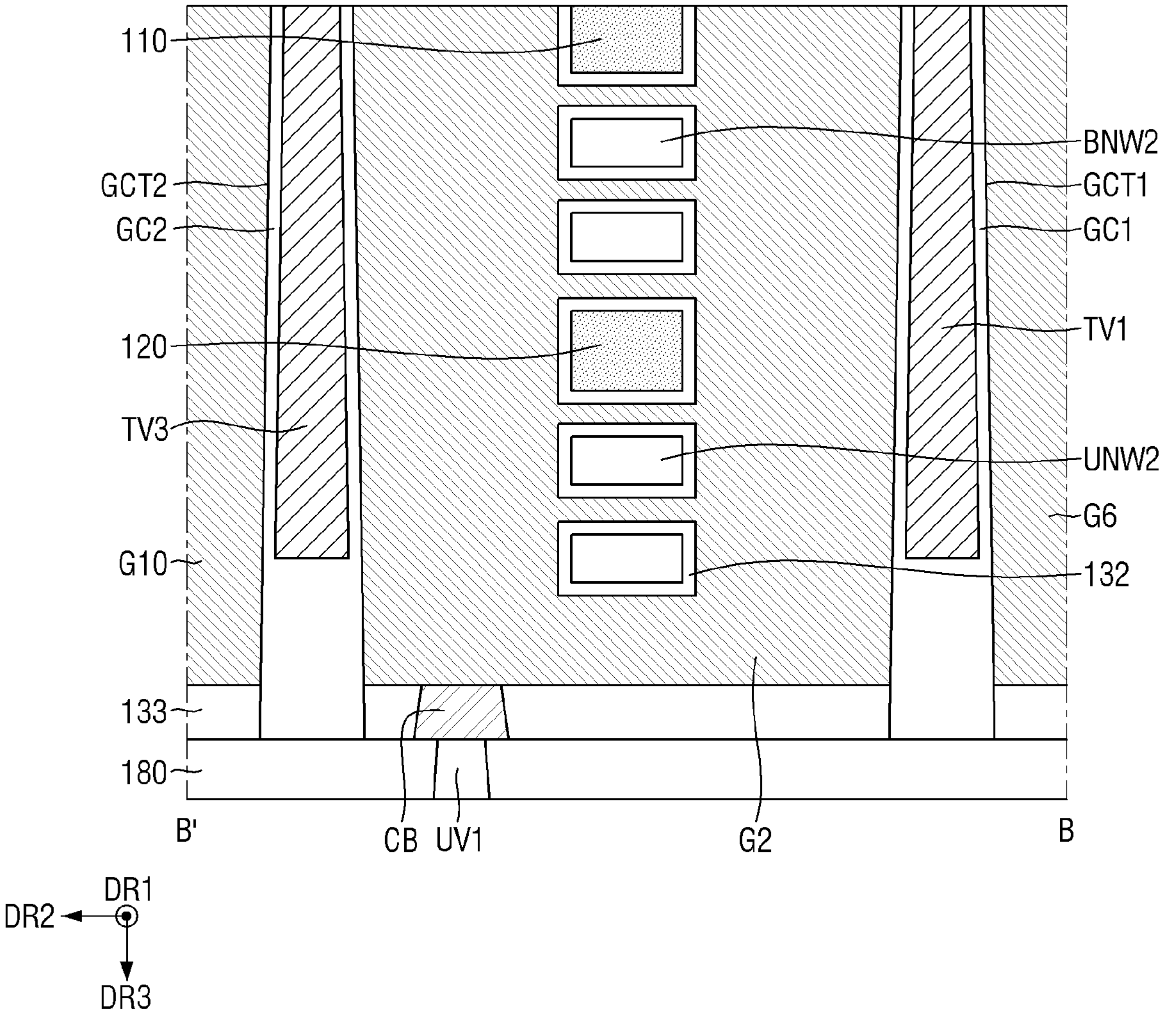
Figure 57:
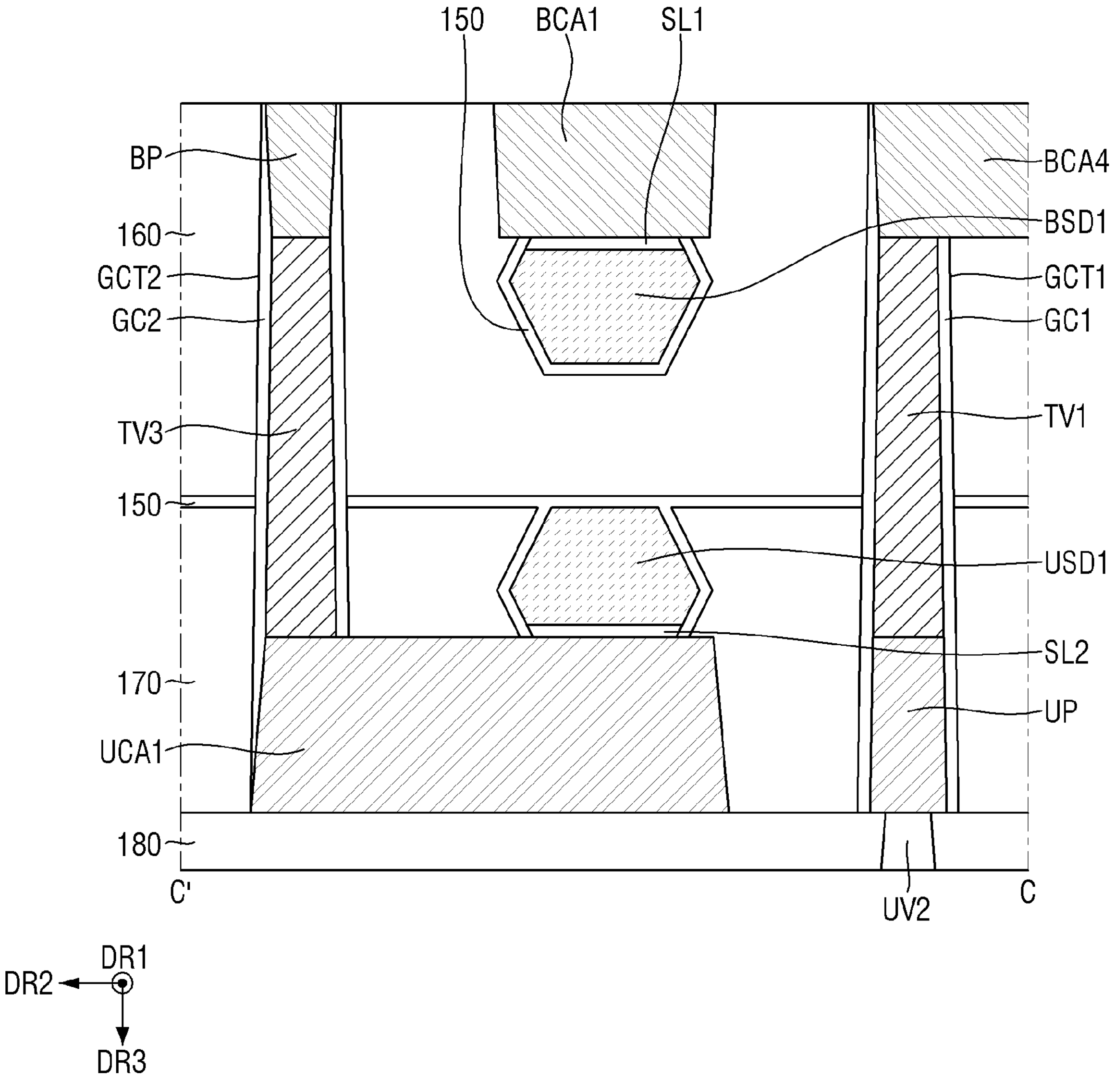

Referring to FIGS. 37 and 38, the first gate cut GC1 may be additionally formed on the upper surface of the first through via TV1 to fill the remaining portion inside the first gate cut trench GCT1. In an implementation, the second gate cut GC2 may be additionally formed on the upper surface of the third through via TV3 to fill the remaining portion inside the second gate cut trench GCT2. In an implementation, the upper surface of each of the first gate cut GC1 and the second gate cut GC2 may be on the same plane as the upper surface of the first upper interlayer insulating layer 170.

Referring to FIGS. 39 to 42, the first to third upper source/drain contacts UCA1, UCA2 and UCA3 and the upper silicide layer SL2 may be formed. In an implementation, the first upper source/drain contact UCA1 may connect the first upper source/drain region USD1 with the third through via TV3. The second upper source/drain contact UCA2 may connect the second upper source/drain region USD2 with the first through via TV1. The upper silicide layer SL2 may be formed along a boundary surface between each of the first to third upper source/drain regions USD1, USD2 and USD3 and each of the first to third upper source/drain contacts UCA1, UCA2 and UCA3.

The upper connection pad UP may be formed on the first through via TV1 inside the first gate cut trench GCT1. In an implementation, the first upper source/drain contact UCA1 may be spaced apart from the upper connection pad UP in the second horizontal direction DR2. The gate contact CB connected to the second gate electrode G2 by passing through the capping pattern 133 in the vertical direction DR3 may be formed.

Subsequently, the second upper interlayer insulating layer 180 may be formed on the first upper interlayer insulating layer 170. The first upper via UV1 connected to the gate contact CB by passing through the second upper interlayer insulating layer 180 in the vertical direction DR3 may be formed. In an implementation, the second upper via UV2 connected to the upper connection pad UP by passing through the second upper interlayer insulating layer 180 in the vertical direction DR3 may be formed.

Referring to FIGS. 43 to 46, after the manufacturing process shown in FIGS. 39 to 42 is performed, upper and lower portions may be inverted. In a state that the upper and lower portions are inverted, the substrate (10 in FIGS. 39 to 42) and the active pattern (11 in FIGS. 39 to 42) may be removed. As a result, each of the lower isolation layer 110, the first to third sacrificial epitaxial layers SE1, SE2 and SE3 and the field insulating layer 15 may be exposed.

Referring to FIGS. 47 to 50, a sacrificial pattern SP may be formed on the lower isolation layer 110 to surround sidewalls of the first to third sacrificial epitaxial layers (SE1, SE2 and SE3 in FIGS. 43 to 46). The sacrificial pattern SP may include, e.g., silicon nitride (SiN). Subsequently, the first to third sacrificial epitaxial layers (SE1, SE2 and SE3 in FIGS. 43 to 46) may be removed.

In an implementation, referring to FIGS. 51 to 54, the second lower interlayer insulating layer 140 may be formed on the sacrificial pattern SP and the field insulating layer 15. The second lower interlayer insulating layer 140 may fill a portion where the first to third sacrificial epitaxial layers (SE1, SE2 and SE3 in FIGS. 43 to 46) have been removed. Subsequently, the first to third lower source/drain contacts BCA1, BCA2 and BCA3 and the lower silicide layer SL1 may be formed.

In an implementation, the first lower source/drain contact BCA1 may be connected to the first lower source/drain region BSD1. The second lower source/drain contact BCA2 may connect the second lower source/drain region BSD2 with the first through via TV1. The third lower source/drain contact BCA3 may be connected to the third lower source/drain region BSD3. The fourth lower source/drain contact BCA4 may be connected to the first through via TV1. The lower silicide layer SL1 may be formed along a boundary surface between each of the first to third lower source/drain regions BSD1, BSD2 and BSD3 and each of the first to third lower source/drain contacts BCA1, BCA2 and BCA3. The lower connection pad BP may be formed on the second through via TV2 inside the second gate cut trench GCT2. In an implementation, the lower connection pad BP may be spaced apart from the first lower source/drain contact BCA1 in the second horizontal direction DR2.

Referring to FIGS. 55 to 58, the lower isolation layer 110 may be exposed through a planarization process. In an implementation, through the planarization process, the sacrificial pattern SP and the field insulating layer 15 may be removed. In an implementation, the second gate electrode G2, the first gate cut GC1, the second gate cut GC2, the first through via TV1, the third through via TV3, and the third lower interlayer insulating layer 160 may be exposed through the planarization process.

Referring to FIGS. 1 to 5, the first lower interlayer insulating layer 100 may be formed on the lower isolation layer 110, the second lower interlayer insulating layer 140, the first to fourth lower source/drain contacts BCA1, BCA2, BCA3 and BCA4, the lower connection pad BP, the first to twelfth gate electrodes G1 to G12, the first and second gate cuts GC1 and GC2, and the first to third through vias TV1, TV2 and TV3.

Then, the first lower via BV1 connected to the first lower source/drain contact BCA1 by passing through the first lower interlayer insulating layer 100 in the vertical direction DR3 may be formed. The second lower via BV2 connected to the lower connection pad BP by passing through the first lower interlayer insulating layer 100 in the vertical direction DR3 may be formed. After the manufacturing processes are performed, the semiconductor device shown in FIGS. 1 to 5 may be manufactured by inverting the upper and lower portions.

Hereinafter, the semiconductor device according to some other embodiments of the present disclosure will be described with reference to FIG. 59. The following description will be based on differences from the semiconductor device shown in FIGS. 1 to 5.

Figure 59:
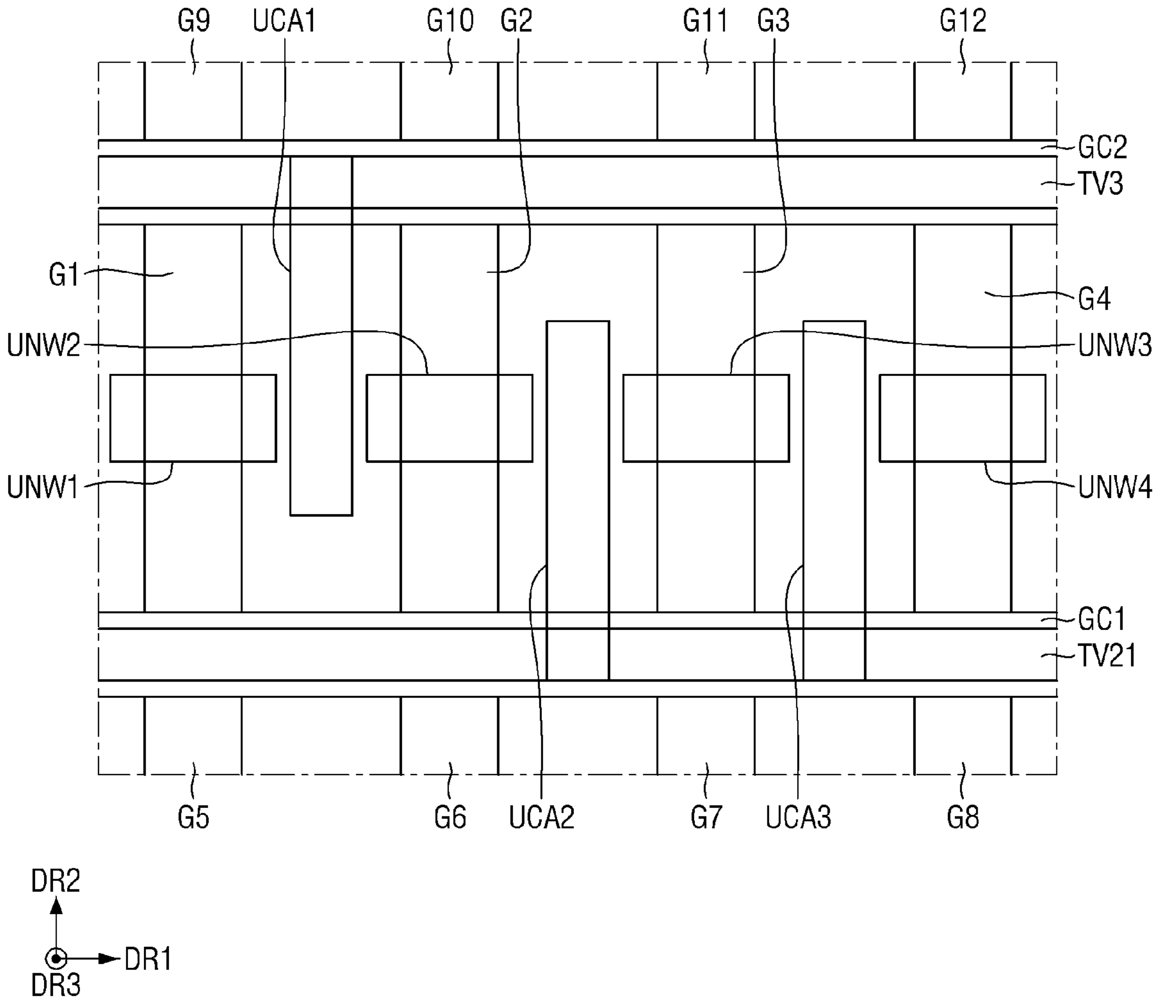
FIG. 59 is a layout view illustrating a semiconductor device according to some other embodiments of the present disclosure.

FIG. 59 is a layout view illustrating a semiconductor device according to some other embodiments of the present disclosure.

Referring to FIG. 59, in the semiconductor device according to some other embodiments of the present disclosure, a first through via TV21 may be electrically connected to each of the second upper source/drain contact UCA2 and the third upper source/drain contact UCA3.

In an implementation, the first through via TV21 may overlap each of the first to fourth gate electrodes G1, G2, G3 and G4 in the second horizontal direction DR2. The second upper source/drain contact UCA2 may electrically connect the second upper source/drain region (USD2 in FIG. 2) with the first through via TV21. In addition, the third upper source/drain contact UCA3 may electrically connect the third upper source/drain region (USD3 in FIG. 2) with the first through via TV21.

Hereinafter, the semiconductor device according to some other embodiments of the present disclosure will be described with reference to FIG. 60. The following description will be based on differences from the semiconductor device shown in FIGS. 1 to 5.

Figure 60:
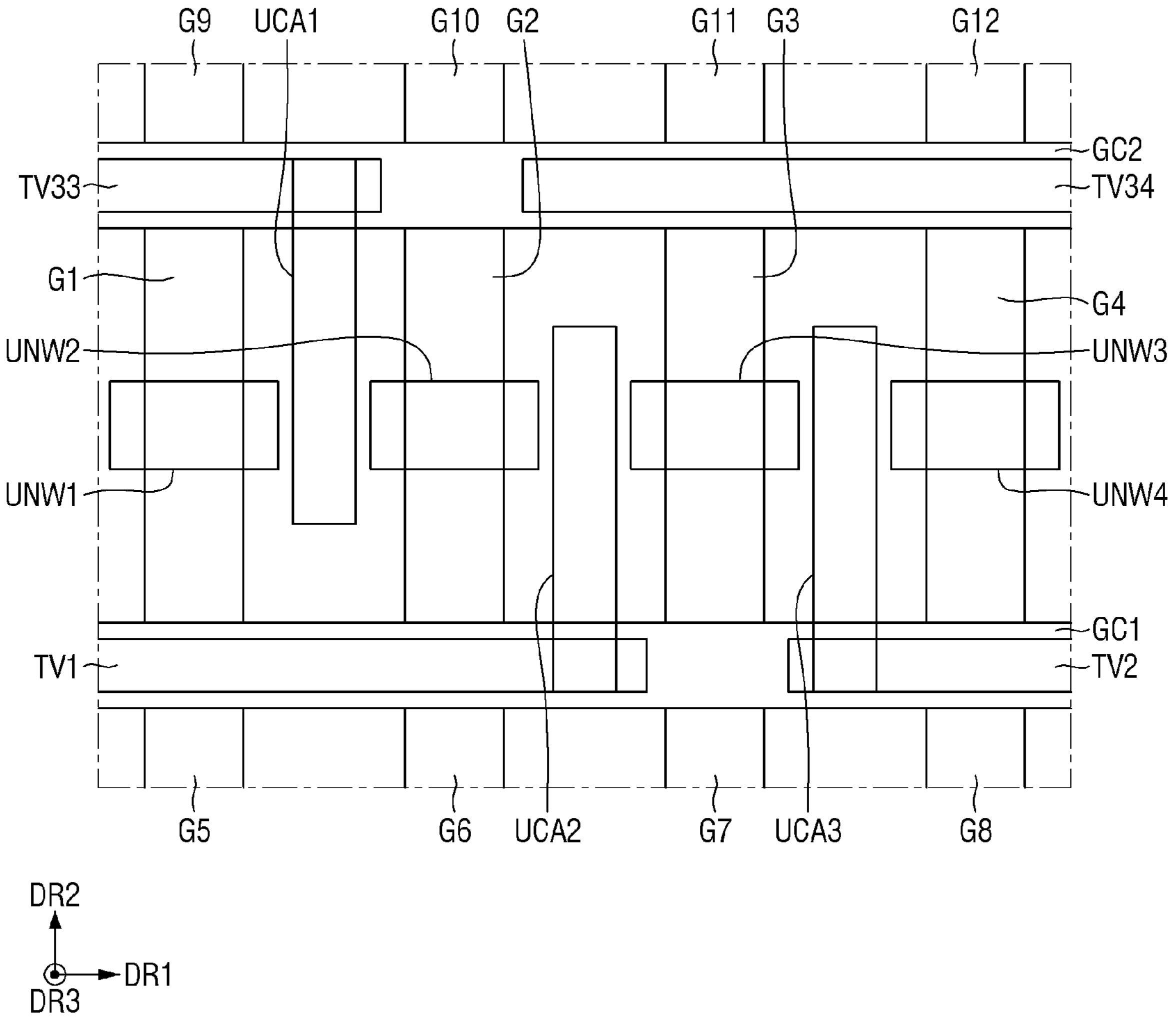
FIG. 60 is a layout view illustrating a semiconductor device according to some other embodiments of the present disclosure.

FIG. 60 is a layout view illustrating a semiconductor device according to some other embodiments of the present disclosure.

Referring to FIG. 60, in the semiconductor device according to some other embodiments of the present disclosure, two through vias TV33 and TV34 spaced apart from each other in the first horizontal direction DR2 may be inside the second gate cut GC2.

In an implementation, the third through via TV33 may extend in the first horizontal direction DR1 inside the second gate cut GC2. The third through via TV33 may overlap the first gate electrode G1 in the second horizontal direction DR2. The third through via TV33 may not overlap each of the second gate electrode G2, the third gate electrode G3, and the fourth gate electrode G4 in the second horizontal direction DR2.

In an implementation, the fourth through via TV34 may extend in the first horizontal direction DR1 inside the second gate cut GC2. The fourth through via TV34 may be spaced apart from the third through via TV33 in the first horizontal direction DR1. The fourth through via TV34 may overlap each of the third gate electrode G3 and the fourth gate electrode G4 in the second horizontal direction DR2. The fourth through via TV34 may not overlap each of the first gate electrode G1 and the second gate electrode G2 in the second horizontal direction DR2. The second gate cut GC2 may be between the third through via TV33 and the fourth through via TV34.

Hereinafter, the semiconductor device according to some other embodiments of the present disclosure will be described with reference to FIG. 61. The following description will be based on differences from the semiconductor device shown in FIGS. 1 to 5.

Figure 61:
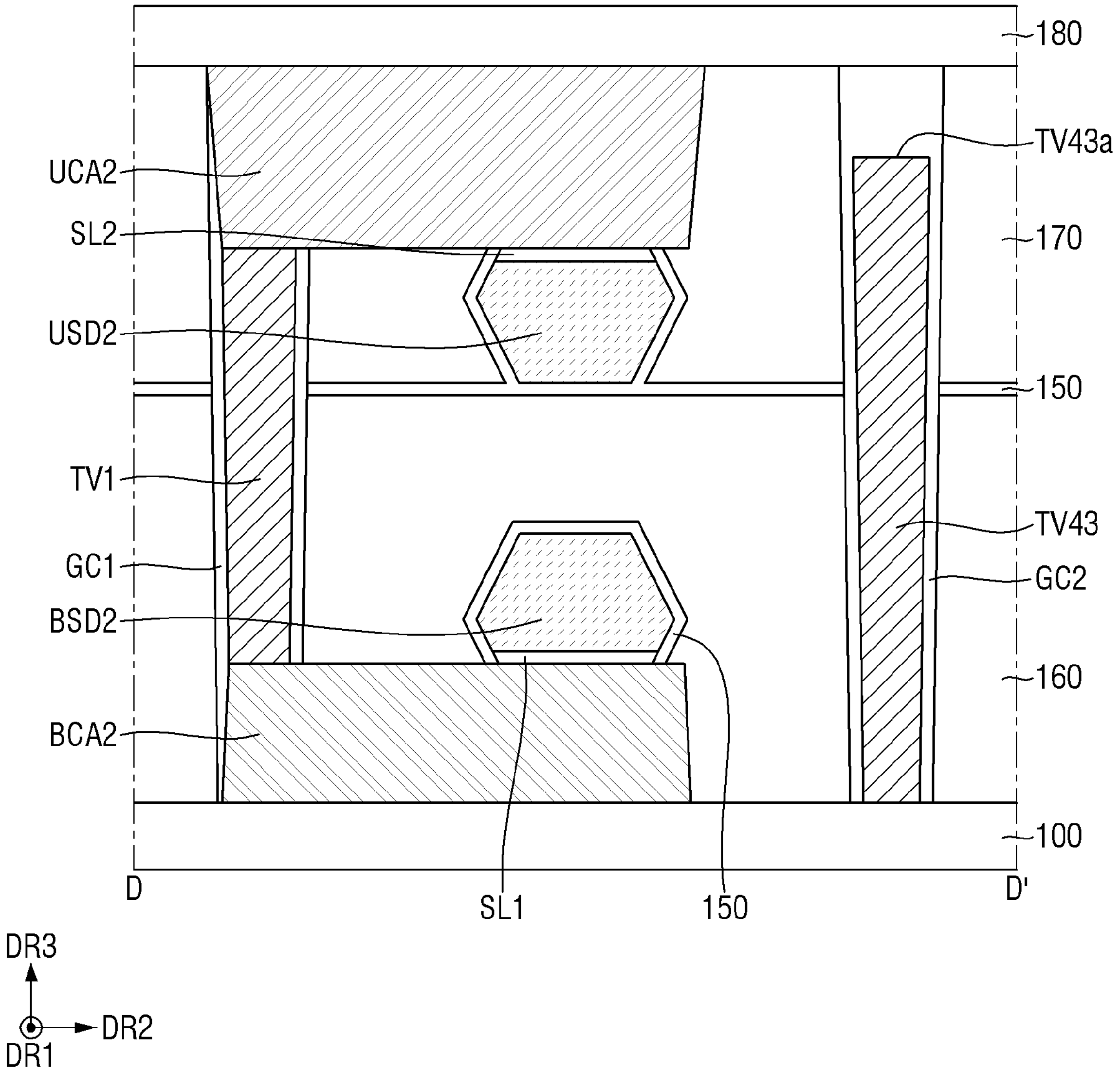
FIG. 61 is a cross-sectional view illustrating a semiconductor device according to some other embodiments of the present disclosure.

FIG. 61 is a cross-sectional view illustrating a semiconductor device according to some other embodiments of the present disclosure.

Referring to FIG. 61, in the semiconductor device according to some other embodiments of the present disclosure, the uppermost surfaces of the first through via TV1, the second through via (TV2 in FIG. 1) and the third through via TV43 may be higher than the lower surface of each of upper source/drain contacts UCA1, UCA2 and UCA3.

In an implementation, the uppermost surface TV43*a* of the third through via TV43 may be higher than the lower surface of the second upper source/drain contact UCA2. In an implementation, at least a portion of the second gate cut GC2 may be on the uppermost surface TV43*a* of the third through via TV43.

Hereinafter, the semiconductor device according to some other embodiments of the present disclosure will be described with reference to FIG. 62. The following description will be based on differences from the semiconductor device shown in FIGS. 1 to 5.

Figure 62:
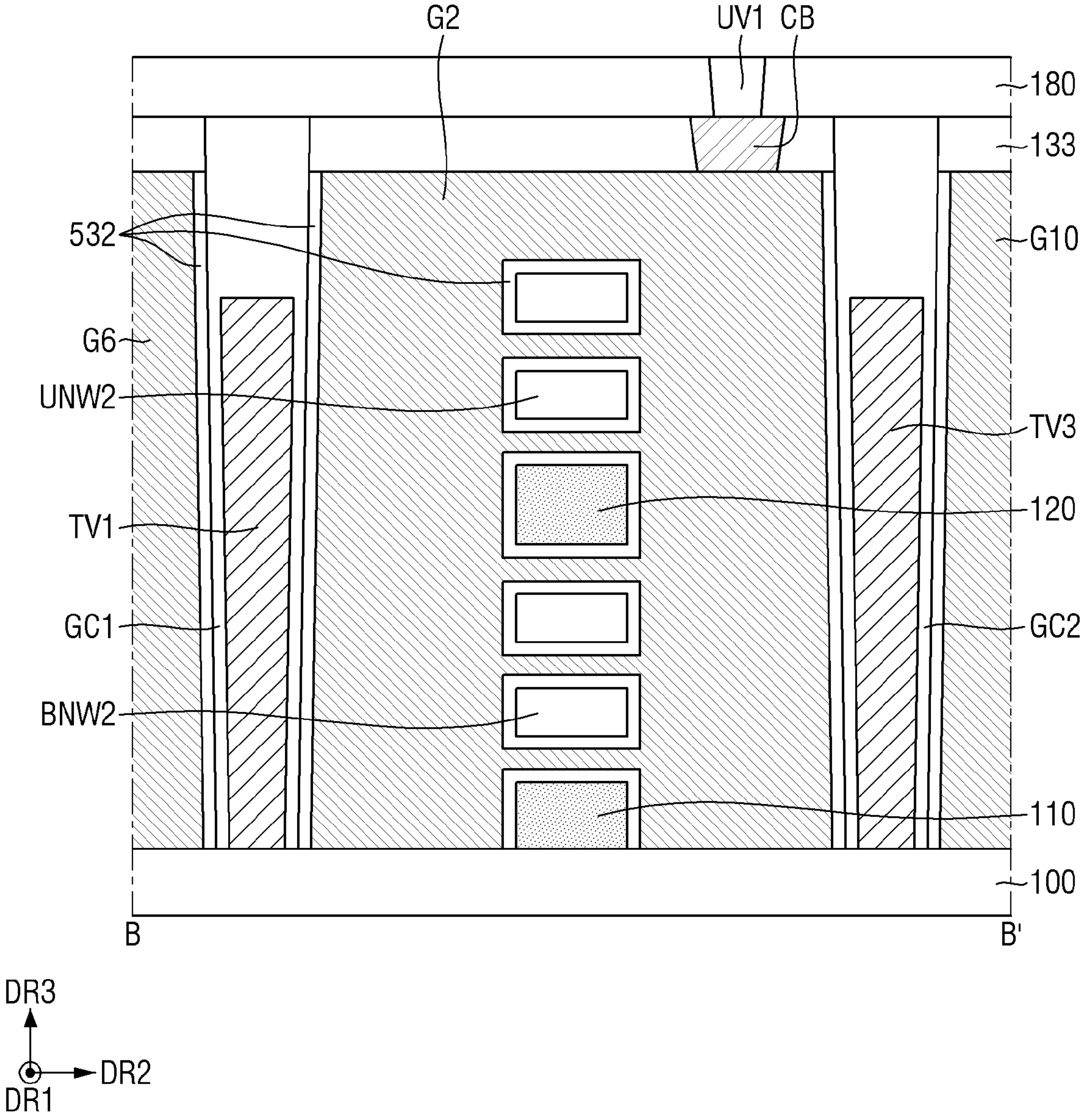
FIG. 62 is a cross-sectional view illustrating a semiconductor device according to some other embodiments of the present disclosure.

FIG. 62 is a cross-sectional view illustrating a semiconductor device according to some other embodiments of the present disclosure.

Referring to FIG. 62, in the semiconductor device according to some other embodiments of the present disclosure, a gate insulating layer 532 may be between the gate cuts GC1 and GC2 and the gate electrodes (G1 to G12 in FIG. 1).

In an implementation, the gate insulating layer 532 may be between the second gate electrode G2 and the first gate cut GC1. The gate insulating layer 532 may be between the second gate electrode G2 and the second gate cut GC2. The gate insulating layer 532 may be between the sixth gate electrode G6 and the first gate cut GC1. The gate insulating layer 532 may be between the tenth gate electrode G10 and the second gate cut GC2.

By way of summation and review, a multi-gate transistor may use a three-dimensional channel, and it may be easy to scale the multi-gate transistor. Also, a gate length of the multi-gate transistor may not be increased, and a current control capability may be improved. In addition, a short channel effect (SCE) in which a potential of a channel region is affected by a drain voltage may be suppressed effectively.

One or more embodiments may provide a semiconductor device having the improved degree of integration by disposing a through via connecting a lower source/drain contact with an upper source/drain contact in a gate cut in a structure in which a plurality of upper nanosheets are stacked on a plurality of lower nanosheets.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

a first plurality of lower nanosheets stacked to be spaced apart from each other in a vertical direction;

an upper isolation layer on the first plurality of lower nanosheets;

a first plurality of upper nanosheets on the upper isolation layer, the first plurality of upper nanosheets being stacked to be spaced apart from each other in the vertical direction;

a first upper source/drain region on a first side of the first plurality of upper nanosheets in a first horizontal direction;

a second upper source/drain region on a second side of the first plurality of upper nanosheets opposite to the first side of the first plurality of upper nanosheets in the first horizontal direction;

a first gate electrode extending in a second horizontal direction different from the first horizontal direction, the first gate electrode surrounding each of the first plurality of lower nanosheets, the upper isolation layer, and the first plurality of upper nanosheets;

a first gate cut extending in the first horizontal direction on a first side of the first gate electrode in the second horizontal direction, the first gate cut extending from a lower surface of the first gate electrode to an upper surface of the first gate electrode in the vertical direction;

a first through via located within an outer boundary of the first gate cut and extending in the first horizontal direction inside the first gate cut, the first through via being insulated from the first gate electrode;

a first upper source/drain contact extending in the second horizontal direction on the first upper source/drain region, the first upper source/drain contact being electrically connected to the first upper source/drain region; and a second upper source/drain contact extending in the second horizontal direction on the second upper source/drain region, the second upper source/drain contact electrically connecting the second upper source/drain region with the first through via.

2. The semiconductor device as claimed in claim 1, further comprising:

a second gate cut extending in the first horizontal direction on a second side of the first gate electrode opposite to the first side of the first gate electrode in the second horizontal direction, the second gate cut extending from the lower surface of the first gate electrode to the upper surface of the first gate electrode in the vertical direction; and a second through via extending in the first horizontal direction inside the second gate cut, the second through via being insulated from the first gate electrode and being electrically connected to the first upper source/drain contact.

3. The semiconductor device as claimed in claim 2, further comprising:

an upper connection pad on an upper surface of the first through via inside the first gate cut, the upper connection pad being electrically connected to the first through via, and an upper surface of the upper connection pad being on a same plane as an upper surface of the first gate cut; and a lower connection pad on a lower surface of the second through via inside the second gate cut, the lower connection pad being electrically connected to the second through via, and a lower surface of the lower connection pad being on a same plane as a lower surface of the second gate cut.

4. The semiconductor device as claimed in claim 2, further comprising a third through via extending in the first horizontal direction inside the second gate cut, the third through via being spaced apart from the second through via in the first horizontal direction.

5. The semiconductor device as claimed in claim 1, wherein an upper surface of the first through via is lower than the upper surface of the first gate electrode.

6. The semiconductor device as claimed in claim 1, further comprising:

a first lower source/drain region on a first side of the first plurality of lower nanosheets in the first horizontal direction;

a second lower source/drain region on a second side of the first plurality of lower nanosheets opposite to the first side of the first plurality of lower nanosheets in the first horizontal direction;

a first lower source/drain contact below the first lower source/drain region, the first lower source/drain contact being electrically connected to the first lower source/drain region; and a second lower source/drain contact below the second lower source/drain region, the second lower source/drain contact electrically connecting the second lower source/drain region with the first through via.

7. The semiconductor device as claimed in claim 1, further comprising:

a second plurality of lower nanosheets spaced apart from the first plurality of lower nanosheets in the first horizontal direction, the second plurality of lower nanosheets being stacked to be spaced apart from each other in the vertical direction;

a second plurality of upper nanosheets stacked to be spaced apart from each other in the vertical direction on the second plurality of lower nanosheets, a first side of the second plurality of upper nanosheets being in contact with the second upper source/drain region;

a third upper source/drain region on a second side of the second plurality of upper nanosheets opposite to the first side of the second plurality of upper nanosheets in the first horizontal direction; and a second gate electrode extending in the second horizontal direction, the second gate electrode surrounding each of the second plurality of lower nanosheets and the second plurality of upper nanosheets.

8. The semiconductor device as claimed in claim 7, further comprising a third through via extending in the first horizontal direction inside the first gate cut, the third through via being spaced apart from the first through via in the first horizontal direction and being insulated from the second gate electrode.

9. The semiconductor device as claimed in claim 8, further comprising a third upper source/drain contact extending in the second horizontal direction on the third upper source/drain region, the third upper source/drain contact electrically connecting the third upper source/drain region with the third through via.

10. The semiconductor device as claimed in claim 8, wherein an uppermost surface of the third through via is higher than a lower surface of the second upper source/drain contact.

11. The semiconductor device as claimed in claim 7, wherein the second gate electrode does not overlap the first through via in the second horizontal direction.

12. The semiconductor device as claimed in claim 7, further comprising a third upper source/drain contact extending in the second horizontal direction on the third upper source/drain region, the third upper source/drain contact electrically connecting the third upper source/drain region with the first through via.

13. A semiconductor device, comprising:
- a plurality of lower nanosheets stacked to be spaced apart from each other in a vertical direction;
- an upper isolation layer on the plurality of lower nanosheets;
- a plurality of upper nanosheets on the upper isolation layer, the plurality of upper nanosheets being stacked to be spaced apart from each other in the vertical direction;
- a first gate cut extending in a first horizontal direction;
- a second gate cut extending in the first horizontal direction, the second gate cut being spaced apart from the first gate cut in a second horizontal direction different from the first horizontal direction;
- a first gate electrode extending in the second horizontal direction between the first gate cut and the second gate cut, the first gate electrode surrounding each of the plurality of lower nanosheets, the upper isolation layer, and the plurality of upper nanosheets;
- a second gate electrode extending in the second horizontal direction, the second gate electrode being separated from the first gate electrode by the first gate cut;
- a third gate electrode extending in the second horizontal direction, the third gate electrode being separated from the first gate electrode by the second gate cut;
- a first lower source/drain region on a first side of the plurality of lower nanosheets in the first horizontal direction;
- a first upper source/drain region on the first lower source/drain region on a first side of the plurality of upper nanosheets in the first horizontal direction;
- a first through via located within an outer boundary of the first gate cut and extending in the first horizontal direction inside the first gate cut, the first through via being insulated from each of the first and second gate electrodes;
- a second through via located within an outer boundary of the second gate cut and extending in the first horizontal direction inside the second gate cut, the second through via being insulated from each of the first and third gate electrodes;
- a first upper source/drain contact extending in the second horizontal direction on the first upper source/drain region, the first upper source/drain contact electrically connecting the first upper source/drain region with the second through via; and
- a first lower source/drain contact below the first lower source/drain region, the first lower source/drain contact being electrically connected with the first lower source/drain region.

14. The semiconductor device as claimed in claim 13, wherein an upper surface of the first through via is lower than an upper surface of the first gate electrode.

15. The semiconductor device as claimed in claim 13, wherein at least a portion of the first gate cut is on an upper surface of the first through via.

16. The semiconductor device as claimed in claim 13, further comprising:
- a second lower source/drain region on a second side of the plurality of lower nanosheets opposite to the first side of the plurality of lower nanosheets in the first horizontal direction;
- a second upper source/drain region on the second lower source/drain region on a second side of the plurality of upper nanosheets opposite to the first side of the plurality of upper nanosheets in the first horizontal direction;
- a second upper source/drain contact extending in the second horizontal direction on the second upper source/drain region, the second upper source/drain contact electrically connecting the second upper source/drain region with the first through via; and
- a second lower source/drain contact extending in the second horizontal direction below the second lower source/drain region, the second lower source/drain contact electrically connecting the second lower source/drain region with the first through via.

17. The semiconductor device as claimed in claim 13, further comprising a lower isolation layer below the plurality of lower nanosheets, sidewalls and an upper surface of the lower isolation layer being surrounded by the first gate electrode, and a lower surface of the lower isolation layer being on a same plane as a lowermost surface of each of the first and second through vias.

18. The semiconductor device as claimed in claim 13, wherein the first gate electrode is in contact with each of the first gate cut and the second gate cut.

19. The semiconductor device as claimed in claim 13, further comprising a gate insulating layer respectively between the first gate electrode and the first gate cut and between the first gate electrode and the second gate cut.

20. A semiconductor device, comprising:
- a plurality of lower nanosheets stacked to be spaced apart from each other in a vertical direction;
- an upper isolation layer on the plurality of lower nanosheets;
- a plurality of upper nanosheets on the upper isolation layer, the plurality of upper nanosheets being stacked to be spaced apart from each other in the vertical direction;
- a first lower source/drain region on a first side of the plurality of lower nanosheets in a first horizontal direction;
- a second lower source/drain region on a second side of the plurality of lower nanosheets opposite to the first side of the plurality of lower nanosheets in the first horizontal direction;
- a first upper source/drain region on a first side of the plurality of upper nanosheets in the first horizontal direction;
- a second upper source/drain region on a second side of the plurality of upper nanosheets opposite to the first side of the plurality of upper nanosheets in the first horizontal direction;
- a gate electrode extending in a second horizontal direction different from the first horizontal direction, the gate electrode surrounding each of the plurality of lower nanosheets, the upper isolation layer, and the plurality of upper nanosheets;
- a first gate cut extending in the first horizontal direction from a first side of the gate electrode in the second horizontal direction, the first gate cut extending from a lower surface of the gate electrode to an upper surface of the gate electrode in the vertical direction;

a second gate cut extending in the first horizontal direction from a second side of the gate electrode opposite to the first side of the gate electrode in the second horizontal direction, the second gate cut extending from the lower surface of the gate electrode to the upper surface of the gate electrode in the vertical direction;

a first through via located within an outer boundary of the first gate cut and extending in the first horizontal direction inside the first gate cut, the first through via is insulated from the gate electrode;

a second through via located within an outer boundary of the second gate cut and extending in the first horizontal direction inside the second gate cut, the second through via being insulated from the gate electrode;

a first lower source/drain contact below the first lower source/drain region, the first lower source/drain contact being electrically connected to the first lower source/drain region;

a second lower source/drain contact extending in the second horizontal direction below the second lower source/drain region, the second lower source/drain contact electrically connecting the second lower source/drain region with the first through via;

a first upper source/drain contact extending in the second horizontal direction on the first upper source/drain region, the first upper source/drain contact electrically connecting the first upper source/drain region with the second through via; and a second upper source/drain contact extending in the second horizontal direction on the second upper source/drain region, the second upper source/drain contact electrically connecting the second upper source/drain region with the first through via.

* * * * *